(12) United States Patent
Nunn et al.

(10) Patent No.: US 10,446,208 B2
(45) Date of Patent: Oct. 15, 2019

(54) APPLICATIONS OF NON-COLLINEARLY COUPLED MAGNETIC LAYERS

(71) Applicant: Simon Fraser University, Burnaby (CA)

(72) Inventors: Zachary Raymond Nunn, Coquitlam (CA); Erol Girt, Burnaby (CA)

(73) Assignee: Simon Fraser University, Burnaby (CA)

(*) Notice: Subject to any disclaimer, the term of this patent is extended or adjusted under 35 U.S.C. 154(b) by 0 days.

(21) Appl. No.: 16/228,725

(22) Filed: Dec. 20, 2018

(65) Prior Publication Data

US 2019/0221246 A1    Jul. 18, 2019

Related U.S. Application Data

(63) Continuation of application No. 15/919,071, filed on Mar. 12, 2018, now Pat. No. 10,204,671, which is a
(Continued)

(51) Int. Cl.
*G11C 11/00* (2006.01)
*G11C 11/16* (2006.01)
(Continued)

(52) U.S. Cl.
CPC ........ *G11C 11/1673* (2013.01); *G01R 33/093* (2013.01); *G01R 33/098* (2013.01);
(Continued)

(58) Field of Classification Search
CPC ..... G11C 11/00; G11C 11/1673; G11C 11/15; G01R 33/1284; H01F 1/015; H01F 1/017
(Continued)

(56) References Cited

U.S. PATENT DOCUMENTS

| 5,686,838 A | 11/1997 | van den Berg |
| 6,710,984 B1 | 3/2004 | Yuasa et al. |

(Continued)

OTHER PUBLICATIONS

G. Binasch, P. Grünberg, F. Saurenbach and W. Zinn, "Enhanced magnetoresistance in layered magnetic structures with antiferromagnetic interlayer exchange", The American Physical Society, Mar. 1, 1989, vol. 39, No. 7, pp. 4828-4830.

(Continued)

*Primary Examiner* — Harry W Byrne
(74) *Attorney, Agent, or Firm* — Todd A. Rattray; Oyen Wiggs Green & Mutala LLP

(57) ABSTRACT

A magnetic device comprising having a first magnetic layer having a first magnetization direction, a second magnetic layer having a second magnetization direction, a first coupling layer interposed between the first and second magnetic layers, a third magnetic layer having a third magnetization direction, a first magnetoresistive layer interposed between the third magnetic layer and the second magnetic layer, and a circuit connected to one or more of the layers of the magnetic device by at least a pair of leads. The circuit is configured to determine a change in resistance between the pair of leads. The change in resistance is based at least in part on a change in an angular relationship between the third magnetization direction and the second magnetization direction caused by an external magnetic field or a current passing through at least a portion of the device.

25 Claims, 38 Drawing Sheets

Related U.S. Application Data continuation-in-part of application No. PCT/CA2017/051419, filed on Nov. 24, 2017.

(60) Provisional application No. 62/614,928, filed on Jan. 8, 2018, provisional application No. 62/555,625, filed on Sep. 7, 2017, provisional application No. 62/470,123, filed on Mar. 10, 2017.

(51) Int. Cl.
| | |
|---|---|
| *H01F 1/01* | (2006.01) |
| *G01R 33/12* | (2006.01) |
| *H01L 43/08* | (2006.01) |
| *G11C 11/15* | (2006.01) |
| *H01L 43/10* | (2006.01) |
| *G01R 33/09* | (2006.01) |

(52) U.S. Cl.
CPC .......... *G01R 33/1284* (2013.01); *G11C 11/15* (2013.01); *G11C 11/161* (2013.01); *G11C 11/1675* (2013.01); *H01F 1/015* (2013.01); *H01F 1/017* (2013.01); *H01L 43/08* (2013.01); *H01L 43/10* (2013.01)

(58) Field of Classification Search
USPC ....... 365/48, 55, 62, 66, 74, 78, 80–93, 100, 365/130, 131, 148, 158, 171–173, 209, 365/213, 225.5, 230.07, 232, 243.5
See application file for complete search history.

(56) References Cited

U.S. PATENT DOCUMENTS

| | | | |
|---|---|---|---|
| 6,893,741 | B2 | 5/2005 | Doerner et al. |
| 7,199,984 | B2 | 4/2007 | Carey et al. |
| 7,323,215 | B2 | 1/2008 | Li et al. |
| 7,375,405 | B2 | 5/2008 | Fukuzawa et al. |
| 7,382,590 | B2 | 6/2008 | Doerner et al. |
| 7,411,765 | B2 | 8/2008 | Childress et al. |
| 7,446,986 | B2 | 11/2008 | Araki et al. |
| 7,486,487 | B2 | 2/2009 | Oshima et al. |
| 7,498,092 | B2 | 3/2009 | Berger et al. |
| 7,602,592 | B2 | 10/2009 | Fukuzawa et al. |
| 8,093,892 | B2 | 1/2012 | Hawraneck |
| 8,263,239 | B2 | 9/2012 | Berger et al. |
| 8,531,802 | B2 | 9/2013 | Tsoukatos et al. |
| 8,771,849 | B2 | 7/2014 | Nemoto et al. |
| 2005/0019609 | A1 | 1/2005 | Tang |
| 2005/0058855 | A1 | 3/2005 | Girt |
| 2006/0103991 | A1 | 5/2006 | Hoshino et al. |
| 2006/0177703 | A1 | 8/2006 | Takenoiri et al. |
| 2006/0221509 | A1 | 10/2006 | Carey et al. |
| 2012/0155159 | A1* | 6/2012 | Prejbeanu ............... G11C 11/16 365/158 |
| 2013/0064009 | A1* | 3/2013 | Kitano ............... G11C 19/0808 365/158 |
| 2013/0215672 | A1* | 8/2013 | Zhou ..................... G11C 11/161 365/158 |
| 2015/0109853 | A1* | 4/2015 | Sato ........................ H01L 43/08 365/158 |
| 2015/0262637 | A1* | 9/2015 | Park ..................... G11C 11/161 365/158 |

OTHER PUBLICATIONS

P. Grünberg, R. Schreiber, and Y. Pang, "Layered Magnetic Structures: Evidence for Antiferromagnetic Coupling of Fe Layers across Cr Interlayers", The American Physical Society, Nov. 10, 1986, vol. 57, No. 19, pp. 2442-2445.

Z. Nunn "Antiferromagnetic Coupling of Co across Ru Alloys", A Thesis Submitted in Partial Fulfillment of the Requirements for the Degree of Bachelor of Applied Science in the School of Engineering Science, Simon Fraser University, Dec. 2016.

K. Yakushiji, A. Sugihara, A. Fukushima, H. Kubota, and S. Yuasa, "Very strong antiferromagnetic interlayer exchange coupling with iridium spacer layer for perpendicular magnetic tunnel junctions", American Institute of Physics, Applied Physics Letters 110, 092406 (2017).

* cited by examiner

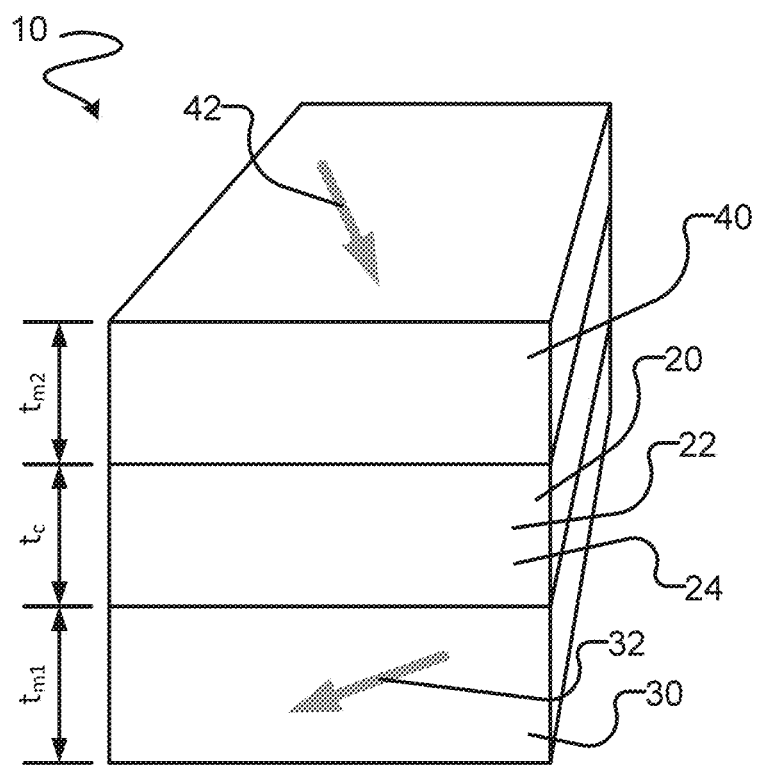
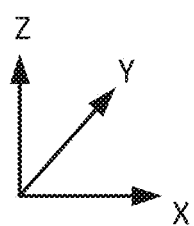
FIG. 2A

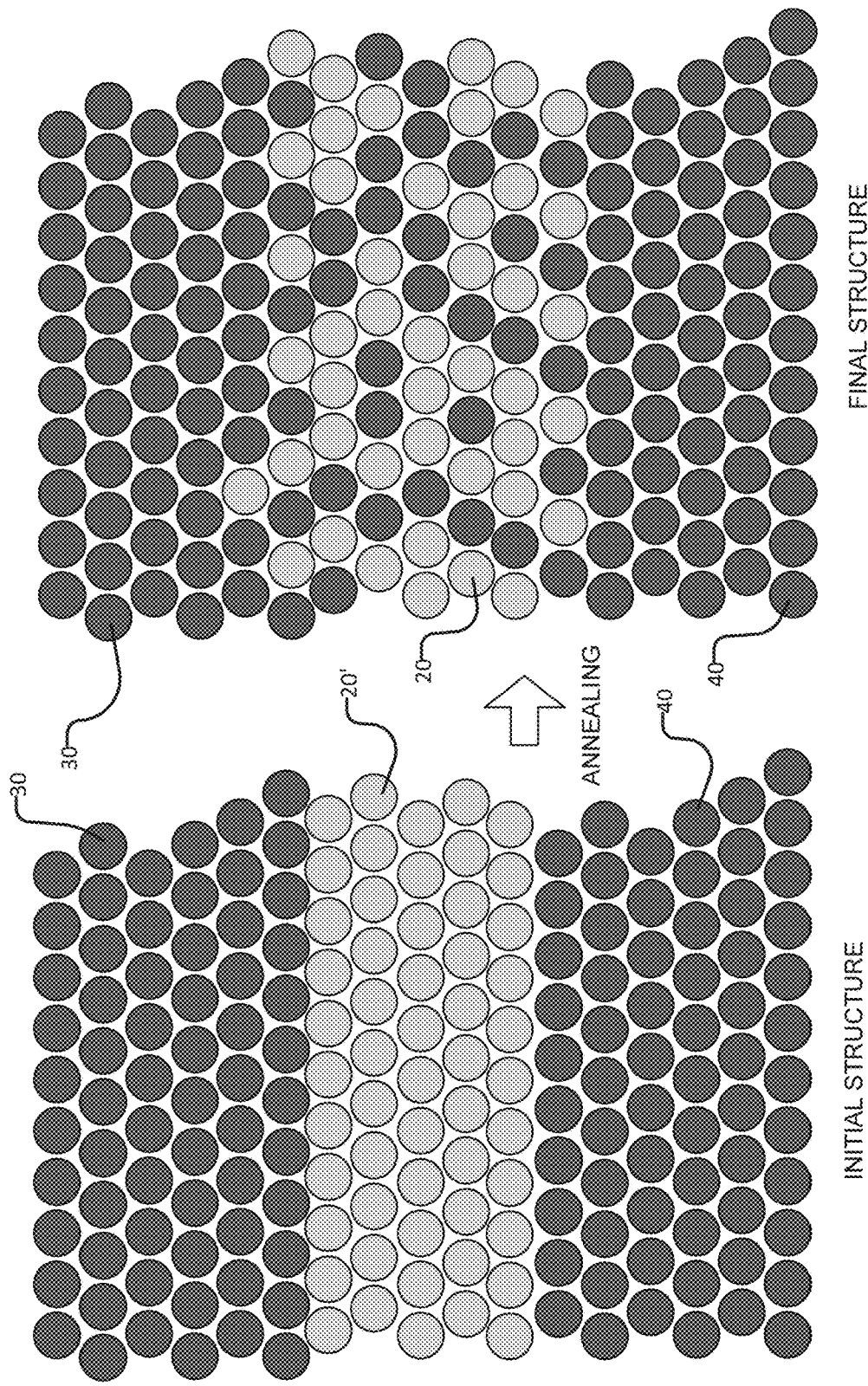

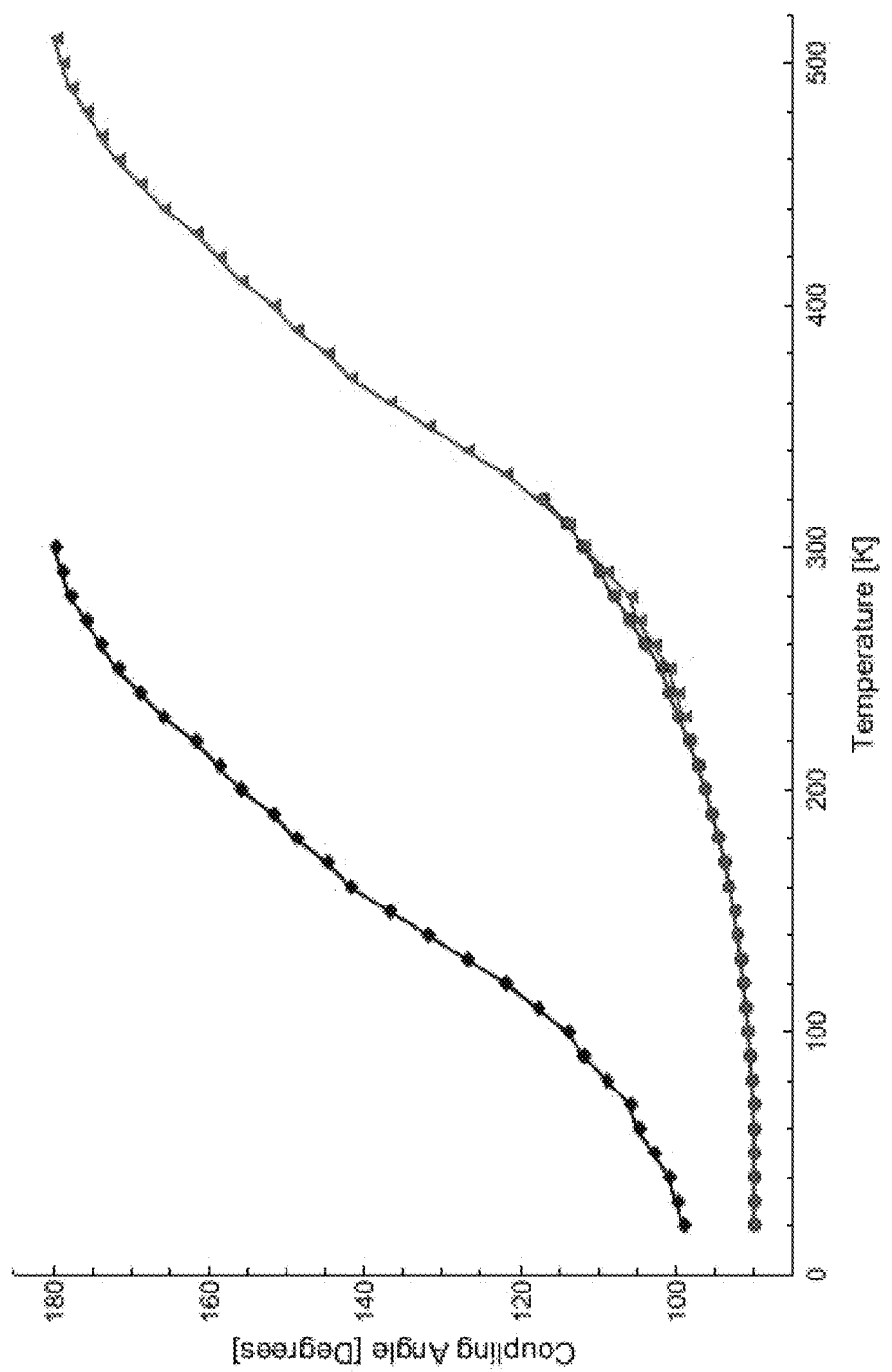

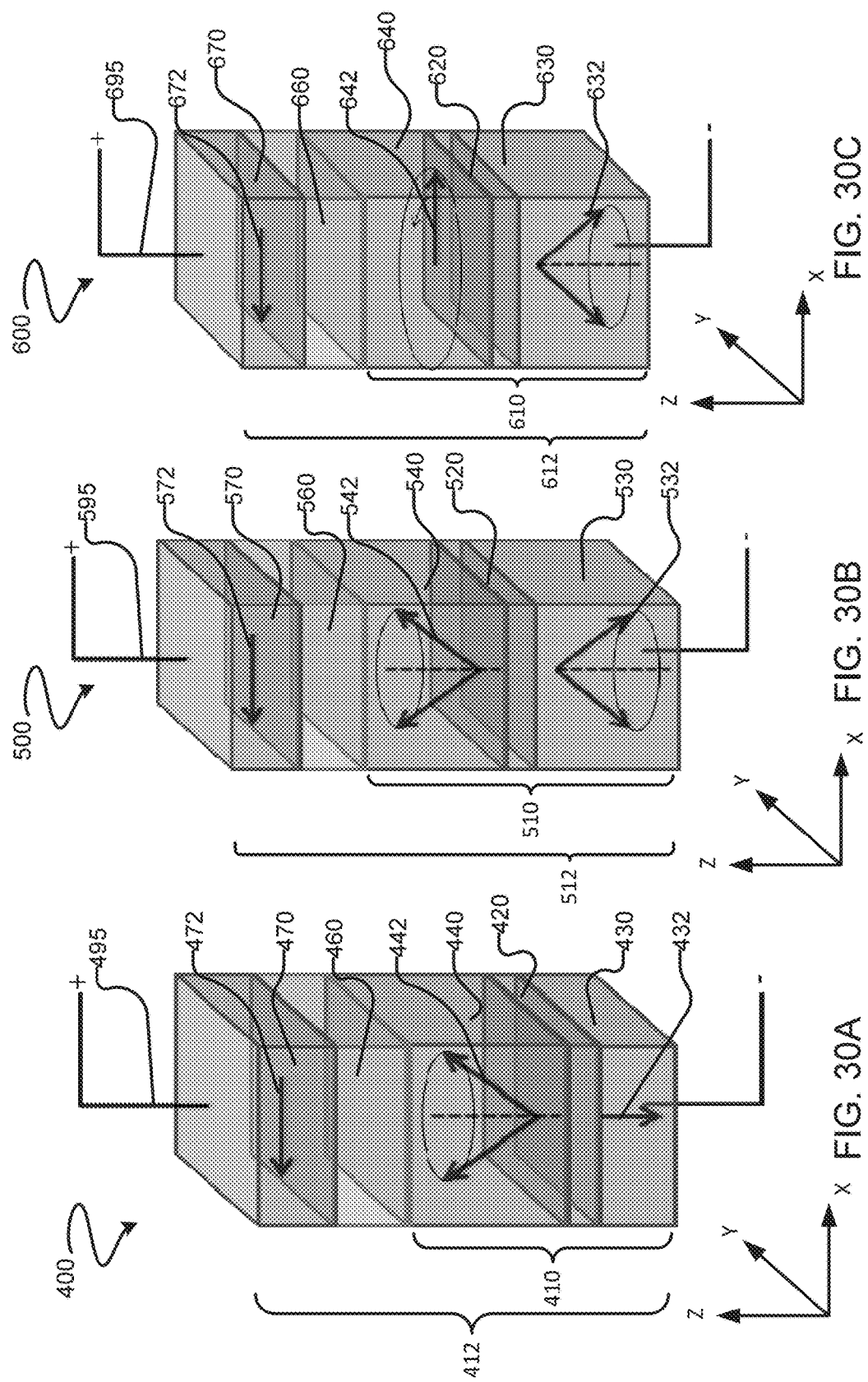

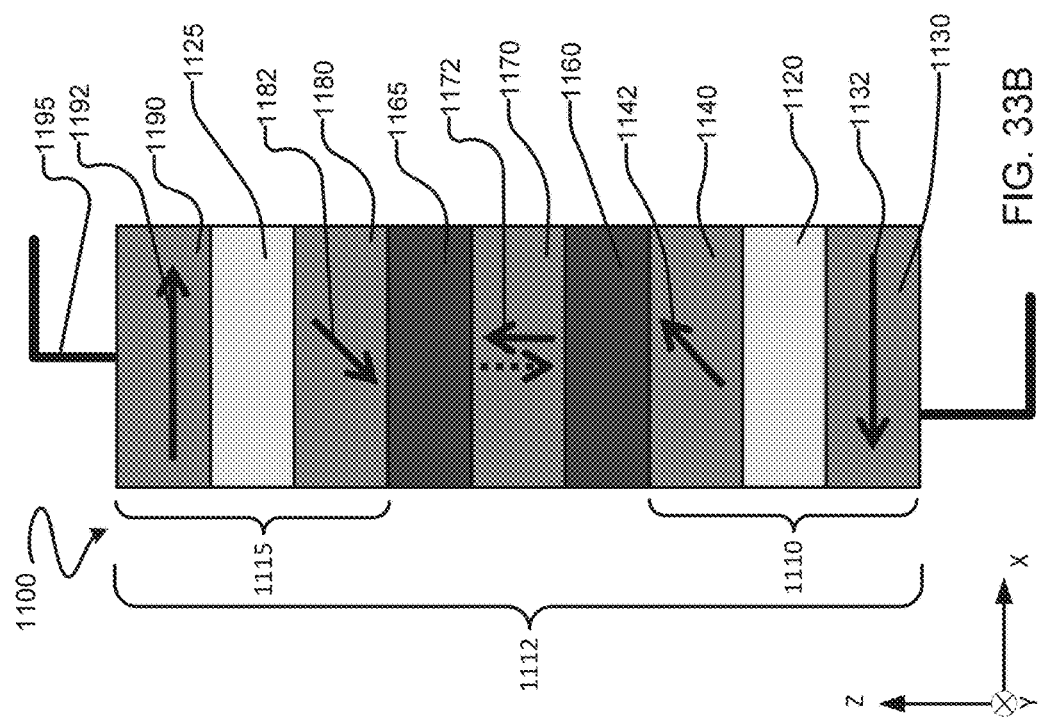
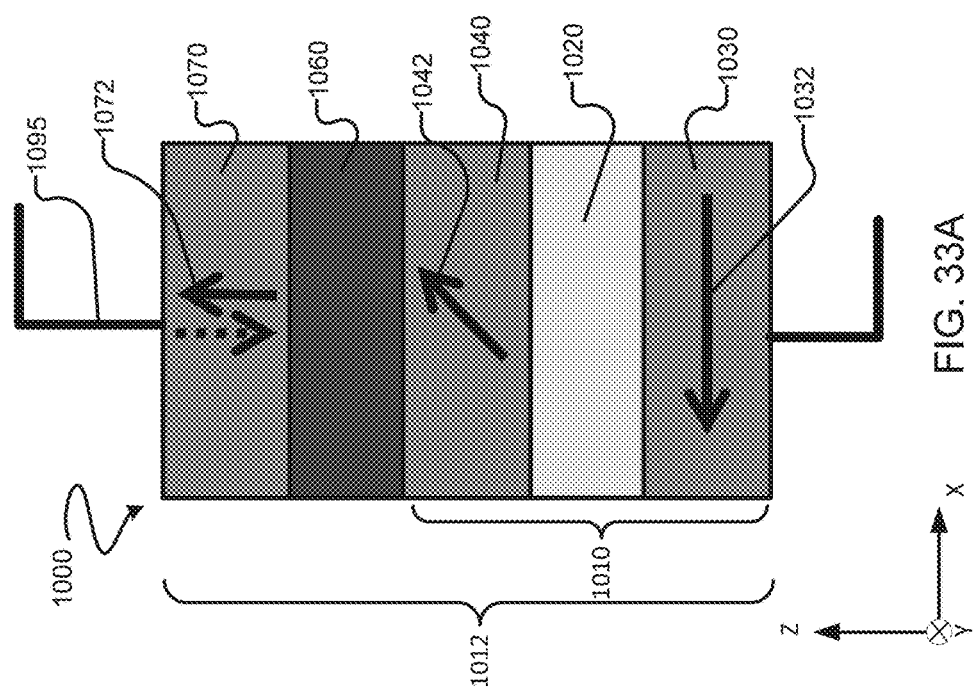
FIG. 33B
FIG. 33A

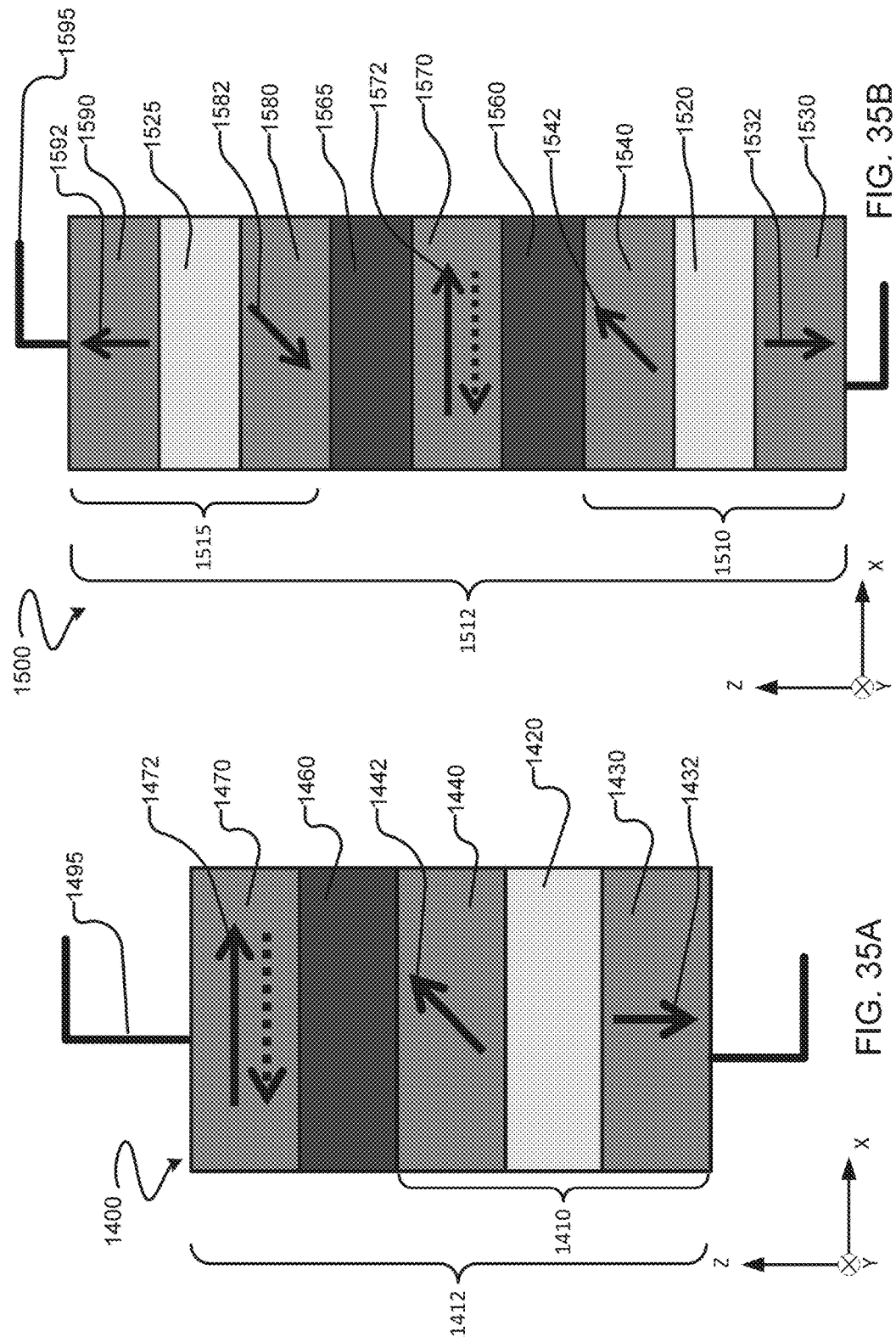

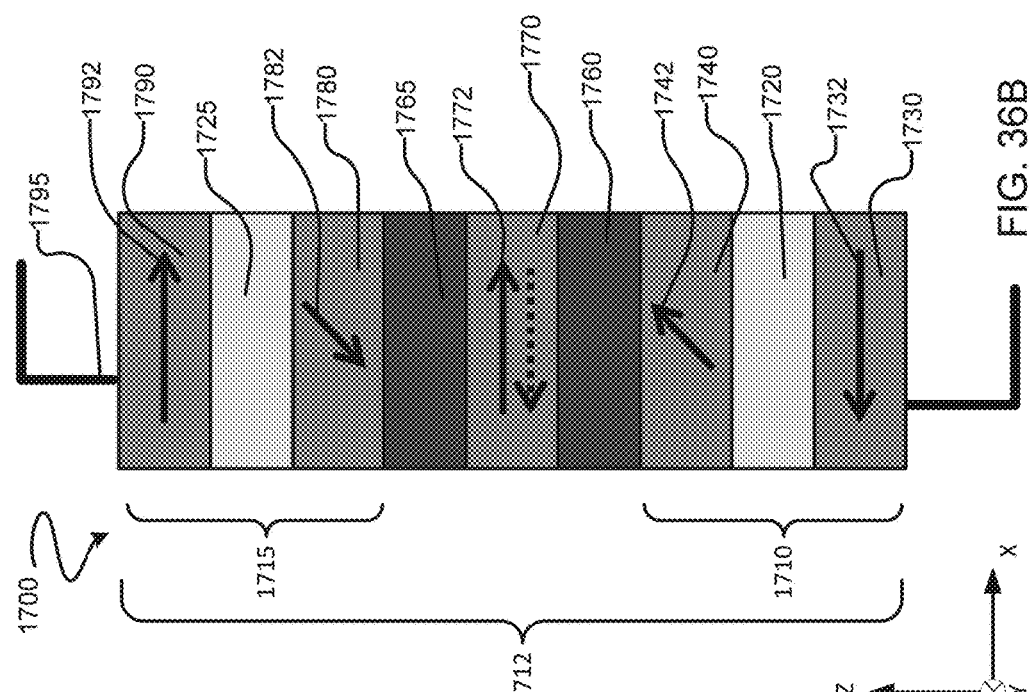
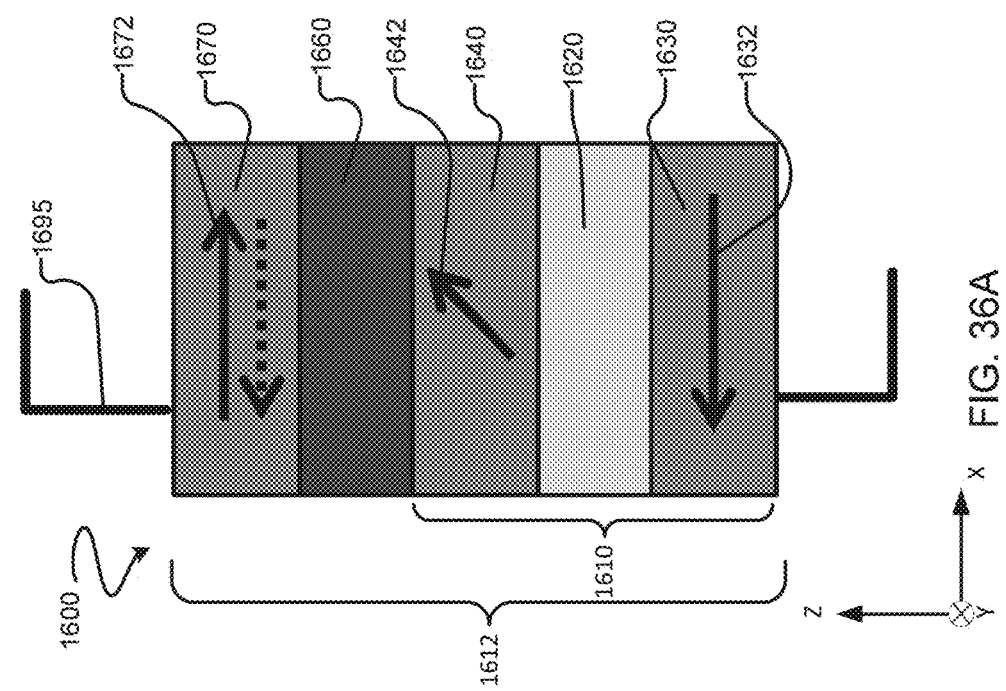

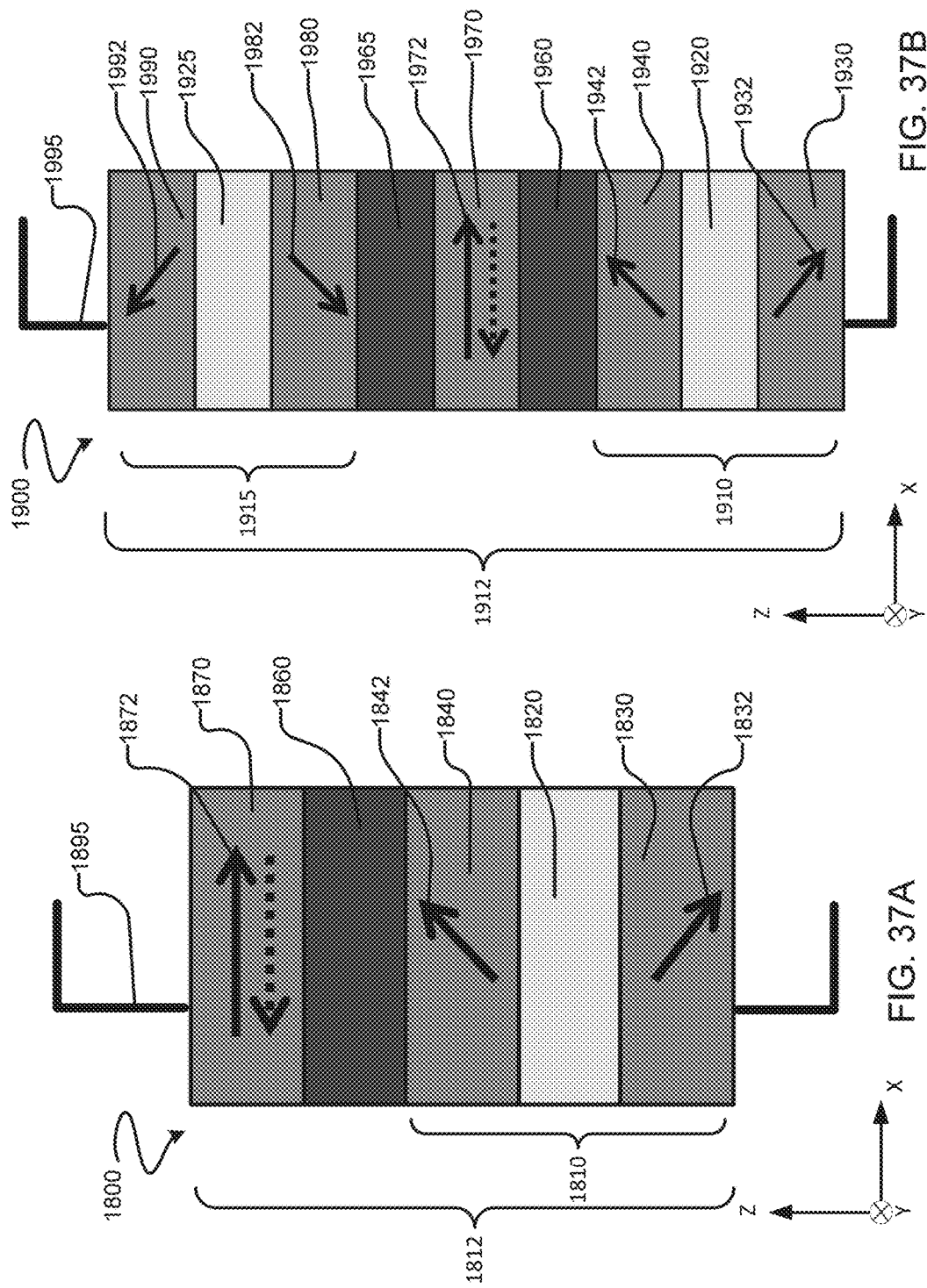

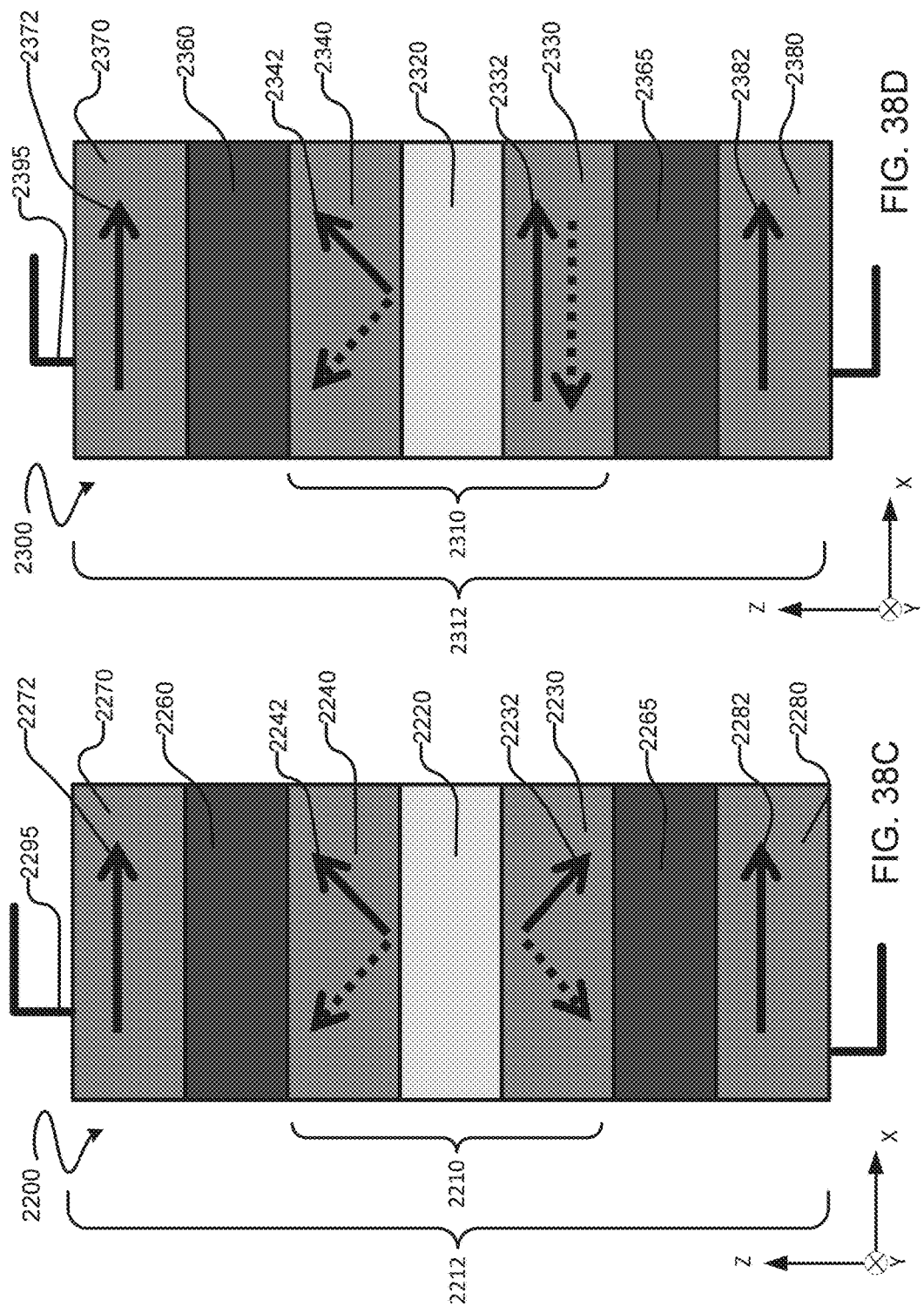

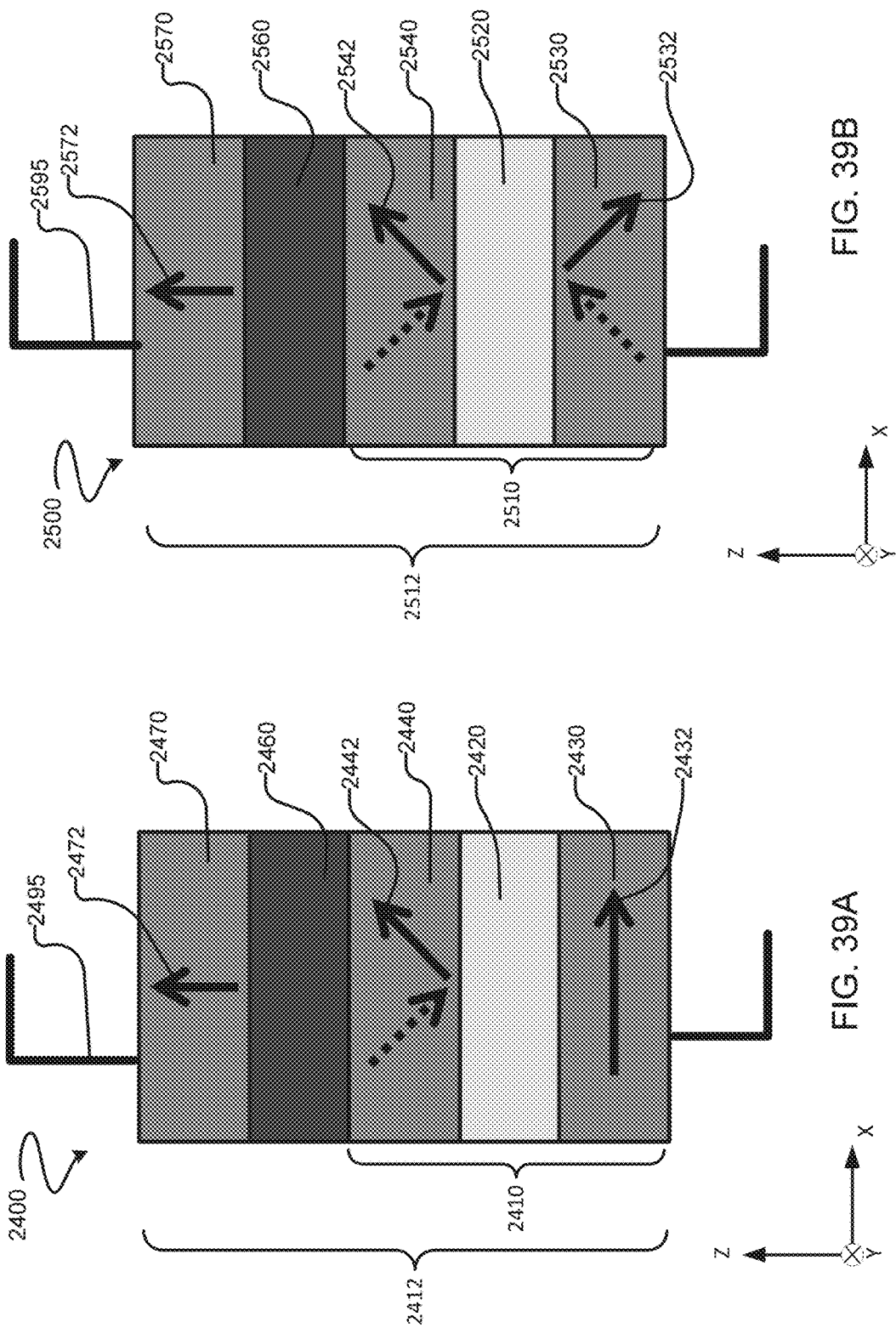

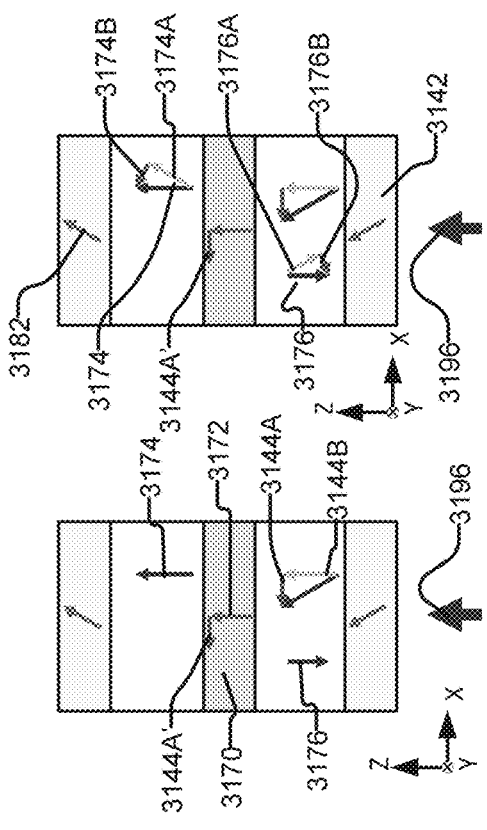
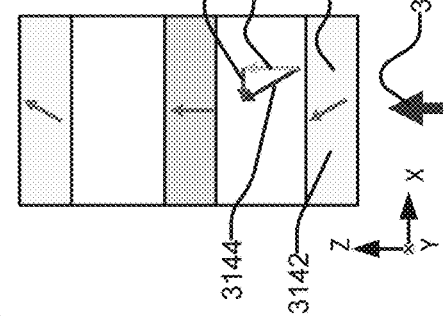
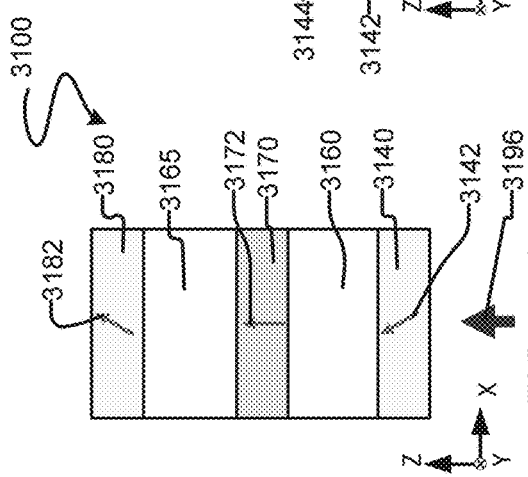
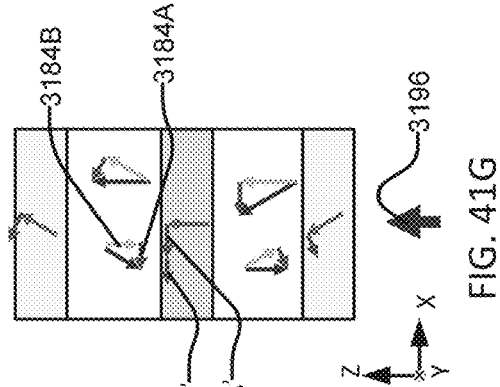
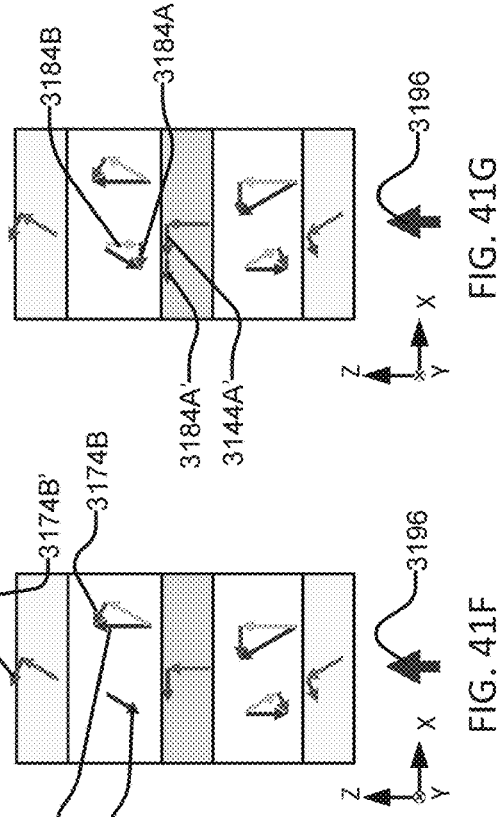
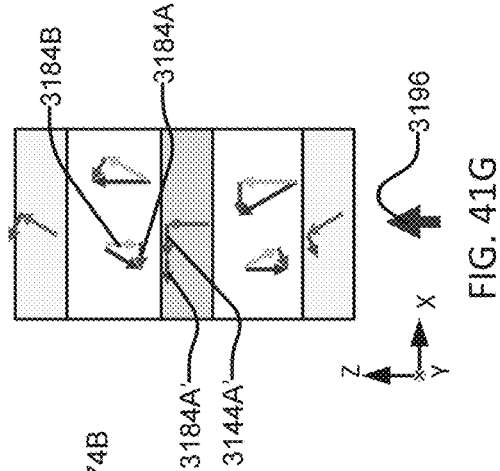
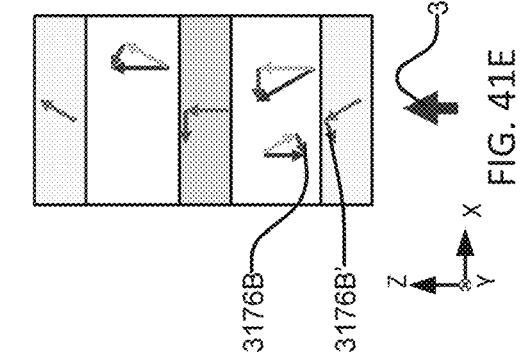

APPLICATIONS OF NON-COLLINEARLY COUPLED MAGNETIC LAYERS

RELATED APPLICATIONS

This application is a continuation of U.S. application Ser. No. 15/919,071 filed 12 Mar. 2018, which is a continuation-in-part of Patent Cooperation Treaty application No. PCT/CA2017/051419 filed 24 Nov. 2017. U.S. application Ser. No. 15/919,071 claims the benefit under 35 USC 119 of U.S. application No. 62/614,928 filed 8 Jan. 2018, U.S. application No. 62/555,625 filed 7 Sep. 2017 and U.S. application No. 62/470,123 filed 10 Mar. 2017. Patent Cooperation Treaty application No. PCT/CA2017/051419 claims priority from and the benefit under 35 USC 119 of U.S. application No. 62/555,625 filed 7 Sep. 2017 and U.S. application No. 62/470,123 filed 10 Mar. 2017. All of the applications referred to in this paragraph are hereby incorporated herein by reference.

TECHNICAL FIELD

This invention relates to magnetic coupling layers, devices comprising magnetic coupling layers, applications of magnetic coupling layers and methods for fabricating and/or using same. Particular embodiments provide devices comprising one or more coupling layers for spacing apart a plurality of magnetic layers and for aligning magnetization directions of one or more of the plurality of magnetic layers at non-collinear angles relative to one another.

BACKGROUND

Structures comprising two or more magnetic layers that are coupled via an intervening coupling layer may be employed for magnetic memory devices, magnetic sensors (e.g. magnetoresistive sensors), and/or other applications. Typically, the magnetic moments (or magnetic directions or magnetization directions) of such magnetic layers are coupled at 0° relative to one another (which may be referred to as being ferromagnetically coupled) or are coupled at 180° relative to one another (which may be referred to as being antiferromagnetically coupled and/or as antiparallel coupling). While ferromagnetically coupled magnetic layers and antiferromagnetically coupled layers have proven to be useful, there are a number of drawbacks associated with having the magnetic layers coupled at 0° relative to one another. For example, for magnetoresistive sensor applications, such as those employing tunnel-magnetoresistance (TMR) or giant-magnetoresistance (GMR), such drawbacks include, without limitation: ambiguities in the resistive response to the directionality of the applied field and non-linearity of the resistive response to the applied field. As another example, for memory device applications, switching between stable states is typically reliant on probabilistic thermal variation, leading to drawbacks that include, without limitation: undesirably long switching times, undesirably high error rates and undesirably high switching current or switching power.

U.S. Pat. No. 7,199,984 discloses a PtMn coupling layer having an atomic concentration of 25-75% Pt and 25-75% Mn for coupling CoFe or NiFe magnetic layers with orthogonally oriented magnetization directions. Such orthogonally oriented magnetization directions represent an example of non-collinearly coupled (NCC) magnetic layers. The PtMn coupling layer disclosed by U.S. Pat. No. 7,199,984 has a thickness of less than 10 nm and is preferably between 1.5 and 5.0 nm. PtMn coupling layers of the type disclosed by U.S. Pat. No. 7,199,984 have weak coupling strength and low saturation fields. Because of this weak coupling strength, sensors which employ coupling layers constructed according to the teachings of U.S. Pat. No. 7,199,984 may only be employed for sensing external magnetic fields less than approximately 1000 Oe. There is a desire for magnetic sensors with the ability to sense stronger external magnetic fields. In addition, PtMn coupling layers of the type disclosed by U.S. Pat. No. 7,199,984 have been determined to require thicknesses of greater than about 1.2 nm. Below this thickness, diffusion of material from the adjacent magnetic layers destroys the orthogonal non-collinear coupling. There is a general desire to make magnetic structures (e.g. non-collinearly coupled magnetic structures) that are as small as is reasonably possible.

Still further, the coupling layers disclosed by U.S. Pat. No. 7,199,984 tend to revert to coupling at 0° after annealing (e.g. at temperatures greater than 200° C. or even at lower temperatures). For example, the inventors created a structure according to the teachings of U.S. Pat. No. 7,199,984 where a Mn coupling layer having a thickness of 1.4 nm was interposed between Co magnetic layers. FIG. 1 shows the normalized magnetization of this structure as a function of external magnetic field H without annealing (dark circles) and with annealing at 200° C. (open circles). As can be seen from FIG. 1, the magnetic structure having a coupling layer of Mn that is annealed at 200° C. does not exhibit non-collinear magnetic coupling between the Co magnetic layers of the magnetic structure (e.g. the annealed magnetic structure is fully saturated even with a very small applied magnetic field (e.g. 100 Oe)). Many applications for coupled magnetic layers, such as applications which make use of the tunnel magnetoresistance (TMR) effect, require annealing (e.g. at temperatures greater than 200° C.) to increase sensitivity and increase the magnitude of resistance changes across a magnetoresistive layer. Annealing may also be required to align antiferromagnetic layers in particular applications. There is a general desire for magnetic structures comprising two or more magnetic layers that are coupled via an intervening coupling layer where the magnetic structure, or a portion thereof may be annealed (for example, at temperatures above 200° C.) without undesirably affecting the coupling (e.g. non-collinear coupling) of the two or more magnetic structures. Structures fabricated according to the techniques described in U.S. Pat. No. 7,199,984 exhibit non-collinear coupling at 90° only. There is a general desire to provide structures that exhibit non-collinear coupling at angles other than 90°.

U.S. Pat. No. 6,893,741 discloses a RuFe coupling layer having an atomic concentration of less than or equal to 60% Fe and at least 40% Ru for antiferromagnetically coupling specific Co alloy (such as CoPtCrB) magnetic layers (i.e. with magnetization directions at an angle of 180° with respect to one another). U.S. Pat. No. 6,893,741 discloses an exchange field (also commonly referred to as a saturation field) of 2750 Oe for $Ru_{65}Fe_{35}$ as compared to 1575 Oe for a pure Ru coupling layer. To the extent that the assertions in U.S. Pat. No. 6,893,741 are accurate, such structures could only be employed for sensing external magnetic fields under less than approximately 1375 Oe. There is a desire for magnetic sensors with the ability to sense stronger external magnetic fields, whether such sensors comprise antiferromagnetically coupled magnetic layers and/or non-collinearly coupled magnetic layers. Similarly, the coupling layers disclosed by U.S. Pat. No. 6,893,741 could not be employed for the purpose of pinning a magnetic layer in applications where external fields of greater than 2750 Oe may be experienced. Further, the coupling layers disclosed by U.S. Pat. No. 6,893,741 do not allow coupling at angles other than 180° and, consequently, suffer from the above-described drawbacks of antiferromagnetic coupling.

There is a general desire for magnetic devices comprising coupling layers for coupling magnetic layers at non-collinear angles (i.e. angles greater than 0° and less than) 180°. It may be desirable for such magnetic devices to have high coupling strength and/or high saturation fields. There is a general desire for magnetic devices comprising coupling layers for coupling magnetic layers at non-collinear angles other than 90° (i.e. angles other than 0°, 90° and 180°). There is a general desire for magnetic devices comprising coupling layers for coupling magnetic layers at non-collinear angles (i.e. angles other than 0° and) 180° after annealing. There is a general desire for magnetic devices comprising coupling layers that are practical to manufacture without requiring overly stringent tolerances on atomic composition and atomic distribution and coupling layer thickness.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

An aspect of the invention provides a magnetic device having a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic device also has a third magnetic layer having a third magnetization direction and a first magnetoresistive layer interposed between the third magnetic layer and the second magnetic layer. A circuit is connected to one or more of the layers of the magnetic device by at least a pair of leads. The circuit is configured to determine a change in resistance between the pair of leads. The change in resistance is based at least in part on a change in an angular relationship between the third magnetization direction and the second magnetization direction caused by application of an external magnetic field in a region where at least a portion of the device is located or by a current passing through at least a portion of the device. An X direction is orthogonal to the Z direction and a Y direction is orthogonal to the X direction and to the Z direction.

In some embodiments, the first coupling layer comprises at least one first non-magnetic element selected from the group consisting of: Ag, Cr, Ru, Mo, Ir, Rh, Cu, V, Nb, W, Ta, Ti, Re, Os, Au, Al and Si, and at least one first magnetic element selected from the group consisting of: Ni, Co, and Fe. An atomic ratio of the at least one first non-magnetic element to the at least one first magnetic element is (100−x):x where x is an atomic concentration parameter which causes, or is selected to cause, the first magnetic layer to be non-collinearly coupled to the second magnetic layer.

In some embodiments, the coupling layer has a thickness, $t_c$, and wherein the combination of the atomic concentration parameter x and the coupling layer thickness $t_c$ causes, or is selected to cause, the first magnetic layer to be non-collinearly coupled to the second magnetic layer. In some embodiments, the first magnetic layer has a thickness, $t_{m1}$, and the second magnetic layer has a thickness, $t_{m2}$, and $t_{m1}$ and $t_{m2}$ are each selected such that the first magnetic layer is non-collinearly coupled to the second magnetic layer.

In some embodiments, the first non-collinear angle is between approximately 5° and 175° in absence of external magnetic field. In some embodiments, the first non-collinear angle is a non-orthogonal, non-collinear angle between approximately 5° and 85° or 95° and 175° in absence of external magnetic field. In some embodiments, the first non-collinear angle is a non-orthogonal, non-collinear angle between approximately 95° and 175° in absence of external magnetic field.

In some embodiments, the first magnetization direction is fixed, the second magnetization direction is free and the third magnetization direction is fixed. In some embodiments, the first magnetization direction is fixed, the second magnetization direction is fixed and the third magnetization direction is free. In some embodiments, the first magnetization direction is free, the second magnetization direction is free and the third magnetization direction is fixed.

In some embodiments, the at least a pair of leads are connected across the first, second and third magnetic layers, the first coupling layer and the first magnetoresistive layer.

In some embodiments, a second coupling layer interposed between the first magnetic layer and a fourth magnetic layer, the fourth magnetic layer having a fourth magnetization direction. In some embodiments, the at least a pair of leads are connected across the first, second, third and fourth magnetic layers, the first and second coupling layers and the first magnetoresistive layer. In some embodiments, the first magnetic layer is non-collinearly coupled to the fourth magnetic layer such that, in the absence of external magnetic field, the first magnetization direction is oriented at a second non-collinear angle relative to the fourth magnetization direction. In some embodiments, the fourth magnetization direction is fixed.

In some embodiments, the second coupling layer comprises at least one second non-magnetic element selected from the group consisting of: Ag, Cr, Ru, Mo, Ir, Rh, Cu, V, Nb, W, Ta, Ti, Re, Os, Au, Al and Si, and at least one second magnetic element selected from the group consisting of: Ni, Co, and Fe. An atomic ratio of the at least one second non-magnetic element to the at least one second magnetic element is (100−x):x, where x is an atomic concentration parameter which causes, or is selected to cause, the first magnetic layer to be non-collinearly coupled to the fourth magnetic layer such that, in the absence of external magnetic field, the first magnetization direction is oriented at the second non-collinear angle relative to the fourth magnetization direction.

In some embodiments, a second magnetoresistive layer is interposed between the first magnetic layer and a fourth magnetic layer, the fourth magnetic layer having a fourth magnetization direction. In some embodiments, the at least a pair of leads are connected across the first, second, third and fourth magnetic layers, the first coupling layer and the first and second magnetoresistive layers. In some embodiments, the fourth magnetization direction is fixed.

In some embodiments, a second magnetoresistive layer is interposed between a fourth magnetic layer and the third magnetic layer, the fourth magnetic layer having a fourth magnetization direction and a second coupling layer is interposed between the fourth magnetic layer and a fifth magnetic layer, the fifth magnetic layer having a fifth magnetization direction and the fourth and fifth magnetization directions are fixed to one another. In some embodiments, the at least a pair of leads are connected across the first, second, third, fourth and fifth magnetic layers, the first and second coupling layers and the first and second magnetoresistive layers. In some embodiments, the fifth magnetic layer is non-collinearly coupled to the fourth magnetic layer such that, in the absence of external magnetic field, the fifth magnetization direction is oriented at a second non-collinear angle relative to the fourth magnetization direction.

In some embodiments, the second coupling layer comprises at least one second non-magnetic element selected from the group consisting of: Ag, Cr, Ru, Mo, Ir, Rh, Cu, V, Nb, W, Ta, Ti, Re, Os, Au, Al and Si, and at least one second magnetic element selected from the group consisting of: Ni, Co, and Fe. An atomic ratio of the at least one second non-magnetic element to the at least one second magnetic element is (100−x):x, where x is an atomic concentration parameter which causes, or is selected to cause, the first magnetic layer to be non-collinearly coupled to the fourth magnetic layer such that, in the absence of external magnetic field, the first magnetization direction is oriented at the second non-collinear angle relative to the fourth magnetization direction.

In some embodiments, the second and fourth magnetization directions each have non-zero Z direction components or non-zero Y direction components. In some embodiments, the second magnetization direction has an X direction component oriented in the opposite direction of an X direction component of the fourth magnetization direction. In some embodiments, the second magnetization direction has a Y direction component oriented in the opposite direction of a Y direction component of the fourth magnetization direction. In some embodiments, the second magnetization direction has a Z direction component oriented in the opposite direction of a Z direction component of the fourth magnetization direction. In some embodiments, the third magnetization direction is parallel to the Z direction. In some embodiments, the third magnetization direction extends in a plane defined by the X and Y directions.

In some embodiments, at least a portion of the magnetic device has an X direction dimension that is greater than a Y direction dimension of the at least a portion of the magnetic device. In some embodiments, the X direction dimension is at least double the Y direction dimension. In some embodiments, at least a portion of the magnetic device has an X direction dimension that is substantially equal to a Y direction dimension of the at least a portion of the magnetic device. In some embodiments, at least a portion of the magnetic device has an X direction dimension that is within 0.9 to 1.1 times the size of a Y direction dimension of the at least a portion of the magnetic device.

In some embodiments, a magnetic device discussed herein is part of a magnetic memory device and the change in resistance is based at least in part on the change in the angular relationship between the third magnetization direction and the second magnetization direction caused by a current passing through at least a portion of the device. In some embodiments, the change in the angular relationship between the third magnetization direction and the second magnetization comprises a change between a first state representing a first value for a bit of information and a second state representing a second value for the bit of information. In some embodiments, information may be stored on the magnetic memory device by applying a current through at least a portion of the device to change the angular relationship between the third magnetization direction and the second magnetization direction, measuring the resistance of the magnetic device to determine the angular relationship between the third magnetization direction and the second magnetization direction, and associating a measured relationship between the third magnetization direction and the second magnetization direction with a value of a bit of information.

In some embodiments, a magnetic device discussed herein is part of a magnetic sensor and the change in resistance is based at least in part on the change in the angular relationship between the third magnetization direction and the second magnetization direction caused by the application of the external magnetic field. In some embodiments, an external field may be sensed by a magnetic sensor device by applying an external field to the magnetic device, measuring the resistance of the magnetic device to determine the angular relationship between the third magnetization direction and the second magnetization direction, and associating a measured relationship between the third magnetization direction and the second magnetization direction with the presence of the external field.

In some embodiments, associating the measured relationship between the third magnetization direction and the second magnetization direction with the presence of the external field comprises associating the measured relationship between the third magnetization direction and the second magnetization direction with a magnitude of the external field. In some embodiments, associating the measured relationship between the third magnetization direction and the second magnetization direction with the presence of the external field comprises associating the measured relationship between the third magnetization direction and the second magnetization direction with a direction of the external field.

In some embodiments, a magnetic device discussed herein is part of an oscillator device and a driver circuit is connected to one or more of the layers of the magnetic device to apply driver current to the magnetic device to create, in the circuit, a signal based at least in part on the angular relationship between the third magnetization direction and the second magnetization direction. In some embodiments, the driver current is direct current or alternating current and the signal is a direct current signal or an alternating current signal. In some embodiments, an external magnetic field may be sensed with the oscillator device by applying an external field to the oscillator device, measuring the signal and associating a measurement of the signal with the presence of the external field. In some embodiments, associating the measurement of the signal with the presence of the external field comprises associating the measurement of the signal with a magnitude of the external field. In some embodiments, associating the measurement of the signal with the presence of the external field comprises associating the measurement of the signal with a direction of the external field. In some embodiments, the measurement of the signal represents an amplitude of the signal. In some embodiments, the measurement of the signal represents a frequency of the signal.

In some embodiments, an alternating current output signal may be created from a direct current input signal with a magnetic device by applying a direct current input signal through one or more layers of the magnetic device to continuously change the angular relationship between the third magnetization direction and the second magnetization direction, and receiving an alternating current output signal based at least in part on the continuous change of the angular relationship between the third magnetization direction and the second magnetization direction.

In some embodiments, a direct current output signal may be created from an alternating current input signal using a magnetic device by applying an alternating current input signal through one or more layers of the magnetic device to continuously change the angular relationship between the third magnetization direction and the second magnetization direction, and receiving a direct current output signal based at least in part on the continuous change of the angular relationship between the third magnetization direction and the second magnetization direction.

Another aspect of the invention provides a magnetic device having an upper magnetic layer having an upper magnetization direction, a lower magnetic layer having a lower magnetization direction, the lower magnetic layer spaced apart from the upper magnetic layer in a Z direction, an interior magnetic layer having an interior magnetization direction, a lower magnetoresistive layer interposed between the lower magnetic layer and the interior magnetic layer and an upper magnetoresistive layer interposed between the upper magnetic layer and the free magnetic layer. A circuit is connected to one or more of the layers of the magnetic device by at least a pair of leads. The circuit is configured to determine a change in resistance between the pair of leads, the change in resistance based at least in part on a change in an angular relationship between the upper magnetization direction and the interior magnetization and an angular relationship between the lower magnetization direction and the interior magnetization direction caused by application of an external magnetic field in a region where at least a portion of the device is located or by a current passing through at least a portion of the device. An X direction is orthogonal to the Z direction and a Y direction is orthogonal to the X direction and to the Z direction. The upper and lower magnetization directions are each fixed and the interior magnetization direction is free. The upper and lower magnetization directions each have non-zero Z direction components or non-zero Y components in the absence of an external magnetic field. The upper magnetization direction has an X direction component oriented in the opposite direction of an X direction component of the lower magnetization direction.

In some embodiments, the at least a pair of leads are connected across the upper, lower and interior magnetic layers and the upper and lower magnetoresistive layers. In some embodiments, the upper magnetization direction has a Y direction component oriented in the opposite direction of a Y direction component of the lower magnetization direction. In some embodiments, the upper magnetization direction has a Z direction component oriented in the opposite direction of a Z direction component of the lower magnetization direction. In some embodiments, the interior magnetization direction is parallel to the Z direction in the absence of the external magnetic field. In some embodiments, the interior magnetization direction extends in a plane defined by the X and Y directions in the absence of the external magnetic field.

Another aspect of the invention provides a magnetic memory device having a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A circuit is connected to one or more of the layers of the magnetic device by at least a pair of leads. The circuit is configured to determine a change in resistance between the pair of leads wherein the change in resistance is based at least in part on the change in the angular relationship between the third magnetization direction and the second magnetization direction caused by a current passing through at least a portion of the device. An X direction is orthogonal to the Z direction and a Y direction is orthogonal to the X direction and to the Z direction.

Another aspect of the invention provides a magnetic sensor device having a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A circuit is connected to one or more of the layers of the magnetic device by at least a pair of leads. The circuit is configured to determine a change in resistance between the pair of leads, wherein the change in resistance is based at least in part on the change in the angular relationship between the third magnetization direction and the second magnetization direction caused by the application of the external magnetic field. An X direction is orthogonal to the Z direction and a Y direction is orthogonal to the X direction and to the Z direction.

Another aspect of the invention provides an oscillator device having a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A driver circuit is connected to one or more of the layers of the magnetic device to apply driver current to the magnetic device to create a signal based at least in part on an angular relationship between the third magnetization direction and the second magnetization direction. An X direction is orthogonal to the Z direction and a Y direction is orthogonal to the X direction and to the Z direction.

Another aspect of the invention provides method of sensing an external field with a magnetic sensor device. The method includes providing an oscillator device comprising. The oscillator device has a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A driver circuit is connected to one or more of the layers of the magnetic device to apply driver current to the magnetic device to create a signal based at least in part on an angular relationship between the third magnetization direction and the second magnetization direction. An X direction is orthogonal to the Z direction and a Y direction is orthogonal to the X direction and to the Z direction. The method also includes applying an external field to the oscillator device, measuring the signal, associating a measurement of the signal with the presence of the external field.

Another aspect of the invention provides a method of storing information on a magnetic memory device. The method includes providing a magnetic device. The magnetic device has a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A circuit is connected to one or more of the layers of the magnetic device by at least a pair of leads. The circuit is configured to determine a change in resistance between the pair of leads wherein the change in resistance is based at least in part on the change in the angular relationship between the third magnetization direction and the second magnetization direction caused by a current passing through at least a portion of the device. An X direction is orthogonal to the Z direction and a Y direction is orthogonal to the X direction and to the Z direction. The method also includes applying a current through at least a portion of the device to change the angular relationship between the third magnetization direction and the second magnetization direction, measuring the resistance of the magnetic device to determine the angular relationship between the third magnetization direction and the second magnetization direction and associating a measured relationship between the third magnetization direction and the second magnetization direction with a value of a bit of information.

Another aspect of the invention provides a method of sensing an external field with a magnetic sensor device. The method includes providing a magnetic device, the magnetic device a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A circuit is connected to one or more of the layers of the magnetic device by at least a pair of leads. The circuit is configured to determine a change in resistance between the pair of leads, wherein the change in resistance is based at least in part on the change in the angular relationship between the third magnetization direction and the second magnetization direction caused by the application of the external magnetic field. An X direction is orthogonal to the Z direction and a Y direction is orthogonal to the X direction and to the Z direction. The method also includes applying an external field to the magnetic device, measuring the resistance of the magnetic device to determine the angular relationship between the third magnetization direction and the second magnetization direction, and associating a measured relationship between the third magnetization direction and the second magnetization direction with the presence of the external field.

Another aspect of the invention provides a method of creating an alternating current output signal from a direct current input signal. The method includes providing a magnetic device having a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A driver circuit is connected to one or more of the layers of the magnetic device to apply driver current to the magnetic device to create a signal based at least in part on an angular relationship between the third magnetization direction and the second magnetization direction. An X direction is orthogonal to the Z direction and a Y direction is orthogonal to the X direction and to the Z direction. The method also includes applying a direct current input signal through one or more layers of the magnetic device to continuously change the angular relationship between the third magnetization direction and the second magnetization direction, and receiving an alternating current output signal based at least in part on the continuous change of the angular relationship between the third magnetization direction and the second magnetization direction.

Another aspect of the invention provides a method of creating a direct current output signal from an alternating current input signal. The method includes providing a magnetic device having a first magnetic layer having a first magnetization direction and a second magnetic layer having a second magnetization direction. The second magnetic layer is spaced apart from the first magnetic layer in the Z direction. A first coupling layer is interposed between the first and second magnetic layers. The first magnetic layer is non-collinearly coupled to the second magnetic layer by the first coupling layer such that, in the absence of external magnetic field, the first magnetization direction is oriented at a first non-collinear angle relative to the second magnetization direction. The magnetic memory device also has third magnetic layer having a third magnetization direction. A first magnetoresistive layer is interposed between the third magnetic layer and the second magnetic layer. A driver circuit is connected to one or more of the layers of the magnetic device to apply driver current to the magnetic device to create a signal based at least in part on an angular relationship between the third magnetization direction and the second magnetization direction. An X direction is orthogonal to the Z direction and a Y direction is orthogonal to the X direction and to the Z direction. The method includes applying an alternating current input signal through one or more layers of the magnetic device to continuously change the angular relationship between the third magnetization direction and the second magnetization direction and receiving a direct current output signal based at least in part on the continuous change of the angular relationship between the third magnetization direction and the second magnetization direction.

Another aspect of the invention provides a magnetic structure having a first magnetic layer having a first magnetization direction, a second magnetic layer having a second magnetization direction and a coupling layer interposed between the first and second magnetic layers. The coupling layer may comprise at least one non-magnetic element selected from the group consisting of: Ag, Cr, Ru, Mo, Ir, Rh, Cu, V, Nb, W, Ta, Ti, Re, Os, Au, Al and Si and at least one magnetic element selected from the group consisting of: Ni, Co, Fe, NiPt, NiPd, CoPt, CoPd, FePt, and FePd. The atomic ratio of the at least one non-magnetic element to the at least one magnetic element may be (100−x):x, where x is an atomic concentration parameter which causes, or is selected to cause, the first magnetic layer to be non-collinearly coupled to the second magnetic layer such that, in the absence of external magnetic field, the first magnetization direction is oriented at a non-collinear angle relative to the second magnetization direction.

Another aspect of the invention provides a magnetic structure having a first magnetic layer having a first magnetization direction, a second magnetic layer having a second magnetization direction, and a coupling layer interposed between the first and second magnetic layers. The coupling layer may comprise at least one non-magnetic component selected from the group consisting of: Ag, Cr, Ru, Mo, Ir, Rh, Cu, V, Nb, W, Ta, Ti, Re, Os, Au, Al and Si and at least one magnetic component selected from the group consisting of: Ni, Co, Fe, NiPt, NiPd, CoPt, CoPd, FePt, and FePd. The atomic ratio of the at least one non-magnetic component to the at least one magnetic component is (100−x):x, where x is an atomic concentration parameter which causes, or is selected to cause, the first magnetic layer to be non-collinearly coupled or non-collinearly, non-orthogonally coupled (i.e. both non-collinearly and non-orthogonally coupled) to the second magnetic layer such that, in the absence of external magnetic field, the first magnetization direction is oriented at a non-collinear angle relative to the second magnetization direction.

Another aspect of the invention provides a magnetic structure having a first magnetic layer having a first magnetization direction, a second magnetic layer having a second magnetization direction and a coupling layer interposed between the first and second magnetic layers. The coupling layer may comprise: at least one non-magnetic element comprising Ru and at least one magnetic element comprising Fe. The atomic ratio of the at least one non-magnetic element to the at least one magnetic element is (100−x):x, where x is an atomic concentration parameter greater than 60 and less than 80 and causes, or is selected to cause, the first magnetic layer to be antiferromagnetically coupled to the second magnetic layer such that, in the absence of external magnetic field, the first magnetization direction is oriented at an antiferromagnetic angle relative to the second magnetization direction.

Another aspect of the invention provides a method for fabricating a magnetic structure. A coupling layer is layered between a first magnetic layer having a first magnetization direction and a second magnetic layer having a second magnetization direction. The coupling layer may comprise at least one non-magnetic element selected from the group consisting of: Ag, Cr, Ru, Mo, Ir, Rh, Cu, V, Nb, W, Ta, Ti, Re, Os, Au, Al and Si, and at least one magnetic element selected from the group consisting of: Ni, Co, and Fe. The atomic ratio of the at least one non-magnetic element to the at least one magnetic element is (100−x):x. The atomic concentration parameter, x, is selected such that the first magnetic layer is non-collinearly coupled to the second magnetic layer, such that, in the absence of external magnetic field, the first magnetization direction is oriented at a non-collinear angle relative to the second magnetization direction.

Another aspect of the invention provides a method for fabricating a magnetic structure. An initial magnetic structure is formed by layering a coupling layer between a first magnetic layer having a first magnetization direction and a second magnetic layer having a second magnetization direction. The coupling layer may comprise at least one non-magnetic element selected from the group consisting of: Ag, Cr, Ru, Mo, Ir, Rh, Cu, V, Nb, W, Ta, Ti, Re, Os, Au, Al and Si. The first and second magnetic layers may each comprise at least one magnetic element selected from the group consisting of: Ni, Co, and Fe. The initial magnetic structure is annealed at a temperature over 100° C. to cause at least some of the at least one magnetic element of the first and second magnetic layers to diffuse into the coupling layer such that an atomic ratio of the at least one non-magnetic element to the at least one magnetic element in the coupling layer is (100−x):x. The initial structure continues to be annealed until x is such that the first magnetic layer is non-collinearly coupled to the second magnetic layer such that, in the absence of external magnetic field, the first magnetization direction is oriented at a non-collinear angle relative to the second magnetization direction.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 2A shows a magnetic structure according to a particular embodiment of the invention.

FIG. 7 schematically depicts how annealing can be used as a process for introducing components from the magnetic layers of the FIG. 2A structure into the coupling layer of the FIG. 2A structure.

FIG. 27B depicts a plot of coupling angle as a function of temperature for a temperature sensor according to a particular embodiment of the invention.

FIGS. 30A, 30B and 30C schematically depict magnetic devices according to particular embodiments of the invention.

FIGS. 33A and 33B schematically depict magnetic devices according to particular embodiments of the invention.

FIGS. 35A and 35B schematically depict magnetic devices according to particular embodiments of the invention.

FIGS. 36A and 36B schematically depict magnetic devices according to particular embodiments of the invention.

FIGS. 37A and 37B schematically depict magnetic devices according to particular embodiments of the invention.

FIGS. 38A, 38B, 38C and 38D schematically depict magnetic devices according to particular embodiments of the invention.

FIGS. 39A, 39B and 39C schematically depict magnetic devices according to particular embodiments of the invention.

FIGS. 41A to 41G schematically depict constructive interference in a magnetic device according to particular embodiments of the invention.

DESCRIPTION

Figure 1:
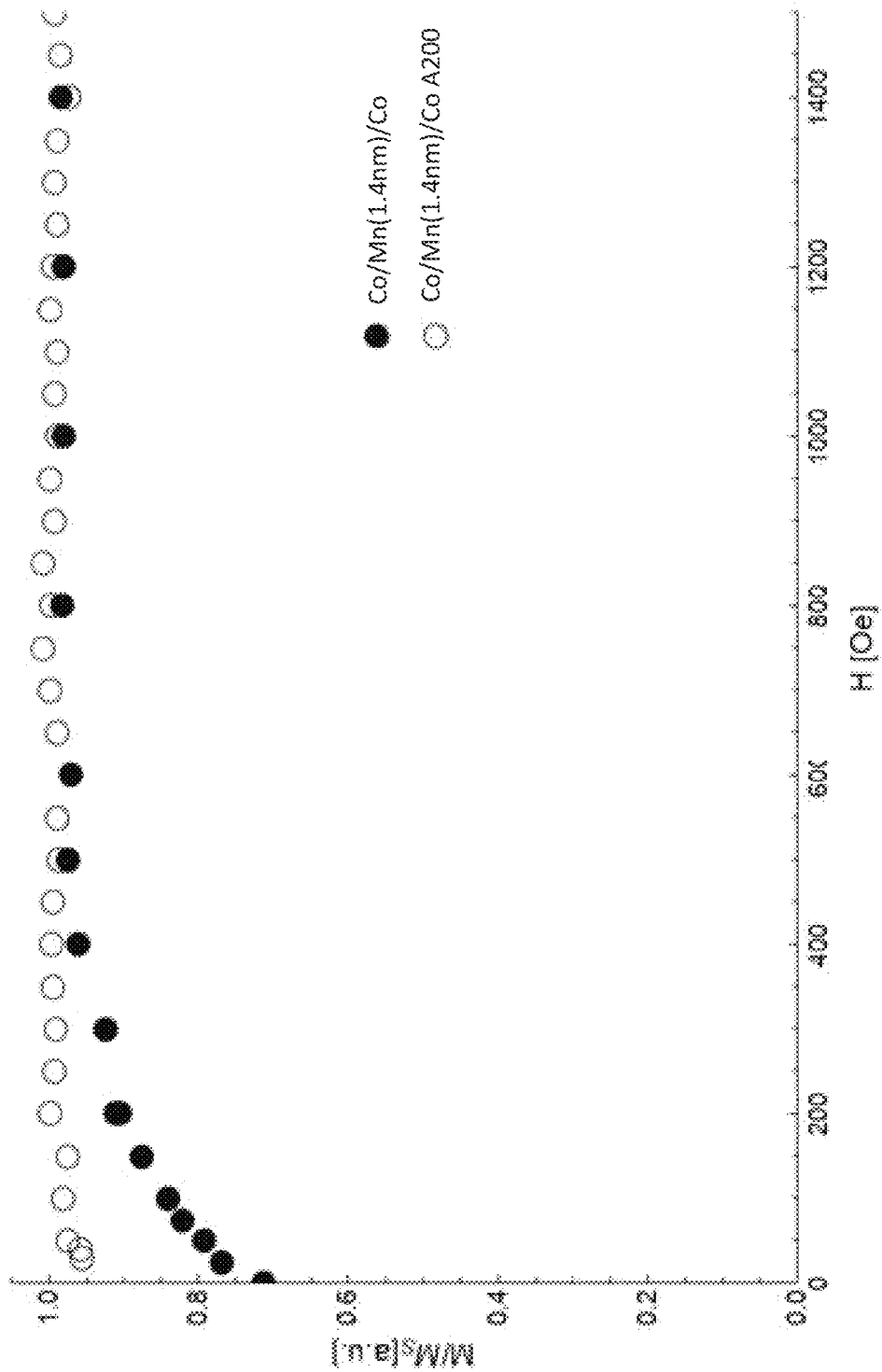
FIG. 1 depicts a plot of the normalized magnetization as a function of external magnetic field H for a magnetic structure having a coupling layer of Mn interposed between Co magnetic layers before and after annealing.

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

One aspect of the invention provides a structure comprising a coupling layer for coupling magnetization directions (also referred to as magnetic moments) of two or more spaced apart magnetic layers. Other aspects of the invention provide a device comprising two spaced apart magnetic layers and an interleaving coupling layer, wherein the magnetization directions of the magnetic layers are coupled to one another. Other aspects of the invention provide methods for fabricating such structures and devices and/or methods for using such structures and devices.

Various forms of coupling between the spaced apart magnetic layers may be possible. Magnetization directions of magnetic layers may be ferromagnetically coupled such that, in the absence of an externally applied magnetic field, the magnetization directions (or magnetic moments) of the magnetic layers are aligned at (or substantially near) 0° with respect to one another. Magnetization directions of magnetic layers may be antiferromagnetically coupled such that, in the absence of an externally applied magnetic field, the magnetization directions (or magnetic moments) are aligned at (or substantially near) 180° with respect to one another. In some embodiments, when the angle between the magnetization directions of spaced magnetic layers is said to be substantially near a reference angle (e.g. 0° or 90° or 180°), then substantially near may be understood to be ±5° from the reference angle. In some embodiments, substantially near may be ±2° from the reference angle. In some embodiments, substantially near may be ±1° from the reference angle. Magnetization directions of magnetic layers may be coupled such that, in the absence of an externally applied magnetic field, the magnetization directions (or magnetic moments) are aligned at a non-collinear angle $\varphi$ with respect to one another. For example, non-collinear angles $\varphi$ may be greater than 0° and less than 180°, greater than 2° and less than 178°, greater than 5° and less than 175° or greater than 10° and less than 170°. Magnetization directions of magnetic layers may be coupled such that, in the absence of an externally applied magnetic field, the magnetization directions (or magnetic moments) are aligned at a non-orthogonal, non-collinear angle $\varphi$ with respect to one another. For example, non-collinear angles $\varphi$ may be: greater than 0° and less than 90° or greater than 90° and less than 180°; greater than 2° and less than 88° or greater than 92° and less than 178°; greater than 5° and less than 85° or greater than 95° and less than 175°; or greater than 10° and less than 80° or greater than 100° and less than 170°.

When discussing magnetization directions herein and arrows depicted in the drawings that represent magnetization directions discussed herein, it should be understood that such magnetization directions may refer to the direction of the predominant magnetization direction or the average magnetic moment direction of the respective magnetic layer. The magnetization direction in different regions throughout each magnetic layer may, in reality, deviate from this predominant or average magnetization direction. For each magnetic layer, the degree of this deviation may depend on the exchange stiffness, $A_{ex}$, of the magnetic layer. The exchange stiffness may account for the direct exchange interaction in ferromagnetic materials. If the exchange stiffness, $A_{ex}$, is larger, then the deviation of magnetization around the predominant or average magnetization direction tends to be smaller, since the direct exchange interaction may cause magnetic moments to align across the magnetic layer in a predominant magnetization direction. In some cases it may be desired that the exchange stiffness, $A_{ex}$, is smaller. This may be achieved by alloying magnetic materials with elements such as, but not limited to, Ru or Cr. In some cases it may be desired that the exchange stiffness, $A_{ex}$, in magnetic layers is larger. Many magnetic materials based on Co and Fe, for example, have a relatively large exchange stiffness, $A_{ex}$. In addition to exchange stiffness, fluctuations in local magnetization directions may be caused by or otherwise associated with fluctuations within the magnetic layer caused by impurities, magnetic layer thickness deviations, and magnetic layer anisotropies and demagnetization energies.

Figure 2B:
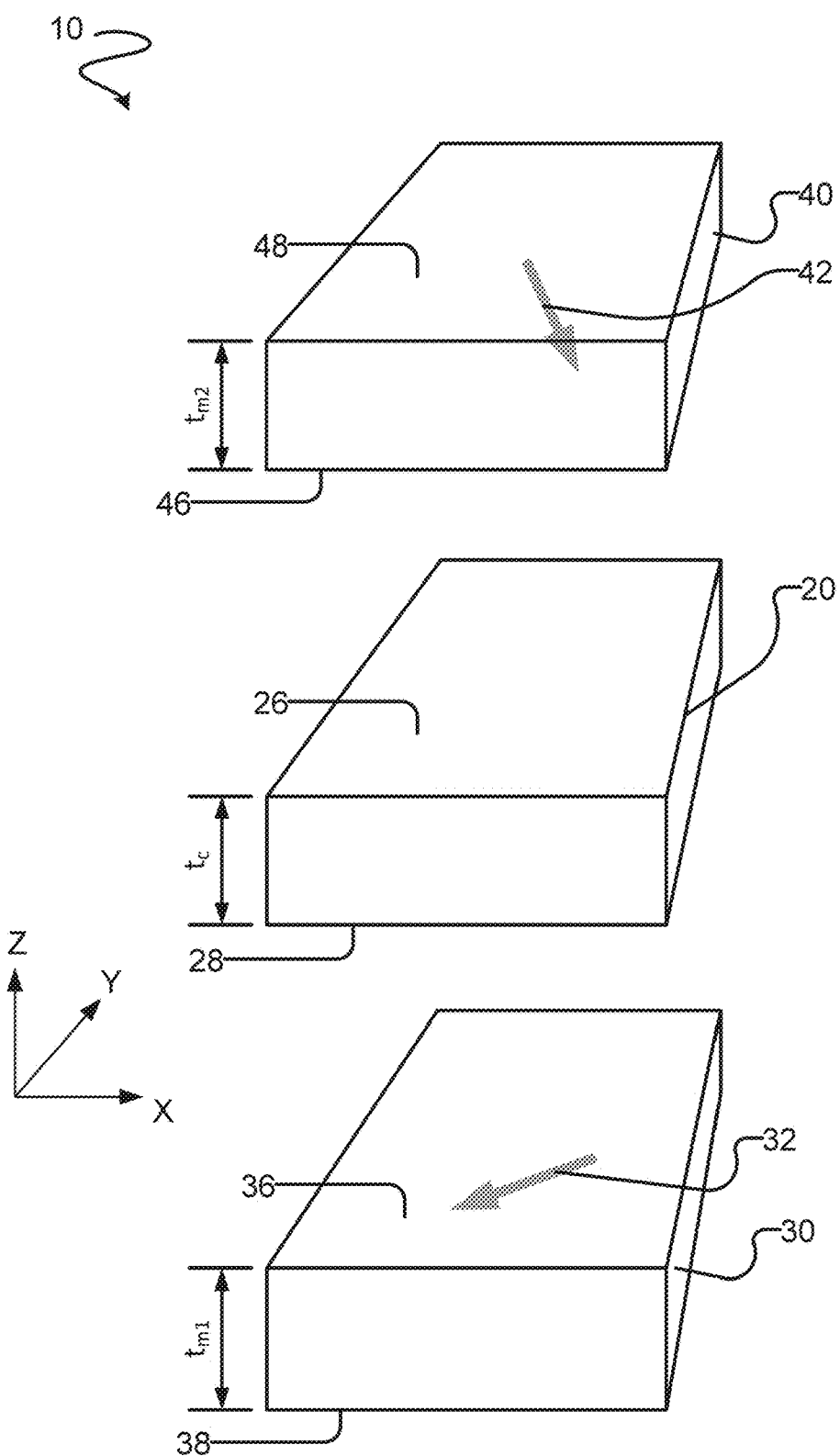
FIG. 2B is an exploded view of the layers of the FIG. 2A structure.

FIGS. 2A and 2B depict a magnetic structure 10 comprising a coupling layer 20 according to one aspect of the invention. Coupling layer 20 of FIG. 2A is interposed between and in contact with both of a first magnetic layer 30 and a second magnetic layer 40, such that first and second magnetic layers 30, 40 are spaced apart from one another in the Z direction (shown in FIGS. 2A and 2B). First magnetic layer 30 has a first magnetization direction (or magnetic moment) 32 and second magnetic layer 40 has a second magnetization direction (or magnetic moment) 42.

First magnetic layer 30 of the illustrated embodiment comprises first and second first magnetic layer surfaces 36, 38 which comprise opposing, generally planar surfaces 36, 38 that each extend in the X and Y directions. Any spatial variation of first and second first magnetic layer surfaces 36, 38 in the Z direction (e.g. due to the surfaces not being perfectly planar or smooth) may be considerably less (e.g. one or more orders of magnitude less) than the X and Y extents of first magnetic layer surfaces 36, 38. First generally planar first magnetic layer surface 36 may be separated from second generally planar first magnetic layer surface 38 by a thickness, $t_{m1}$, in the Z direction. In some embodiments, thickness, $t_{m1}$, is greater than approximately 0.2 nm. In some embodiments, thickness, $t_{m1}$, is greater than approximately 0.3 nm. In some embodiments, thickness, $t_{m1}$, is greater than approximately 0.5 nm. In some embodiments, thickness, $t_{m1}$, is greater than approximately 1.0 nm. In some embodiments, thickness, $t_{m1}$, is greater than approximately 1.5 nm. Thickness, $t_{m1}$, is not necessarily consistent across the entirety of first magnetic layer 30 and may vary due to, for example, imperfections in one or both of first and second first magnetic layer surfaces 36, 38.

Second magnetic layer 40 of the illustrated embodiment comprises first and second second magnetic layer surfaces 46, 48 which comprise opposing, generally planar surfaces 46, 48 that each extend in the X and Y directions. Any spatial variation of first and second first magnetic layer surfaces 46, 48 in the Z direction (e.g. due to the surfaces not being perfectly planar or smooth) may be considerably less (e.g. one or more orders of magnitude less) than the X and Y extents of second magnetic layer surfaces 46, 48. First generally planar second magnetic layer surface 46 may be separated from second generally planar second magnetic layer surface 48 by a thickness, $t_{m2}$, in the Z direction. In some embodiments, thickness, $t_{m2}$, is greater than approximately 0.2 nm. In some embodiments, thickness, $t_{m2}$, is greater than approximately 0.5 nm. In some embodiments, thickness, $t_{m2}$, is greater than approximately 1.0 nm. In some embodiments, thickness, $t_{m2}$, is greater than approximately 1.5 nm. Thickness, $t_{m2}$, is not necessarily consistent across the entirety of second magnetic layer 40 and may vary due to, for example, imperfections in one or both of first and second second magnetic layer surfaces 46, 48.

In some embodiments, first and second magnetization directions 32, 42 are in planes defined by the X and Y directions. This is not mandatory. One or both of first and second magnetization directions 32, 42 could extend in any combination of the X, Y and Z directions.

Coupling layer 20 is interposed between first and second magnetic layers 30, 40. Coupling layer 20 may comprise first and second coupling layer surfaces 26, 28 which may comprise opposing, generally planar surfaces 26, 28 that each extend in the X and Y directions. Any spatial variation of first and second coupling layer surfaces 26, 28 in the Z direction (e.g. due to the surfaces not being perfectly planar or smooth) may be considerably less (e.g. one or more orders of magnitude less) than the X and Y extents of coupling layer surfaces 26, 28. First coupling layer surface 26 may be separated from second coupling layer surface 28 by a thickness, $t_c$, in the Z direction. In some embodiments, thickness, $t_c$, may be between 0.3 nm to 8.0 nm. In some embodiments, thickness, $t_c$, may be between 0.3 nm to 2.5 nm. In some embodiments, thickness, $t_c$, may be between 0.4 nm to 2.0 nm. In some embodiments, thickness, $t_c$, may be between 0.6 nm to 2.0 nm. Thickness, $t_c$, is not necessarily consistent across the entirety of coupling layer 20 and may vary due to, for example, imperfections in one or both of first and second coupling layer surfaces 26, 28.

In some embodiments, first generally planar first magnetic layer surface 36 abuts second generally planar coupling layer surface 28 and/or first generally planar coupling layer surface 26 abuts first generally planar second magnetic layer surface 46. For example, coupling layer 20 may be layered directly adjacent to first magnetic layer 30 and second magnetic layer 40 may be layered directly adjacent to coupling layer 20. In some embodiments, one or more of first magnetic layer 30, second magnetic layer 40 and coupling layer 20 have different X-Y plane dimensions. This is not mandatory. In some embodiments, magnetic layers 30, 40 and/or coupling layer 20 need not have strictly planar surfaces. Layers 30, 40 and/or 20 could conform to the shape of a non-planar substrate. In some embodiments, magnetic layers 30, 40 and/or coupling layer 20 shown in the views of FIGS. 2A and 2B may represent portions of non-illustrated magnetic layers and/or a coupling layer which is/are larger than the portions shown in the FIGS. 2A and 2B illustrations.

First magnetic layer 30 may comprise any suitable magnetic layer. First magnetic layer 30 may exhibit a magnetization direction (magnetic moment) 32. For example, first magnetic layer 30 may comprise a ferromagnetic material such as, for example, one or more elements or alloys selected from a group consisting of Co, Fe, Ni and alloys thereof. First magnetic layer 30 may additionally or alternatively comprise Mn (although Mn is not, strictly speaking, ferromagnetic) and alloys thereof. Notably, in elemental form Co, Ni and Fe have a ferromagnetic spin arrangement while Mn has antiferromagnetic spin arrangement. First magnetic layer 30 may additionally or alternatively comprise, for example, one or more elements or alloys selected from a group consisting of Co, Fe, Ni, and Mn and alloys thereof, and an additive element, said additive element being one or more elements selected from a group consisting of B, C, N, O, F, Mg, Al, Si, P, S, Sc, Ti, V, Cr, Mn, Cu, Zn, Ga, Ge, As, Se, Y, Zr, Nb, Mo, Tc, Ru, Rh, Pd, Ag, Cd, In, Sn, Sb, Te, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi and/or alloys thereof. In some embodiments, first magnetic layer 30 additionally or alternatively comprises one of, for example, RuCo, RuFe, RuNi, RuCoFe, RuFeNi, RuCoNi, RuFeCoNi, FeCoB, FeCoNiSiB, FeCoZr, FeCoRu, CoCr, CoCrB, CoPt, FePt, Gd, Dy, MnAs, MnBi, MnSb, MnBiSi, MnBiSiAl, $CrO_2$, ErO and GdFeCo. In some embodiments, first magnetic layer 30 additionally or alternatively comprises an L10 compound such as, for example, a combination of one or more of Co, Fe, Ni and one or more of Pt and Pd, FePtAg, FePtCu, and FePtCuAg, or an L10 compound with an oxide or carbon. In some embodiments, first magnetic layer 30 additionally or alternatively comprises CoPt. CoRu, CoRh, CoCr with or without an oxide. In some embodiments, first magnetic layer 30 additionally or alternatively comprises one or more Heusler compounds in the form $Co_2ab$, where a is at least one element from the group consisting of Mn, Fe and Cr, and b is at least one element from the group consisting of Si, Ge and Al, In some embodiments, first magnetic layer 30 additionally or alternatively comprises a composite layer made up of a plurality of individual sub-layers, wherein each sub-layer may have the same or a different composition. For example, first magnetic layer 30 may comprise a first sub-layer of FeCoB and a second sub-layer of CoFe. In some embodiments, some sub-layers are non-magnetic layers. For example, a magnetic layer may comprise alternating magnetic and non-magnetic sub-layers. Such a non-magnetic sub-layer could comprise, for example, coupling layer 20. In some embodiments, the material of first magnetic layer 30 is chosen based at least in part on the material of coupling layer 20. For example, magnetic layer 30 may be chosen to allow inter-diffusion between magnetic layer 30 and coupling layer 20.

Second magnetic layer 40 may comprise any suitable magnetic layer, and may be fabricated to exhibit any of the properties and/or characteristics and/or may comprise the same materials as discussed herein for first magnetic layer 30. Second magnetic layer 40 may have a magnetization direction (magnetic moment) 42. In some embodiments, second magnetic layer 40 is substantially similar to first magnetic layer 30. In other embodiments, second magnetic layer 40 is different than first magnetic layer 30. For example, first and second magnetic layers 30, 40 may differ in composition to thereby induce different structural and/or magnetic properties such as, but not limited to, structure, saturation magnetization, anisotropy, cure temperature, exchange stiffness, and/or damping. First and second magnetic layers 30, 40 may also differ in size and/or shape. For example, $t_{m1}$ may be different than $t_{m2}$ or the X and/or Y dimensions of first magnetic layer 30 may be different from those of coupling layer 20 and/or second magnetic layer 40.

Coupling layer 20 may comprise at least one first group element 22 and at least one second group element 24. The second group element 24 may be referred to herein as a dopant. The first group elements 22 may comprise non-magnetic elements while the second group elements 24 may comprise magnetic elements. Consequently, the first group elements 22 may also be referred to herein as the non-magnetic group elements 22 and the second group elements 24 may be referred to herein as the magnetic group elements 24. The at least one first (non-magnetic) group element 22 may comprise or be selected from the group consisting of Ag, Cr, Ru, Mo, Ir, Rh, Cu, V, Nb, W, Ta, Ti, Re, Os, Au, Al and Si.

Each element in this group of non-magnetic elements is known to exhibit at least some antiferromagnetic coupling when the element is used alone (purely or almost purely) as a coupling layer between a pair of magnetic layers and, consequently, the inventors have strong reason to believe that each of the elements in this group can exhibit strong antiferromagnetic coupling or non-collinear coupling when suitably doped with at least one second (magnetic) group element 22 as discussed herein.

In some currently preferred embodiments, the at least one first (non-magnetic) group element may comprise or be selected from the sub-group consisting of Cr, Ru, Rh, Re, Ir. Each of the non-magnetic elements in this sub-group is known to exhibit particularly strong antiferromagnetic coupling when the element is used alone (purely or almost purely) as a coupling layer between a pair of magnetic layers and, consequently, the inventors have strong reason to believe that each of the elements in this sub-group can exhibit strong antiferromagnetic coupling or non-collinear coupling when suitably doped with at least one second (magnetic) group element 22 as discussed herein. In some currently preferred embodiments, the at least one first (non-magnetic) group element may comprise or be selected from the further sub-group consisting of Ru, Ir, and Rh. As with the previous sub-group, each of the non-magnetic elements in this further sub-group is known to exhibit even greater antiferromagnetic coupling when the element is used alone (purely or almost purely) as a coupling layer between a pair of magnetic layers and, consequently, the inventors have strong reason to believe that each of the elements in this further sub-group can exhibit strong antiferromagnetic coupling or non-collinear coupling when suitably doped with at least one second (magnetic) group element 22 as discussed herein.

In some currently preferred embodiments, the at least one first (non-magnetic) group element comprises or consists of Ru.

The at least one second (magnetic) group element 24 may comprise or be selected from the group consisting of ferromagnetic elements Ni, Co and Fe. The at least one second (magnetic) group element 24 may additionally or alternatively comprise or be selected from the group consisting of magnetic elements Mn, Ni, Co and Fe. In some embodiments, the at least one second (magnetic) group element 24 may additionally comprise a polarizable element selected from the group of Pd and Pt. Such polarizable elements could, in some embodiments, be substituted for a portion of the second (magnetic) group elements 24. In some embodiments, Pd or Pt may be substituted one atom for every atom of second group (magnetic) element 24 although this is not mandatory. In some embodiments, up to 90% of the second (magnetic) group elements 24 may be substituted by Pd or Pt or a combination of Pd and Pt. In some embodiments, Mn may be substituted for a portion of second (magnetic) group elements 24. Notably, in elemental form Co, Ni and Fe have a ferromagnetic spin arrangement while Mn has antiferromagnetic spin arrangement. Consequently, as used herein Mn may be referred to herein as a magnetic element, magnetic atom or magnetic material where it is sought to include Mn with ferromagnetic elements Co, Ni and Fe, but ferromagnetic elements should be considered to exclude Mn.

The atomic concentration ratio of the at least one first (non-magnetic) group element 22 to the at least one second (magnetic) group element 24 within coupling layer 20 may be (100−x):x, where x>0. It should be understood that the atomic concentration ratio of the at least one first (non-magnetic) group element 22 to the at least one second (magnetic) group element 24 within coupling layer 20 is an aggregate atomic concentration ratio that accounts for the composition of the entire coupling layer 20. Coupling layer 20 may be relatively homogenous throughout, such that the atomic concentration ratio is generally consistent throughout coupling layer 20 or coupling layer 20 may include regions or portions in which the atomic concentration ratio is higher or lower than the aggregate atomic concentration ratio. For example, coupling layer 20 may be fabricated in sub-layers, each sub-layer having an individual atomic concentration ratio of the at least one first (non-magnetic) group element 22 to the at least one second (magnetic) group element 24 wherein the aggregate of the individual atomic concentration ratios (over coupling layer 20) is (100−x):x, where x>0.

The at least one first (non-magnetic) group element 22 and the at least one second (magnetic) group element 24 and/or the atomic concentration parameter x in the atomic concentration ratio of the at least one first (non-magnetic) group element 22 to the at least one second (magnetic) group element 24 ((100−x):x, where x>0) may be chosen such that first and second magnetization directions 32, 42 of first and second magnetic layers 30, 40 are coupled at a non-collinear angle φ with respect to one another in the absence of an externally applied magnetic field—in which case structure 10, its magnetic layers 30, 40 and/or its magnetization directions 32, 42 may be said to be non-collinearly coupled. The at least one first (non-magnetic) group element 22 and the at least one second (magnetic) group element 24 and/or the atomic concentration parameter x in the atomic concentration ratio of the at least one first (non-magnetic) group element 22 to the at least one second (magnetic) group element 24 ((100−x):x, where x>0) may be chosen such that first and second magnetization directions 32, 42 of first and second magnetic layers 30, 40 are coupled at a non-orthogonal and non-collinear angle φ with respect to one another in the absence of an externally applied magnetic field—in which case structure 10, its magnetic layers 30, 40 and/or its magnetization directions 32, 42 may be said to be non-orthogonally and non-collinearly coupled. As discussed in further detail herein, the at least one first (non-magnetic) group element 22, the at least one second (magnetic) group element 24 and/or the atomic concentration parameter x may be chosen such that the biquadratic magnetic coupling strength $J_2$ of coupling layer 20 is greater than or equal to half of the absolute value of the bilinear magnetic coupling strength $J_1$ of coupling layer 20. In some embodiments, the coupling layer thickness $t_c$ may also be chosen to create non-collinear and/or non-orthogonal/non-collinear coupling between magnetic layers 30, 40 of structure 10.

The at least one first (non-magnetic) group element 22, the at least one second (magnetic) group element 24, the thickness of coupling layer 20 ($t_c$) and/or the atomic concentration parameter x may be chosen based at least in part on the composition of first and second magnetic layers 30, 40. The at least one first (non-magnetic) group element 22, the at least one second (magnetic) group element 24, the thickness of coupling layer 20 ($t_c$) and/or the atomic concentration parameter x may be chosen based at least in part on the thickness of one or both of first and second magnetic layers 30, 40 (e.g. $t_{m1}$, $t_{m2}$). The at least one first (non-magnetic) group element 22, the at least one second (magnetic) group element 24, the thickness of coupling layer 20 ($t_c$) and/or the atomic concentration parameter x may be chosen such that the saturation field of structure 10 is greater than 1,000 Oe, 3,000 Oe, 20,000 Oe or 50,000 Oe. Such high saturation field structures may be non-collinearly coupled, non-orthogonally and non-collinearly coupled or antiferromagnetically coupled. The at least one first (non-magnetic) group element 22, the at least one second (magnetic) group element 24, the thickness of coupling layer 20 ($t_c$) and/or the atomic concentration parameter x may be chosen such that the biquadratic coupling strength, $J_2$, of structure 10 is greater than $0.1mJ/m^2$, $0.2mJ/m^2$, $0.5mJ/m^2$, $1.0mJ/m^2$, $1.5mJ/m^2$, or even $2.0mJ/m^2$ and $J_2$ is greater than half of the absolute value of $J_1$. Such high coupling strength structures may be non-collinearly coupled, non-orthogonally and non-collinearly coupled or antiferromagnetically coupled. The at least one first (non-magnetic) group element 22, the at least one second (magnetic) group element 24, the thickness of coupling layer 20 ($t_c$) and/or the atomic concentration parameter x may be chosen such that magnetic structure 10 may withstand annealing at a temperature of 100° C. or higher, 150° C. or higher, or 200° C. or higher without undesirably changing the coupling angle of first and second magnetic layers, 30, 40. Such annealable structures may be non-collinearly coupled, non-orthogonally and non-collinearly coupled or antiferromagnetically coupled. In some embodiments, it may be desirable for the coupling angle of first and second magnetic layers 30, 40 to change with annealing and the at least one first (non-magnetic) group element 22, the at least one second (magnetic) group element 24, the thickness of coupling layer 20 ($t_c$) and/or the atomic concentration parameter x may be chosen such that the coupling angle may be controllably changed as desired by annealing at a temperature of 100° C. or higher, 150° C. or higher or 200° C. or higher.

In some embodiments, coupling layer 20 may comprise at least one first group element 22 and at least two second group elements 24. The first group elements 22 may comprise non-magnetic elements while the second group elements 24 may comprise magnetic elements. The at least one first (non-magnetic) group element 22 may comprise or be selected from the group consisting of Ag, Cr, Ru, Mo, Ir, Rh, Cu, V, Nb, W, Ta, Ti, Re, Os, Au, Al and Si. In currently preferred embodiments, the at least one first (non-magnetic) group element may comprise or be selected from the group consisting of Ru, Ir, Re, Rh, and Cr. In some currently preferred embodiments, the at least one first (non-magnetic) group element comprises or consists of Ru. In currently preferred embodiments, the at least two second (magnetic) group elements comprise Co and Fe.

The atomic concentration ratio of the first magnetic group element (e.g. Co) to the second magnetic group element (e.g. Fe) may be any suitable ratio. As the ratio of the first magnetic group element to the second magnetic group element increases, coupling layer 20 may behave more like a coupling layer of the nonmagnetic element 24 (e.g. Ru) and the first magnetic group element (e.g. Co) while as the ratio of the first magnetic group element to the second magnetic group element decreases, coupling layer 20 may behave more like a coupling layer of the nonmagnetic element 24 (e.g. Ru) and the second magnetic group element (e.g. Fe). In other words, in the case of a RuFeCo coupling layer 20, as the ratio of Co to Fe increases, coupling layer 20 may behave more like a RuCo coupling layer 20 and as the ratio of Co to Fe decreases, coupling layer 20 may behave more like a RuFe coupling layer 20. The properties of a coupling layer 20 that comprises at least one first group element 22 and at least two magnetic group elements 24 may therefore be estimated or predicted by observing the properties of two coupling layers 20 each having only one of the at least two magnetic group elements 24 in combination with the at least on first group element 22 and based on the ratio of the first magnetic group element to the second magnetic group element.

In some embodiments, coupling layer 20 may comprise at least two first group elements 22 and at least one second group element 24. The at least two first group elements 22 may comprise Ru and at least one second non-magnetic element comprising or selected from the group consisting of: Ag, Cr, Mo, Ir, Rh, Cu, V, Nb, W, Ta, Ti, Re, Os, Au, Al and Si. The at least one second group element 24 may comprise at least one magnetic element comprising or selected from the group consisting of: Ni, Co and Fe. The atomic ratio of the at least one first non-magnetic element to the at least one second non-magnetic element to the at least one magnetic element is (100−x−y):y:x. In some embodiments, y is less than 80. In some embodiments, the at least one second non-magnetic element is selected from the group consisting of Ru, Ir, Re, Rh, and Cr.

In some embodiments, the at least one first (non-magnetic) group element 22 and the at least one second (magnetic) group element 24 and/or the atomic concentration parameter x in the atomic concentration ratio of the at least one first (non-magnetic) group element 22 to the at least one second (magnetic) group element 24 ((100−x):x, where x>0) may be chosen such that first and second magnetization directions 32, 42 of first and second magnetic layers 30, 40 are coupled at an antiferromagnetic angle with respect to one another in the absence of an externally applied magnetic field—in which case structure 10, its magnetic layers 30, 40 and/or its magnetization directions 32, 42 may be said to be antiferromagnetically coupled. For example, antiferromagnetic angles may be: greater than 170° and less than 190° or greater than 175° and less than 185°; greater than 178° and less than 182°; greater than 179° and less than 181°; greater than 179.5° and less than 180.5°; or even 180°.

The at least one first (non-magnetic) group element 22, the at least one second (magnetic) group element 24, the thickness of coupling layer 20 ($t_c$) and/or the atomic concentration parameter x may be chosen based at least in part on the composition of first and second magnetic layers 30, 40. The at least one first (non-magnetic) group element 22, the at least one second (magnetic) group element 24, the thickness of coupling layer 20 ($t_c$) and/or the atomic concentration parameter x may be chosen based at least in part on the thickness of one or both of first and second magnetic layers 30, 40 (e.g. $t_{m1}$, $t_{m2}$). The at least one first (non-magnetic) group element 22, the at least one second (magnetic) group element 24, the thickness of coupling layer 20 ($t_c$) and/or the atomic concentration parameter x may be chosen such that the saturation field of structure 10 is greater than 1,000 Oe, 3,000 Oe, 20,000 Oe or 50,000 Oe. The at least one first (non-magnetic) group element 22, the at least one second (magnetic) group element 24, the thickness of coupling layer 20 ($t_c$) and/or the atomic concentration parameter x may be chosen such that the bilinear coupling strength, $J_1$ is greater than $0.3mJ/m^2$, $0.6mJ/m^2$ $0.8mJ/m^2$ and/or the biquadratic coupling strength, $J_2$, of structure 10 is greater than $0.1mJ/m^2$, $0.2mJ/m^2$, $0.5mJ/m^2$, $1.0mJ/m^2$, $1.5mJ/m^2$, or even $2.0mJ/m^2$ and $J_2$ is greater less than half of the absolute value of $J_1$. The at least one first (non-magnetic) group element 22, the at least one second (magnetic) group element 24, the thickness of coupling layer 20 ($t_c$) and/or the atomic concentration parameter x may be chosen such that magnetic structure 10 may withstand annealing at a temperature of 100° C. or higher, 150° C. or higher, or 200° C. or higher without undesirably changing the coupling angle of first and second magnetic layers, 30, 40. In some embodiments, it may be desirable for the coupling angle of first and second magnetic layers 30, 40 to change with annealing and the at least one first (non-magnetic) group element 22, the at least one second (magnetic) group element 24, the thickness of coupling layer 20 ($t_c$) and/or the atomic concentration parameter x may be chosen such that the coupling angle may be controllably changed as desired by annealing at a temperature of 100° C. or higher, 150° C. or higher or 200° C. or higher.

In some currently preferred embodiments, the at least one first (non-magnetic) group element 22 comprises Ru or alloys thereof and the at least one second (magnetic) group element 24 comprises Fe or alloys thereof. In some currently preferred embodiments, the at least one first (non-magnetic) group element 22 comprises one or more of Cr, Ir, Rh and Re or alloys thereof and the at least one second (magnetic) group element 24 comprises one or more of Fe, Ni and Co or alloys thereof. In some embodiments, the at least one first (non-magnetic) element 22 comprises Ru and at least one second non-magnetic element selected from the group consisting of: Ag, Cr, Mo, Ir, Rh, Cu, V, Nb, W, Ta, Ti, Re, Os, Au, Al and Si and the at least one magnetic element comprises or is selected from the group consisting of: Ni, Co and Fe. In some embodiments, first and second magnetic layers 30, 40 comprise at least one of Co, Ni or alloys thereof. In some embodiments, the at least one second (magnetic) group element 24 may additionally comprise a polarizable element selected from the group of Pd and Pt. Such polarizable elements could, in some embodiments, be substituted for a portion of the second (magnetic) group elements 24. In some embodiments, Pd or Pt may be substituted one atom for every atom of second group (magnetic) element 24 although this is not mandatory. In some embodiments, up to 90% of the second (magnetic) group elements 24 may be substituted by Pd or Pt or a combination of Pd and Pt. In some embodiments, Mn may be substituted for a portion of second (magnetic) group elements 24.

Figure 3A:
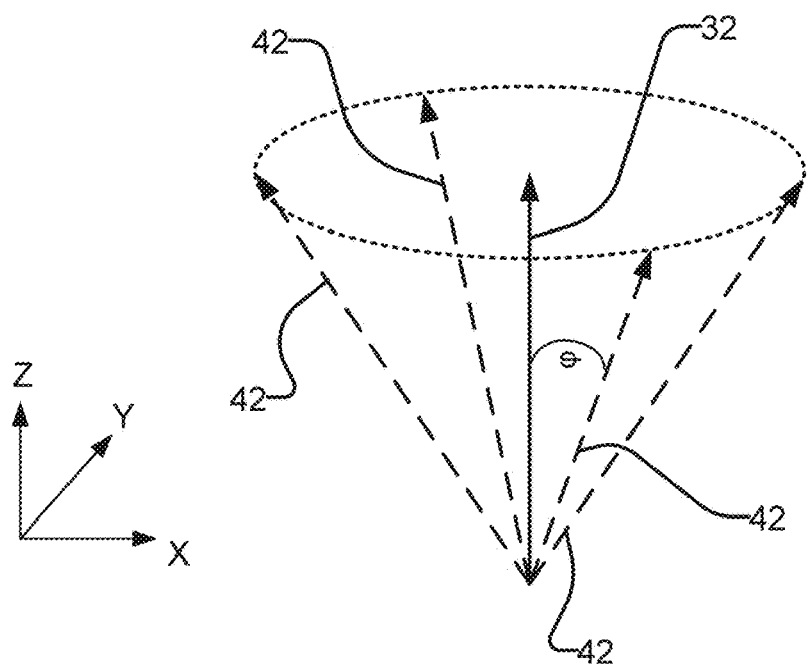
FIG. 3A schematically depicts a first magnetization direction and a number of exemplary non-collinearly coupled second magnetization directions from among the infinite number of possible non-collinearly coupled second magnetization directions which could be implemented using the FIG. 2A structure.

In general, first and second magnetization directions 32, 42 may point in any direction in space and may not be limited to any particular plane(s). It follows that for a given first magnetization direction 32, second magnetization direction 42 may point in an infinite number of directions while first and second magnetization directions 32, 43 are non-collinearly coupled to one another. This description may use the symbol φ to refer to the angle φ between first and second magnetization directions 32, 42. FIG. 3A schematically depicts a first magnetization direction 32 and a number of exemplary non-collinearly coupled second magnetization directions 42 from among the infinite number of possible non-collinearly coupled second magnetization directions 42 which could be implemented in structure 10. The scenario depicted in FIG. 3A is expected in the case of a magnetic layer and/or magnetic structure having an XY-plane cross-section with similar dimensions in the X and Y directions (such as in the case of a device having a generally circular cross-section).

In some embodiments, one of the X or Y direction dimensions of a magnetic layer and/or a magnetic structure is elongated (e.g. is substantially greater than the other direction, such as, for example, 1.5 times greater, double, 10 times greater or even more). Where the XY-plane cross-section of a magnetic layer and/or a magnetic structure is elongated in one of the X or the Y directions, the magnetization direction of that magnetic layer will tend to remain in or be practically limited to the XZ-plane or the YZ-plane respectively. Therefore, by employing an elongated XY-plane cross-section, it may be possible to reduce the number of pinning layers (or otherwise simplify the pinning mechanism) for achieving a desired orientation of a magnetization direction in such embodiments, compared to embodiments having non-elongated X-Y plane cross-sections.

In addition to limiting the magnetization direction of a magnetic layer, elongation of one of the X (or Y) dimensions relative to the other in the XY-plane may be employed to control movement of a magnetization direction and/or the path of a magnetization direction between its stable states. Elongation in the XY-plane may be employed to achieve a desired time, current, field, and/or energy for switching a magnetization direction between its stable states. For example, if a magnetic layer is elongated in the X direction, rotation of a magnetization direction oriented in the negative X direction to the positive X direction may require less time, current, applied field, and/or energy than if the magnetic layer is not elongated in the X direction.

Figure 3B:
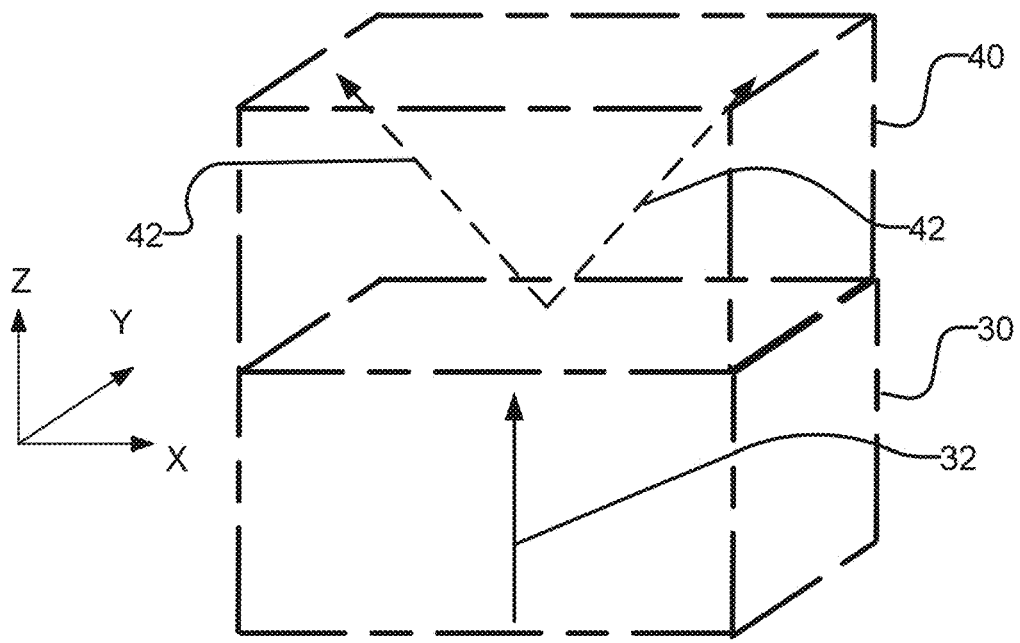
FIG. 3B schematically depicts first and second non-collinearly coupled magnetization layers and their respective magnetization directions according to a particular embodiment.

For example, FIG. 3B depicts a magnetic structure first magnetic layer 30 having a first magnetization direction 32 and a second magnetic layer 40 having a second magnetization direction 42 where the first and second magnetic layers 30, 40 have XY-plane cross-sections that are elongated in the X direction. As can be seen from FIG. 3B, second magnetization direction 42, is limited to extending in the XZ-plane and has no (or minimal) Y direction component. Accordingly, to maintain the non-collinear coupling angle between first and second magnetization directions 32, 42, second magnetization direction 42 is generally expected to exist in two possible positions or states, extending in the positive Z direction and positive X direction or extending in the positive Z direction and negative X direction, as shown in FIG. 3B. As used herein, a state of a magnetic layer should be understood to refer to a state of the magnetization direction of the magnetic layer, unless the context dictates otherwise. Therefore, it may be possible to increase the probability of a second magnetic layer 40 having a second magnetization direction 42, when non-collinearly coupled to a first magnetic layer 30 having a first magnetization direction 32, to orient in specific limited directions by tailoring the XY-plane cross section of second magnetic layer 40. In particular, by elongating the XY-plane cross-section of a magnetic layer and/or a magnetic structure in the X direction, the magnetization direction of that magnetic layer will tend to have a magnetization direction with a minimal or even zero Y direction component.

First magnetization direction 32 may be coupled to second magnetization direction 42 due to the presence of coupling layer 20. The strength or energy of the coupling between magnetic moments 32, 42 of first magnetic layer 30 and second magnetic layer 40 across coupling layer 20 in magnetic structure 10 may be characterized using a bilinear coupling strength parameter, $J_1$ and biquadratic coupling strength parameter, $J_2$. Magnetic structure 10 can be characterized or modelled by a bilinear coupling strength term of the form $E_1 = \pm J_1 n_1 \cdot n_2$ where $J_1$ is the bilinear coupling constant in mJ/m$^2$ and $n_1$ and $n_2$ are unit vectors along magnetization directions 32, 42 in first magnetic layer 30 and second magnetic layer 40 respectively. $E_1$ is related to the angle of coupling between first and second magnetization directions 32, 42 as follows: $E_1 = \pm J_1 \cos(\varphi)$, where $\varphi$ is the angle of coupling between first and second magnetization directions 32, 42. Magnetic structure 10 can also be characterized or modelled by biquadratic coupling strength (biquadratic energy density) term of the form $E_2 = \pm J_2 (n_1 \cdot n_2)^2$ where $J_2$ is the biquadratic coupling constant in mJ/m$^2$. $E_2$ is related to the angle of coupling between first and second magnetization directions 32, 42 as follows: $E_2 = \pm J_2 \cos^2(\varphi)$, where $\varphi$ is the angle of coupling between first and second magnetization directions 32, 42.

$J_1$ and $J_2$ represent parameters of a model which relates the dependence of total magnetization of structure 10 in the direction of an externally applied magnetic field to a strength of the externally applied magnetic field. The $J_1$ and $J_2$ parameters of structure 10 may be experimentally ascertained by applying external magnetic field to structure 10, measuring the magnetization and selecting $J_1$ and $J_2$ to best fit the model to the experimental results. The model may assume magnetic moments 32, 42 in first magnetic layer 30 and second magnetic layer 40 are parallel to the film plane (i.e. in a direction that is a linear combination of the X and Y directions shown in FIG. 2A). The model may further assume that both first magnetic layer 30 and second magnetic layer 40 consist of one or more magnetic sublayers interacting through the direct exchange interaction as proposed by C. Eyrich at. el., PHYSICAL REVIEW B, 90, 235408 (2014), which is hereby incorporated herein by reference.

Without being bound by theory, it is believed that antiferromagnetic, ferromagnetic and non-collinear coupling are dependent on the relationships between bilinear, $J_1$, biquadratic, $J_2$, and higher order coupling parameters. For example, it is believed that if the bilinear coupling parameter, $J_1$, dominates the other coupling parameter (e.g. the absolute value of $J_1$ is greater than half of the sum of the absolute values of the other coupling parameters) and $J_1$ is less than zero, the resulting coupling is ferromagnetic. It is also believed that if the bilinear coupling parameter, $J_1$, dominates the other coupling parameter (e.g. the absolute value of $J_1$ is greater than half of the sum of the absolute values of the other coupling parameters) and $J_1$ is greater than zero, the resulting coupling is antiferromagnetic. It is further believed that if the biquadratic coupling parameter, $J_2$, dominates (e.g. is greater than half of the sum of the other coupling parameters) and $J_1$ is small, the magnetic moments 32, 42 of first magnetic layer 30 and second magnetic layer 40 may be aligned at a non-collinear angle $\varphi$ between approximately 80° to 100°, in some embodiments, at 90°, or, in some embodiments, substantially near 90°. Further, it is believed that a mixture of the bilinear and biquadratic parameters, $J_1$, $J_2$, can result in non-collinear coupling such that the magnetic moments 32, 42 of first magnetic layer 30 and second magnetic layer 40 are aligned at a non-collinear angle $\varphi$ which may, in some embodiments, be greater than 0° and less than 180°, in some embodiments, between 1° and 179°, in some embodiments, between 5° and 175° or, in some embodiments, between 20° and 160°.

Without being bound by theory, it is believed that non-collinear coupling angle $\varphi$ is controlled by the bilinear, $J_1$, and biquadratic, $J_2$, coupling parameters and that non-collinear coupling angle $\varphi$ may be determined by minimizing the $E_{coupling}$ according to the following equation:

$$E_{coupling} = J_1 \cos \varphi + J_2 \cos^2 \varphi \quad (1)$$

Figure 4:
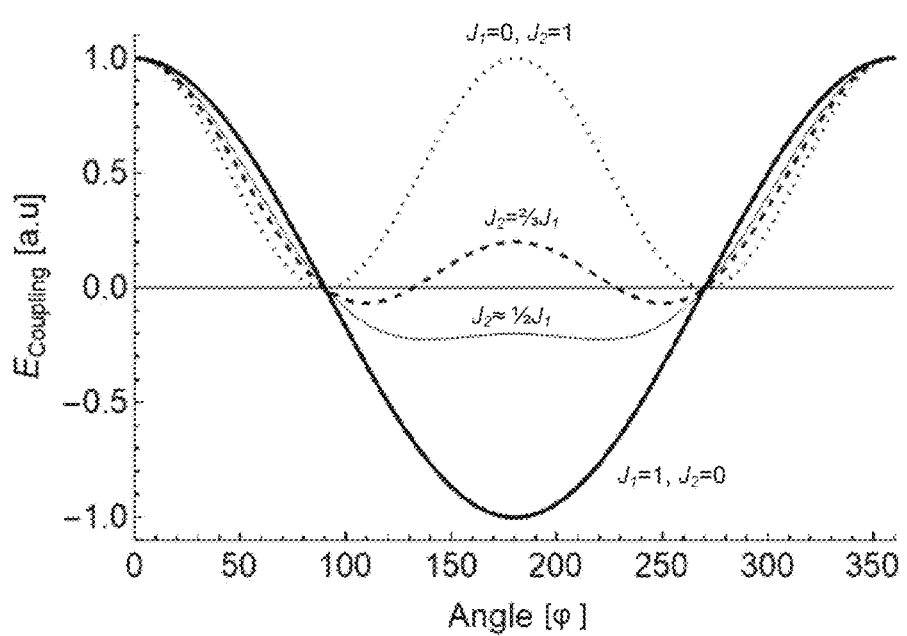
FIG. 4 depicts a plot of the equation (1) coupling energy versus angle φ with a number of different relationships of the magnitudes of the bilinear and biquadratic coupling strength parameters $J_1$ to $J_2$.

The bilinear coupling parameter, $J_1$, can either be positive or negative, and the biquadratic, $J_2$, coupling parameter has a positive value. Both parameters vary in magnitude/strength. FIG. 4 depicts a plot of the equation (1) coupling energy versus angle $\varphi$ with four different relationships of the magnitudes of $J_1$ to $J_2$. The thick solid line represents the case in which $J_1=1$, $J_2=0$, the thin solid line represents the case in which $J_2$ is just greater than $$J_2 = \frac{1}{2} |J_1|,$$

the dotted line represents the case in which $J_1=0$, $J_2=1$, and the dashed line represents the case in which $$J_2 = \frac{2}{3} |J_1|.$$

As can be seen from FIG. 4, for the thick solid line representing $J_1=1$, $J_2=0$, the coupling energy minimum is at approximately $\varphi=180°$ (i.e. antiferromagnetic coupling between magnetization directions 32, 42) because there is no $J_2$ component which might tend to cause non-collinear coupling. If $J_2$ is increased to just greater than half of $J_1$ (as represented by the thin solid line in FIG. 4), non-collinear coupling may occur with coupling angles approximately or substantially near to $\varphi=140°$ and $\varphi=220°$. However $\varphi=180°$ coupling (i.e. antiferromagnetic coupling) may still occur at $$J_2 = \frac{1}{2} |J_1|. J_2 = \frac{1}{2} |J_1|$$

may therefore be seen as an approximate threshold between antiferromagnetic coupling and non-collinear coupling. If $J_2$ is increased past this threshold of $$J_2 = \frac{1}{2} |J_1|$$

such that $$J_2 > \frac{1}{2} |J_1|,$$

then non-collinear coupling will occur while antiferromagnetic coupling does not.

If $J_2$ is further increased such that $$J_2 = \frac{2}{3}|J_1|$$

(as represented by the dashed line in FIG. 4), non-collinear coupling may occur with coupling angles approximately or substantially near to φ=110° and φ=250°. For a coupling layer where $J_1=0$, $J_2=1$, as represented by the dotted line in FIG. 4, the non-collinear coupling angle φ is only determined by $J_2$ and so the energy minima are at substantially near to φ=90° and φ=270°. If $J_1$ is negative (not depicted), the energy minima may occur at approximately or substantially near to φ=0° and φ=360° and as $J_1$ approaches zero from below zero, the energy minima may move toward φ=90°.

Figure 5:
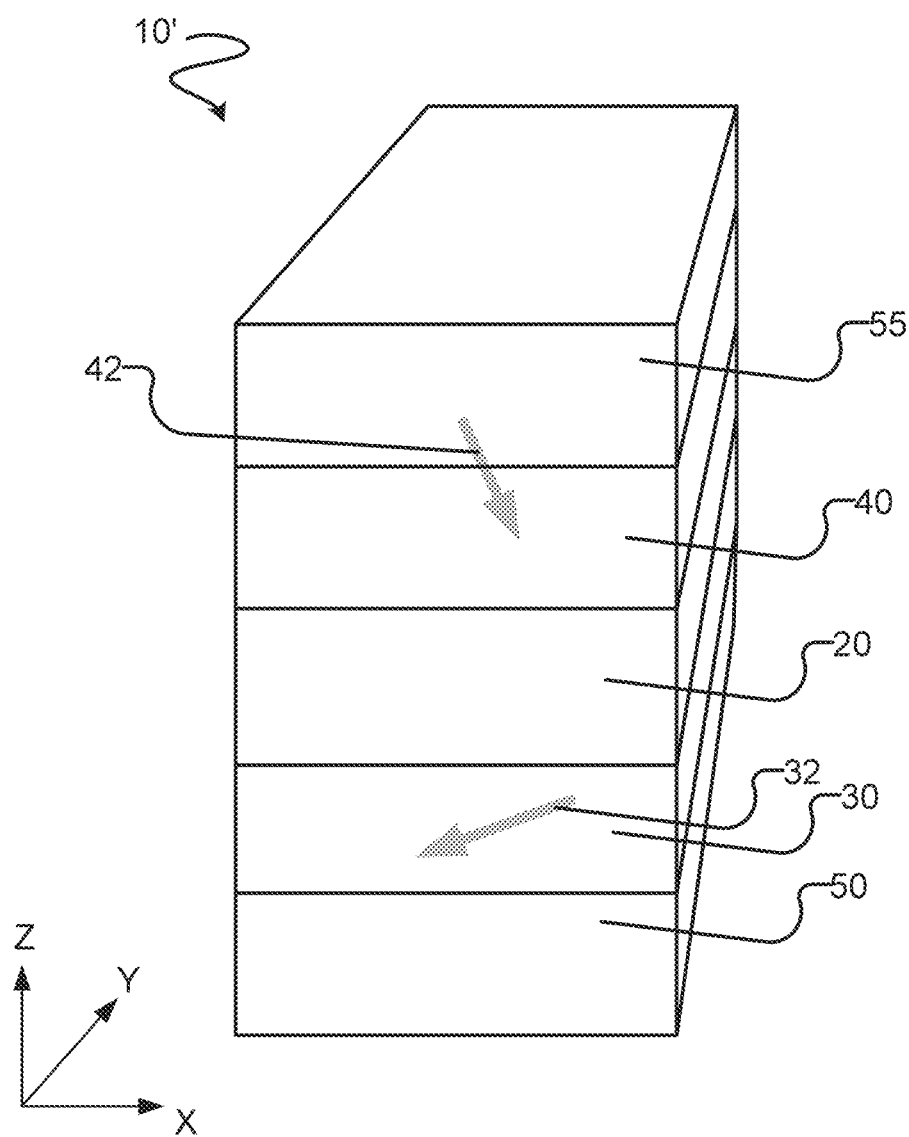
FIG. 5 depicts a magnetic structure layered on a seed layer according to a particular embodiment.

In some embodiments, a magnetic structure (such as magnetic structure 10) may be fabricated by layering on top of a seed layer (also referred to herein as an underlayer). For example, FIG. 5 depicts a magnetic structure 10', substantially similar to magnetic structure 10, layered on a seed layer 50. Seed layer 50 may comprise any suitable seed layer, as is known in the art. In some embodiments, seed layer 50 may comprise at least one element selected from the group comprising or consisting of B, C, Si, Ge, Al, Ti, V, Cr, Mn, Fe, Co, Ni, Cu, Zr, Nb, Mo, Ru, Rh, Pd, Ag, Hf, Ta, W, Re, Ir, Pt, and Au. In some embodiments, seed layer 50 may comprise a first sub-layer comprising at least one element comprising or selected from the group consisting of: B, Si, Ge, Al, Ti, V, Cr, Mn, Fe, Co, Ni, Cu, Zr, Nb, Mo, Ru, Rh, Pd, Ag, Hf, Ta, W, Re, Ir, Pt, and Au and a second layer comprising at least one element comprising or selected from the group consisting of N, and O.

Seed layer 50 may be used in the fabrication of magnetic structure 10' for one or more of the following reasons: to ease fabrication or for protection of first magnetic layer 30, to set a growth of magnetic layer 30 along a preferred crystallographic orientation, to serve as an electrical contact, to serve as a protective layer, to maximize the surface anisotropy at the interface between seed layer 50 and first magnetic layer 30, and/or to control thermal conductivity.

In some embodiments, a protective layer may be layered on second magnetic layer 40. In the FIG. 5 embodiment, protective layer 55 is layered on second magnetic layer 40 to protect second magnetic layer 40 from, for example, oxidation, corrosion, physical wear etc. Protective layer 55 may serve as an electrical contact or part of an electrical contact. Protective layer 55 may comprise any suitable material. For example, protective layer 55 may comprise at least one element comprising or selected from the group consisting of Al, Ti, V, Cr, Mn, Fe, Co, Ni, Cu, Zr, Nb, Mo, Ru, Rh, Pd, Ag, Hf, Ta, W, Re, Ir, Pt, and Au. In some embodiments, protective layer 55 may additionally or alternatively comprise nitrides such Si—N, Ti—N or oxides such as Ti—O, Al—O, Si—O.

But for seed layer 50 and protective layer 55, magnetic layers 30, 40 and coupling layer 20 of magnetic structure 10' may be substantially similar to magnetic structure 10 and may comprise any of the features of magnetic structure 10 described herein. Likewise, magnetic structure 10 may be fabricated to comprise a seed layer 50 and/or a protective layer 55.

Fabrication

Magnetic structure 10 may be fabricated using any suitable technique. In some embodiments, structure 10 is fabricated by, for example, physical vapor deposition (e.g. sputtering), atomic layer deposition, or chemical vapor deposition. In some embodiments, magnetic structure 10 may be fabricated using sputtering, whereby particles are ejected from a solid target material due to bombardment of the target by energetic particles such as gas ions, as is known in the art.

Figure 6B:
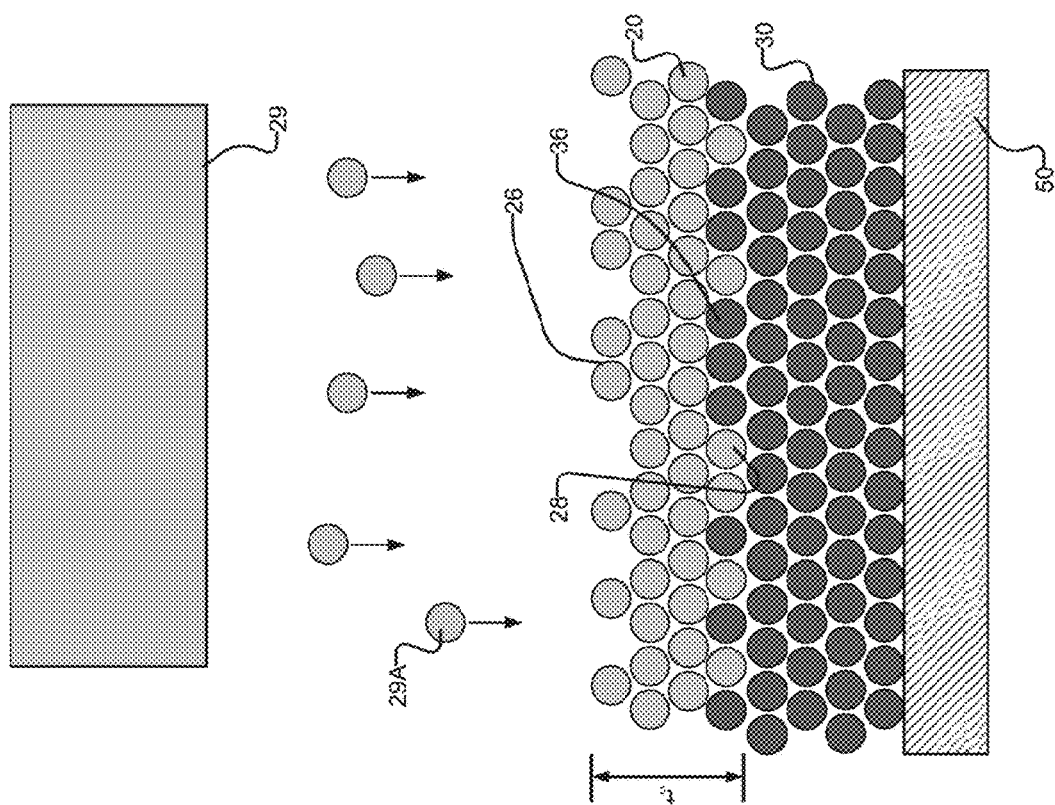
FIGS. 6A, 6B and 6C (collectively, FIG. 6) depict the steps in method for fabricating the FIG. 2A structure according to a particular embodiment.
Figure 6A:
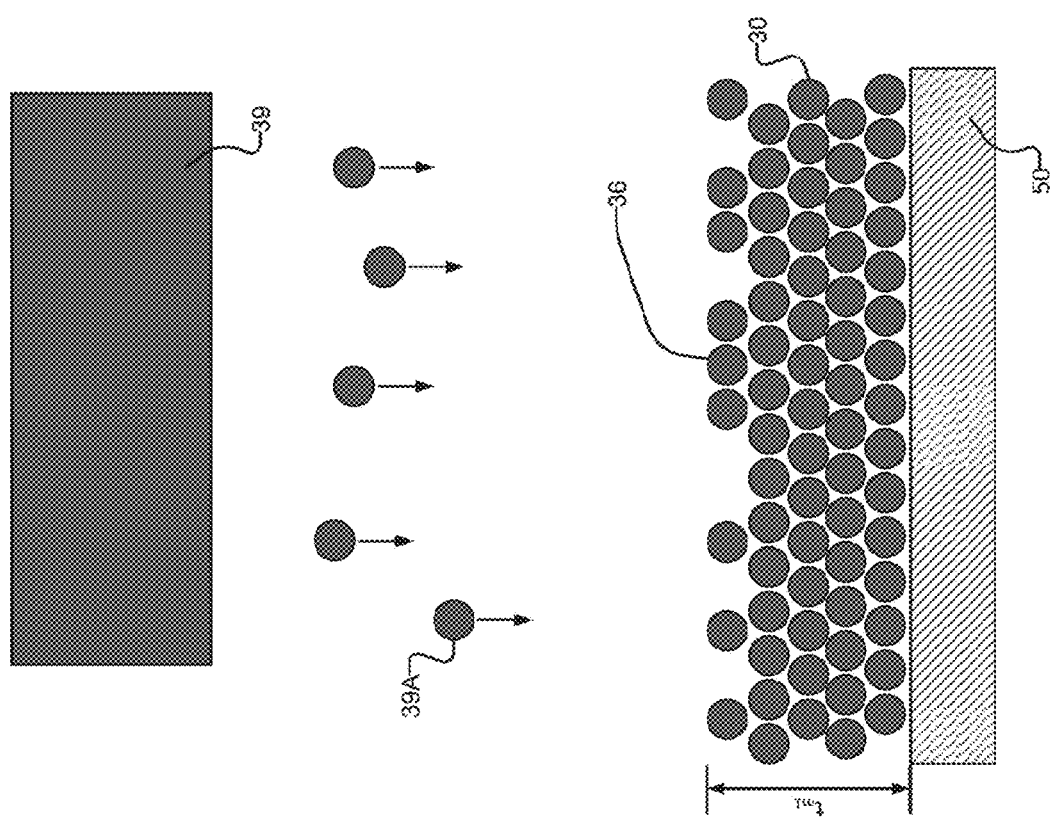

One aspect of the invention provides a method for fabricating a magnetic structure (e.g. magnetic structure 10). FIG. 6A depicts a first step of layering a first magnetic layer 30 on a seed layer (also referred to as an underlayer or substrate) 50. This first step may be accomplished by sputtering, such as is depicted in FIG. 6A. For example, a target 39 of the same material as is desired for first magnetic layer 30 may be bombarded by energized particles (not shown), such that particles 39A of target material 39 are deposited on seed layer 50 to create first magnetic layer 30. In some embodiments, first magnetic layer 30 may comprise a plurality of elements deposited from a single target 39 (e.g. where the target 39 may be prefabricated to have the desired constituent elements as is desired for magnetic layer 30) or may comprise a plurality of materials (e.g. elements) deposited from multiple targets 39, each target optionally comprising a different material. As particles 39A of target material 39 are deposited on seed layer 50, the thickness, $t_{m1}$, of first magnetic layer 30 increases until a desired thickness, $t_{m1}$, is achieved. As can be seen from FIG. 6A, surface 36 of first magnetic layer 30 may not be perfectly planar due to the distribution of particles 39A.

Once the desired thickness, $t_{m1}$, is achieved, a coupling layer 20 may be layered on first magnetic layer 30. FIG. 6B depicts a second step of layering coupling layer 20 on first magnetic layer 30. This second step may be accomplished by sputtering. For example, a target 29 of the same constituent materials as is desired for coupling layer 20 may be bombarded by energized particles (not shown), such that particles 29A of target material 29 are deposited on first magnetic layer 30 to create coupling layer 20. In some embodiments, coupling layer 20 may comprise a plurality of elements deposited from a single target 29 (e.g. where the target 29 may be prefabricated to have the desired constituent elements for coupling layer 20). Such constituent elements which may be pre-fabricated into target 29 may comprise the at least one first (non-magnetic) group element 22 and the at least one second (magnetic) group element 24. In some embodiments, coupling layer 20 may be fabricated from a plurality of materials (e.g. elements) deposited from multiple targets 29, each target 29 optionally comprising a different material. One of such multiple targets 29 may comprise the at least one first (non-magnetic) group element 22 and another one of such multiple targets 29 may comprise the at least one second (magnetic) group element 24. In such embodiments, the atomic concentration parameter x may be controlled, for example, by controlling the relative power of the energized particles that are used to bombard the various targets 29. As particles 29A of target material 29 are deposited on first magnetic layer 30, the thickness, $t_c$, of coupling layer 20 grows until a desired thickness, $t_c$, is achieved. As can be seen from FIG. 6B, the interface between surface 28 of coupling layer 20 and surface 36 of first magnetic layer 30 may not be perfectly planar due to the distribution of particles 29A and 39A. Further, surface 26 of coupling layer 20 may not be perfectly planar due to the distribution of particles 29A.

Figure 6C:
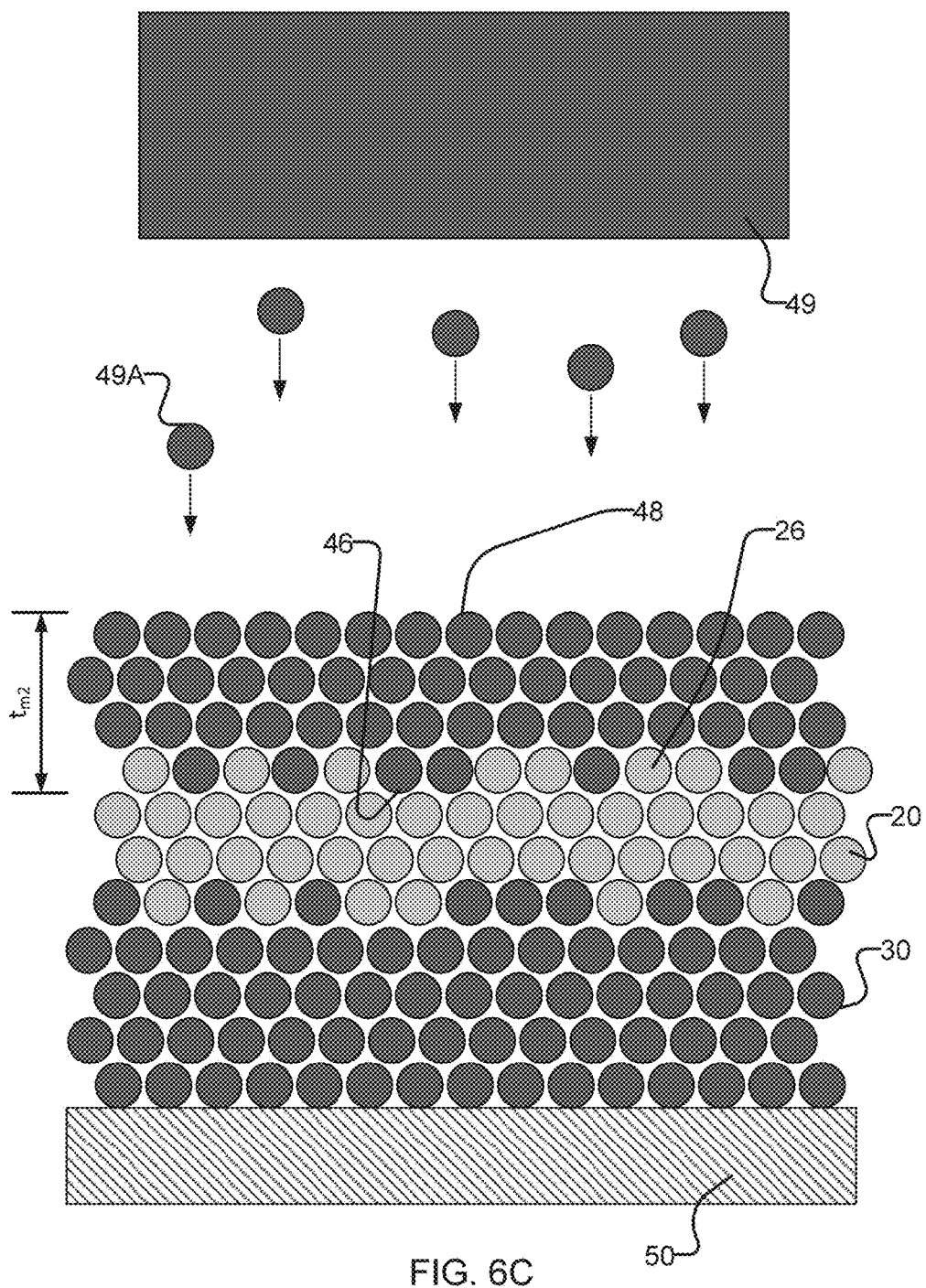

Once the desired thickness, $t_c$, is achieved, a second magnetic layer 40 may be layered on coupling layer 20. FIG. 6C depicts a third step of layering a second magnetic layer 40 on coupling layer 20. This third step may be accomplished by sputtering, such as is depicted in FIG. 6C. For example, a target 49 of the same material as is desired for second magnetic layer 40 may be bombarded by energized particles such that particles 49A of target material 49 are deposited on coupling layer 20 to create second magnetic layer 40. In some embodiments, target 49 is the same as target 39 and magnetic layers 30, 40 are made of the same material. In other embodiments, targets 39 and 49 may comprise different materials such that first and second magnetic layers 30, 40 may comprise different materials. In some embodiments, second magnetic layer 40 may comprise a plurality of elements deposited from a single target 49 (e.g. where the target 49 may be prefabricated to have the desired constituent elements for magnetic layer 40) or may comprise a plurality of materials (e.g. elements) deposited from multiple targets 49, each target 49 optionally comprising a different material. As particles 49A of target material 49 are deposited on coupling layer 20, the thickness, $t_{m2}$, of second magnetic layer 40 grows until a desired thickness, $t_{m2}$, is achieved. As can be seen from FIG. 6C, the interface between surface 26 of coupling layer 20 and surface 46 of second magnetic layer 40 may not be perfectly planar due to the distribution of particles 29A and 39A. Further, surface 48 of second magnetic layer 40 may not be perfectly planar due to the distribution of particles 49A.

In some embodiments, protective layer 55 may be layered on top of second magnetic layer 40 to protect the magnetic structure. For example, a layer of Ru may be layered on top of second magnetic layer 40 using sputtering or any other suitable technique.

In some embodiments, the sputtering process occurs in a single chamber that contains targets 29, 39, 49. In other embodiments, separate chambers are employed for sputtering one or more of targets 29, 39, 49.

In some embodiments, a coupling layer 20 may be fabricated to comprise a compound made of at least one first (non-magnetic) group element 22 and at least one second (magnetic) group element 24 in whole or in part through annealing. For example, a coupling layer 20 comprising a first (non-magnetic) group element 22 may be layered between first and second magnetic layers 30, 40, where each of the first and second magnetic layers 30, 40 comprise at least one element from second (magnetic) group 24 to form an initial structure. This initial structure may be fabricated using, for example, sputtering as explained above in connection with FIG. 6. The initial structure 10 may then be annealed. During the annealing process, second (magnetic) group element 22 atoms from magnetic layers 30, 40 may diffuse from first and second magnetic layers 30, 40 into coupling layer 20, such that the composition of coupling layer 20 will change from comprising at least one first (non-magnetic) group element 22 to comprising at least one element of first (non-magnetic) group 22 and at least one element from second (magnetic) group 24. Similarly, annealing may be employed to modify the concentration of second (magnetic) group element 24 within a coupling layer 20 that already comprises elements from both first (non-magnetic) group 22 and second (magnetic) group 24.

FIG. 7 schematically depicts this annealing-based process to fabricate a magnetic structure 10. In the initial structure on the left hand side of FIG. 7, first and second magnetic layers 30, 40 are fabricated (e.g. by sputtering) from a second (magnetic) group element (e.g. Co) and an initial coupling layer 20' is fabricated (e.g. by sputtering) a first (non-magnetic) group (e.g. Ru). Then the initial structure is annealed to provide the resultant structure 10 on the right hand side of FIG. 7. During the annealing process, atoms diffuse across the interfaces between magnetic layers 30, 40 and initial coupling layer 20' to form a final coupling layer 20 comprising both first (non-magnetic) and second (magnetic) group elements. In addition to magnetic atoms from magnetic layers 30, 40 diffusing into initial coupling layer 20', some non-magnetic atoms from initial coupling layer 20' may diffuse into magnetic layers 30, 40. Accordingly, final coupling layer 20 may be thicker than initial coupling layer 20'.

In some embodiments, during the annealing process, the initial structure comprises an initial coupling layer 20' comprising a first (non-magnetic) group element 22 and a second (magnetic) group element 24 in an atomic ratio of (100-$y$):y. After annealing, final coupling layer comprises an atomic ratio of first group element 22 to second group element 24 of (100-x):x. In some embodiments, such as was discussed above, y is equal to O. In other embodiments, y is greater than 0. In some embodiments, y is less than x. The atomic concentration parameter, x, may be greater than y due to diffusion of second group elements 24 into coupling layer 20 from magnetic layers 30, 40 as discussed above. Accordingly, annealing may be employed to raise the concentration of second group element 24 in coupling layer 20 during fabrication to obtain a desired atomic concentration ratio of a first group element 22 to a second group element 24.

In some embodiments annealing comprises heating at least a portion of the magnetic structure to over 50° C. during at least a portion of fabrication. In some embodiments annealing comprises heating at least a portion of the magnetic structure to over 100° C. during at least a portion of fabrication. In some embodiments annealing comprises heating at least a portion of the magnetic structure to over 150° C. during at least a portion of fabrication. In some embodiments annealing comprises heating at least a portion of the magnetic structure to over 200° C. during at least a portion of fabrication. In some embodiments annealing comprises heating at least a portion of the magnetic structure to over 300° C. during at least a portion of fabrication.

In some embodiments, magnetic structure 10 is heated during at least a portion of fabrication (e.g. during physical vapor deposition, atomic layer deposition, or chemical vapor deposition of one or more of first magnetic layer 30, coupling layer 20 and second magnetic layer 40.). In some embodiments, magnetic structure is heated to over 100° C. during at least a portion of fabrication. In some embodiments, magnetic structure is heated to over 150° C. during at least a portion of fabrication. In some embodiments, magnetic structure is heated to over 200° C. during at least a portion of fabrication. In some embodiments, magnetic structure is heated to over 300° C. during at least a portion of fabrication. Heating during fabrication may encourage diffusion between one or more of first and second magnetic layers 30, 40 and coupling layer 20 and may have a similar effect as annealing. Heating may be employed to achieve a desired atomic concentration parameter for coupling layer 20.

EXAMPLE EMBODIMENTS AND EXPERIMENTAL RESULTS

In one particular non-limiting embodiment of the invention, hereinafter referred to as the RuCo Embodiment, coupling layer 20 comprises Ru as a first (non-magnetic) group element 22 and Co as a second (magnetic) group element, and first and second magnetic layers 30, 40 each comprise Co. Seed layer 50 may comprise Ta and Ru and protective layer 55 may comprise Ru. First and second magnetic layers 30, 40 may each have a thickness of about 2.0 nm. Coupling layer 20 may comprise additional elements without substantively affecting operation of magnetic structure 10. First and second magnetic layers 30, 40 may also comprise additional elements without substantively affecting operation of magnetic structure 10. For illustrative purposes and simplicity, the additional elements in magnetic layers 30, 40 and coupling layer 20 may be ignored. Coupling layer 20 may have ratio of atomic concentration of Ru to Co of (100−x):x, where x>0.

For convenience, the RuCo Embodiment coupling layer may be referred to as $Ru_{100-x}Co_x$. A similar naming convention may be used herein for other compositions. For example, a coupling layer having a ratio of atomic concentration of Ru to Fe of (100−x):x, where x>0, may be referred to as $Ru_{100-x}Fe_x$. Also for convenience, the RuCo Embodiment magnetic structure 10 may be described using the following shorthand: $Co(t_{m1})/Ru_{100-x}Co_x(t_c)/Co(t_{m2})$. This shorthand notation may also be used for other magnetic structures 10, described herein. For example, $Ni(t_{m1})/Ru_{100-x}Fe_x(0.75\ nm)/Ni(t_{m2})$ refers to a magnetic structure having first and second magnetic layers 30, 40 of Ni and a coupling layer 20 of $Ru_{100-x}Fe_x$ having a thickness, $t_c$, of 0.75 nm.

Figure 8:
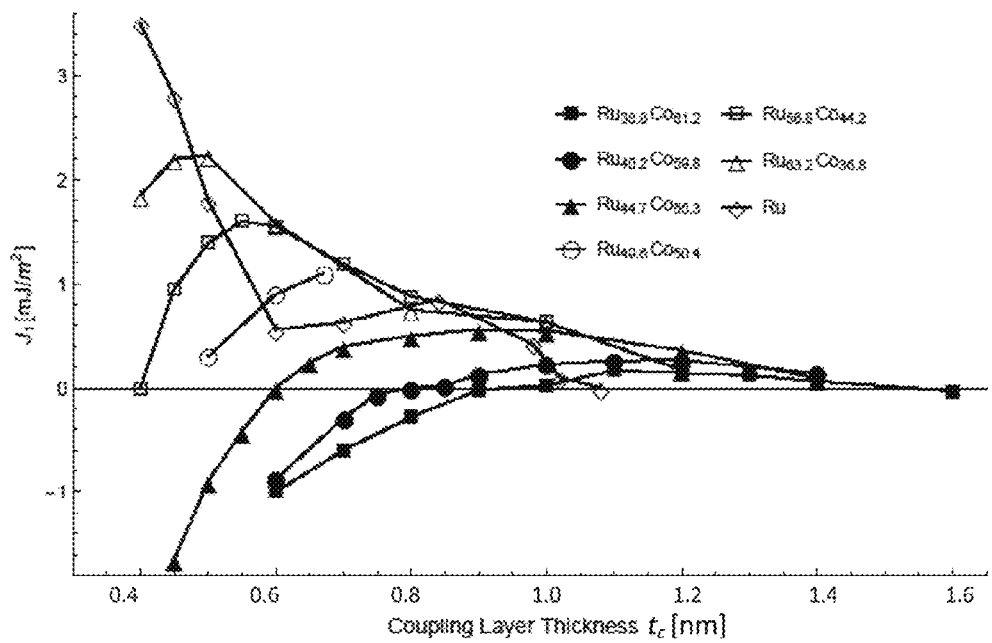
FIG. 8 depicts a plot of bilinear coupling strength, $J_1$, as a function of coupling layer thickness, $t_c$, for various magnetic structures.

FIG. 8 is a plot depicting the dependence of bilinear coupling strength $J_1$ between first and second magnetic layers 30, 40 of a number of exemplary magnetic structures 10 fabricated in accordance with the RuCo Embodiment as a function of the thickness $t_c$ of coupling layer 20 for various values of x between 0 and 61.2 (e.g. where the atomic concentration ratio of Ru to Co is between 100:0 and 38:61.2). As can be seen from FIG. 8, bilinear coupling strength $J_1$ of these magnetic structures is dependent on the atomic concentration ratio of Co to Ru in coupling layer 20 as well as the thickness, $t_c$, of coupling layer 20.

Figure 9:
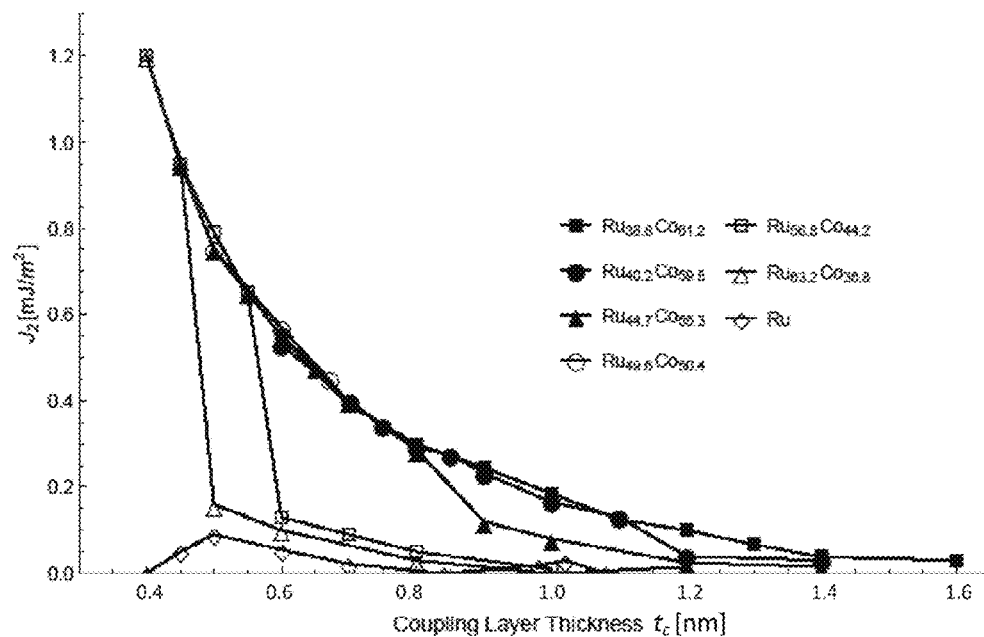
FIG. 9 depicts a plot of biquadratic coupling strength, $J_2$, as a function of coupling layer thickness, $t_c$, for various magnetic structures.

FIG. 9 is a plot depicting the dependence of biquadratic coupling strength $J_2$ of the between first and second magnetic layers 30, 40 of the same exemplary magnetic structures depicted in FIG. 8 as a function of the thickness of coupling layer 20 for various values of x between 0 and 61.2. As can be seen from FIG. 9, biquadratic coupling strength $J_2$ of the RuCo Embodiment is dependent on the atomic concentration ratio of Co to Ru in coupling layer 20 as well as the thickness, $t_c$, of coupling layer 20.

It is known that for a pure (or relatively pure) Ru coupling layer 20 (i.e. x=0), antiferromagnetic coupling occurs for values of between approximately 0.4 nm and 1.1 nm. $J_1$ for a pure (or relatively pure) Ru coupling layer 20 within this antiferromagnetic region may be described as oscillating since it has two maximum values (e.g. at approximately 0.4 and 0.85 nm) and a minimum value (e.g. at approximately 0.6 nm). In contrast, for x≥36.8, such a minimum does not occur for a thickness of $t_c$=0.6 nm. Instead, $J_1$ is relatively larger (e.g. two to three times larger as compared to when x=0) for $Ru_{63.2}Co_{36.8}$ (open triangle) and $Ru_{55.8}Co_{44.2}$ (open square) coupling layers 20 at $t_c$=0.6 nm. Accordingly, for 36.8, a coupling layer 20 having a thickness of approximately 0.6 nm may exhibit strong antiferromagnetic coupling, as compared to a pure Ru coupling layer 20 having a thickness of approximately 0.6 nm.

FIG. 8 shows that the slope of bilinear coupling strength, $J_1$, as it trends from positive to negative (e.g. the transition from antiferromagnetic to ferromagnetic coupling) as thickness, $t_c$, decreases becomes less dramatic for x≥44.2 in coupling layer 20 (as shown by the gradual smooth curves for x≥44.2 in coupling layer 20). For a coupling layer of Ru (i.e. x=0) the region over which $J_1$ is trending to zero as thickness, $t_c$, decreases, (not shown in FIG. 8) is known to occur between 0.32 and 0.38 nm. As the concentration of Co in Ru is increased, the region over which $J_1$ is trends to zero (has a positive slope in FIG. 8) occurs over a broader range of thicknesses. For $Ru_{63.2}Co_{36.8}$ (e.g. x=36.8, represented by the open triangle) the region over which $J_1$ is trending downwardly as thickness, $t_c$, decreases (has a positive slope in FIG. 8) occurs between approximately 0.4 and 0.5 nm such that the region is approximately 0.1 nm wide. For $Ru_{55.8}Co_{44.2}$ (e.g. x=44.2, represented by the open square) the region over which $J_1$ is trending downwardly as thickness, $t_c$, decreases (has a positive slope in FIG. 8) occurs between approximately 0.4 and 0.55 nm, such that the transition region is approximately 0.15 nm wide. For $Ru_{49.6}Co_{50.4}$ (e.g. x=50.4, represented by the open circle) only a small amount of data has been collected however one can see from FIG. 8 that the region over which $J_1$ is trending downwardly as thickness, $t_c$, decreases (has a positive slope in FIG. 8) occurs between approximately 0.4 and 0.7 nm, such that the region is approximately 0.3 nm wide. As the Co concentration is further increased this region dramatically increases. For example, for $Ru_{44.7}Co_{55.3}$ (e.g. x=55.3, represented by the solid triangle) the region over which $J_1$ is trending downwardly as thickness, $t_c$, decreases (has a positive slope in FIG. 8) occurs between approximately 0.45 and 1.0 nm, such that the region is approximately 0.55 nm wide. For both $Ru_{40.2}Co_{59.8}$ (e.g. x=59.8, represented by the solid circle), and $Ru_{38.8}Co_{61.2}$ (e.g. x=61.2, represented by the solid square) the region over which $J_1$ is trending downwardly as thickness, $t_c$, decreases (has a positive slope in FIG. 8) occurs between approximately 0.6 and 1.4 nm, such that the region is approximately 0.8 nm wide. As the region of $t_c$ values over which $J_1$ is trending downwardly as thickness, $t_c$, decreases is increased, the region of $t_c$ values for non-collinear coupling also increases and non-collinear coupling is more easily achievable.

As can be seen from FIG. 9, adding Co to Ru may result in an increase of the biquadratic coupling strength, $J_2$ for certain values of thickness $t_c$ of coupling layer 20. For a coupling layer 20 of pure (or relatively pure) Ru (e.g. x=0, represented by the open diamond) a small biquadratic coupling strength, $J_2$, is observed. For coupling layers 20 having x≥36.8, at a certain thickness the biquadratic coupling strength, $J_2$, is relatively larger than for pure (or relatively pure) Ru (e.g. x=0), as can be seen from FIG. 9. This relative size of the biquadratic coupling strength, $J_2$, as compared to $J_2$ for pure Ru, is shown generally to increase with x and also to increase with a decrease in $t_c$.

For $Ru_{63.2}CO_{36.8}$ (i.e. x=36.8, represented by the open triangle), a dramatic increase in the biquadratic coupling strength, $J_2$, occurs for $t_c$ between approximately 0.45 and 0.5 nm. For $Ru_{55.8}Co_{44.2}$ (i.e. x=44.2, represented by the open square), a dramatic increase in the biquadratic coupling strength, $J_2$, occurs for $t_c$ between approximately 0.55 and 0.6 nm.

For $Ru_{44.7}Co_{55.3}$ (i.e. x=55.3, represented by the solid triangle), a dramatic increase in the biquadratic coupling strength, $J_2$, occurs for $t_c$ between approximately 0.8 and 0.9 nm. For $Ru_{40.2}Co_{59.8}$ (i.e. x=59.8, represented by the solid circle) the dramatic increase in the biquadratic coupling strength, $J_2$, occurs between approximately 1.1 and 1.2 nm.

These dramatic increases of the biquadratic coupling strength, $J_2$, allows for non-collinear coupling, which, as discussed above, occurs when the biquadratic coupling strength, $J_2$, is large in comparison to the bilinear coupling strength, $J_1$. For example, non-collinear coupling may occur when $$J_2 \geq \frac{1}{2}|J_1|.$$

Figure 10:
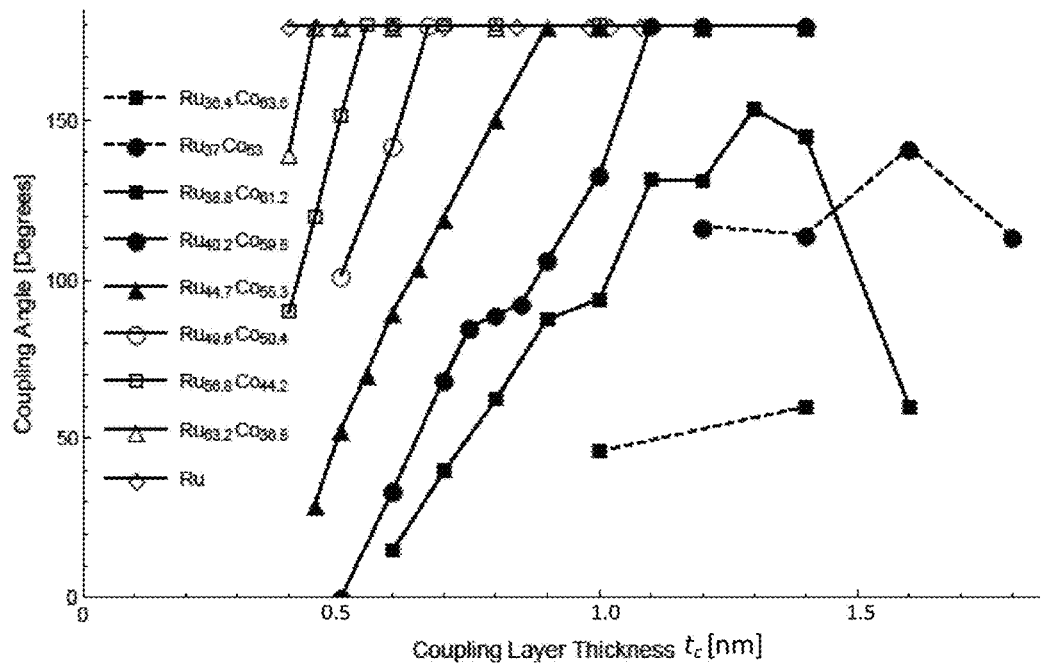
FIG. 10 depicts a plot of coupling angle as a function of coupling layer thickness, $t_c$, for various magnetic structures.

FIG. 10 is a plot depicting the dependence of the coupling angle φ between first and second magnetic layers 30, 40 in a number of exemplary magnetic structures fabricated in accordance with the RuCo Embodiment as a function of the thickness $t_c$ of coupling layer 20 for various values of x between 0 and 63.6.

As can be seen from FIG. 10, non-collinear coupling can be achieved with 36.8 at various values of thickness $t_c$ of coupling layer 20.

For x=36.8, non-collinear coupling at an angle of about 140° is observed at a coupling layer 20 thickness $t_c$ of approximately 0.4 nm. Referring back to FIG. 9, the biquadratic coupling strength, $J_2$, for x=36.8 is large for values of thickness $t_c$ of coupling layer 20 of between approximately 0.4 nm and 0.45 nm. However, the bilinear coupling strength, $J_1$, for x=36.8, as shown in FIG. 8, is sufficiently large at $t_c$=0.45 nm that $J_2$ is still less than half of the absolute value of $J_1$ and non-collinear coupling is observed for $t_c$=0.45 nm. As thickness $t_c$ of coupling layer 20 increases to 0.5 nm, $J_2$ decreases significantly and non-collinear coupling is not observed.

If x is increased to 44.2, non-collinear coupling at non-collinear angles φ is observed at a coupling layer 20 thickness $t_c$ of between approximately 0.4 nm and 0.55 nm. If x is increased to 50.4, non-collinear coupling at angles between 100° and 180° is observed at a thickness $t_c$ of coupling layer 20 of between approximately 0.5 nm and 0.65 nm. If x is increased to 55.3, non-collinear coupling at angles between approximately 30° and 180° is observed at a thickness $t_c$ of coupling layer 20 of between approximately 0.45 nm and 0.9 nm.

As can be seen from FIG. 10, for x=36.8, 44.2, 50.4 and 55.3, the rate of change of the non-collinear coupling angle φ with respect to thickness $t_c$ of coupling layer 20 decreases as the concentration of Co (i.e. x) increases. Accordingly, as x increases, non-collinear coupling may be achieved over a greater range of thickness, $t_c$. Moreover, for x=36.8, 44.2, 50.4 and 55.3, the relationship of the non-collinear coupling angle φ with respect to thickness $t_c$ of coupling layer 20 is at least approximately linear above 0.4 nm. This linear relationship may be due to the relatively large biquadratic strength, $J_2$, for x=36.8, 44.2, 50.4 and 55.3 in combination with the smooth constantly changing bilinear coupling strength, $J_1$, for x=36.8, 44.2, 50.4 and 55.3 as shown in FIGS. 8 and 9.

If x is increased to 59.8, non-collinear coupling at angles between 0° and 180° is observed at a coupling layer 20 thickness $t_c$ of between approximately 0.5 nm and 1.1 nm. However, in contrast to x=36.8, 44.2, 50.4 and 55.3, the relationship of the non-collinear coupling angle φ with respect to thickness $t_c$ of coupling layer 20 for x=59.8 is not linear. Instead, the coupling angle is relatively constant (lower slope) in an angular range near 85° to 95° for values of coupling layer 20 thickness $t_c$ between approximately 0.75 nm to 0.85 nm. Therefore it may be relatively easier to achieve a coupling angle φ near 85° to 95°. This relatively constant coupling angle φ for values of thickness $t_c$ of coupling layer 20 between 0.75 nm to 0.85 nm when x=59.8 may be due to the large biquadratic coupling strength, $J_2$, combined with the relatively constant bilinear coupling strength, $J_1$, occurs for values of thickness $t_c$ of coupling layer 20 between 0.75 nm to 0.85 nm when x=59.8, as can be seen from FIGS. 8 and 9.

If x is increased to 61.2, non-collinear coupling at angles between 15° and 155° is observed at a coupling layer 20 thickness $t_c$ of between approximately 0.6 nm and 1.6 nm. In contrast to x=36.8, 44.2, 50.4, 55.3 and 59.8, there is no antiferromagnetic coupling for x=61.2 for values of coupling layer 20 thickness $t_c$ between approximately 0.6 nm and 1.6 nm. For values of coupling layer 20 thickness $t_c$ between approximately 00.6 nm and 0.9 nm, the relationship of the non-collinear coupling angle φ with respect to thickness $t_c$ of coupling layer 20 for x=61.2 is approximately linear. However, similar to the case of x=59.8 and due to similar reasons, the coupling angle φ is relatively constant (lower slope) in an angular range near 85° to 95° for values of coupling layer 20 thickness $t_c$ between 0.9 nm to 1.0 nm. The coupling angle φ is also relatively constant near 130° for values of coupling layer 20 thickness $t_c$ between 1.1 nm to 1.2 nm. Therefore it may be relatively easier to achieve a coupling angle φ near 130°. However, the coupling angle φ decreases from approximately 150° at a coupling layer 20 thickness $t_c$ of 1.3 nm to approximately 55° at a coupling layer 20 thickness $t_c$ of 1.6 nm. This decrease of the coupling angle φ may be due to the weak biquadratic coupling strength, $J_2$, for such values of coupling layer 20 thickness $t_c$ at x=61.2.

If x is increased to 63, non-collinear coupling at angles φ between 110° and 140° is observed at a coupling layer 20 thickness $t_c$ of between approximately 1.2 nm and 1.8 nm. If x is increased to 63.6, non-collinear coupling at angles φ between 45° and 60° is observed at a coupling layer 20 thickness $t_c$ of between approximately 1.0 nm and 1.4 nm.

From FIG. 10, it can also be seen that antiferromagnetic coupling between first and second magnetic layers 30, 40 of magnetic structures fabricated in accordance with the RuCo Embodiment can be achieved for values of x that are greater than 0 and less than 60. For magnetic structures fabricated according to the RuCo Embodiments, FIG. 10 shows non-collinear coupling angles for a selection of atomic concentration parameters x in a range of 36.8≤x≤63.6 and coupling layer thicknesses tc in a range of ~0.38 nm≤$t_c$≤~1.8 nm. Those skilled in the art will appreciate, from the experimental data provided in FIGS. 8, 9 and 10 that non-collinearly coupled structures could be fabricated with suitable selection of the parameters x and/or $t_c$ within these ranges.

Figure 11:
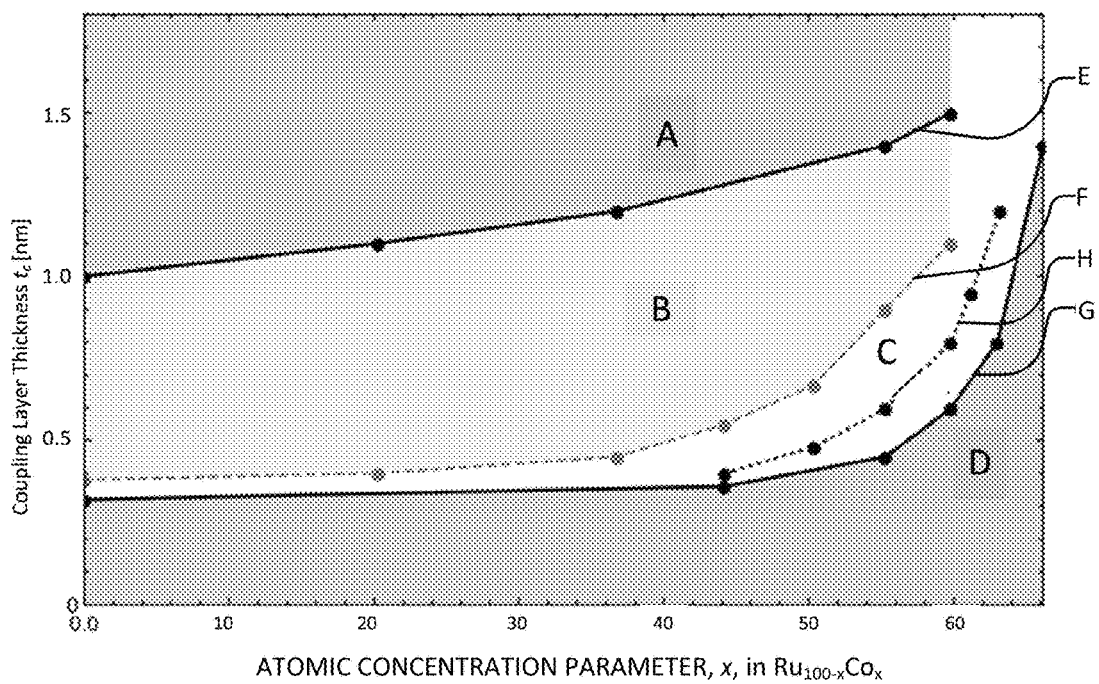
FIG. 11 depicts a plot of coupling layer thickness, $t_c$, as a function of atomic concentration parameter, x, in a magnetic structure fabricated with a coupling layer comprising $Ru_{100-x}Co_x$.

FIG. 11 depicts a plot of coupling layer thickness, $t_c$, as a function of atomic concentration parameter, x, for magnetic structures fabricated according to the RuCo Embodiment. FIG. 11 also shows what values of atomic concentration parameter x and coupling layer thickness $t_c$ cause structures fabricated according to the RuCo Embodiment to exhibit ferromagnetic coupling, antiferromagnetic coupling, and non-collinear coupling. Region B represents antiferromagnetic coupling of first and second magnetic layers 30, 40, region C represents non-collinear coupling of first and second magnetic layers 30, 40 and region D of the FIG. 11 plot represents ferromagnetic coupling of first and second magnetic layers 30, 40. Regions A and B are separated by boundary E, regions B and C are separated by boundary F, regions C and D are separated by boundary G. Line H, which is within region C, represents a non-collinear coupling angle of approximately 90°. Boundary E represented ferromagnetic coupling.

For structures of the RuCo Embodiment shown in FIG. 11 and for any of the atomic concentration parameter x from about 20-55, the range of thickness $t_c$, over which either antiferromagnetic coupling or non-collinear coupling occurs (i.e. the range of $t_c$ between boundary E and boundary G) increases with x. Similarly, over this same concentration parameter range (20≤x≤55), the range of thickness $t_c$, over which non-collinear coupling occurs (i.e. the range of $t_c$ between boundary F and boundary G or, equivalently, the range of $t_c$ in region C) increases with x. With a larger range of thickness $t_c$ over which non-collinear coupling occurs, it becomes easier to fabricate coupling layers 20 that provide non-collinear coupling, since the tolerances for coupling layer thickness $t_c$ are greater. With x below approximately 36.8, the range of values of thickness $t_c$ of coupling layer 20 for which non-collinear coupling occurs is relatively smaller than for x above approximately 36.8. For example, at x=20, non-collinear coupling may be observed for $t_c$ values of greater than approximately 0.35 nm and less than approximately 0.4 nm. On the other hand, at x=44.2, non-collinear coupling is observed to occur for $t_c$ values of greater than approximately 0.35 nm and less than approximately 0.5 nm and at x=55.3, non-collinear coupling is observed to occur for $t_c$ values of greater than approximately 0.45 nm and less than approximately 0.9 nm.

Non-collinear coupling may occur in structures fabricated according to the RuCo Embodiment for the following values of x and the corresponding values of $t_c$:

for 37<x<44, (0.0014x+0.3)<$t_c$[nm]<(0.017x−0.17);

for 44<x<50, (0.0072x+0.064)<$t_c$[nm]<(0.017x−0.18);

for 50<x<55, (0.0072x+0.044)<$t_c$[nm]<(0.044x−1.52);

for 55<x<60, (0.03x−1.2)<$t_c$[nm]<(0.044x−1.54); and for 60<x<63, (0.14x−7.8)<$t_c$[nm]<(0.07x−2.61).

Below x=37, non-collinear may occur but only for very small ranges of thickness, $t_c$. Experimental results are not currently available for x is greater than 64. However, it is expected that non-collinear coupling may occur for some values of $t_c$ when x is greater than 64.

As values of coupling layer thickness $t_c$ increase, coupling strength between magnetic layers 30, 40 may weaken due to the increased distance between magnetic layers 30, 40.

For fabrication of magnetic structures, like magnetic structure 10, it may be beneficial for structural reliability, ease of manufacturing and/or consistency of manufacturing, if the range of $t_c$ values at a given value of x for which non-collinear coupling occurs is relatively larger. Similarly, it may be beneficial for ease of manufacturing and/or consistency of manufacturing, if the range of $t_c$ values for which a particular non-collinear coupling angle φ (or a particular range of non-collinear coupling angles φ) occurs is larger. This may allow for reduced manufacturing tolerances while still achieving non-collinear coupling or non-collinear coupling with a particular coupling angle (or range of angles) φ.

Figures 12A, 12B:
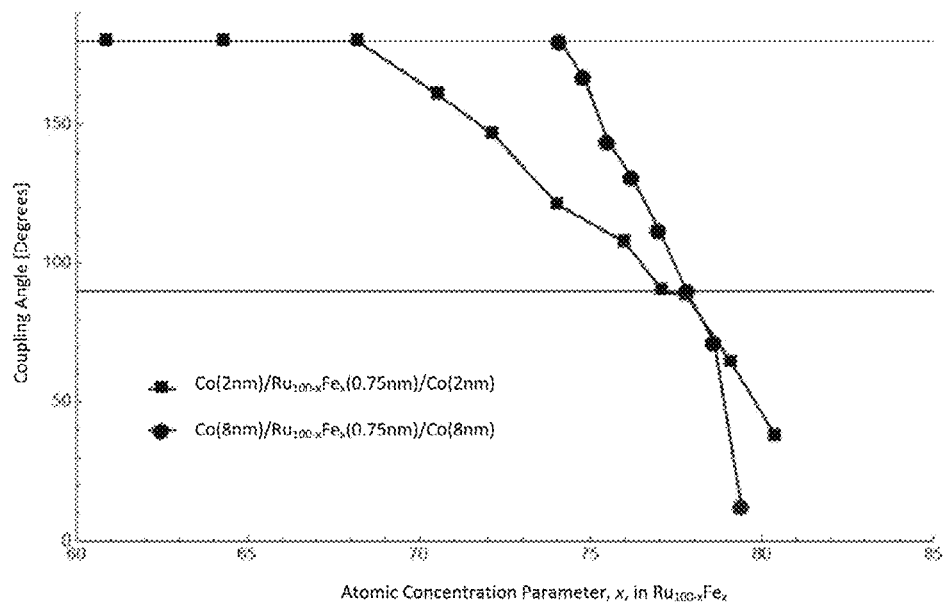
FIG. 12A depicts a plot of coupling angle as a function of atomic concentration parameter, x, in a number of magnetic structures fabricated with a coupling layer comprising $Ru_{100-x}Fe_x$.
FIG. 12B depicts a plot of coupling angle as a function of atomic concentration parameter, x, in a number of magnetic structures fabricated with a coupling layer comprising $Ru_{100-x}Co_x$.

FIG. 12A is a plot depicting the dependence of coupling angle φ on the atomic concentration parameter, x, for two different thicknesses, $t_{m1}$, $t_{m2}$, of magnetic layers 30, 40, where $t_{m1}$ is approximately equal to $t_{m2}$, for a magnetic structure 10 of Co($t_{m1}$)/Ru$_{100-x}$Fe$_x$(0.75 nm)/Co($t_{m2}$). From FIG. 12A, it can be seen that both of the depicted structures exhibit non-collinear coupling for x≥~79. However, in general, FIG. 12A shows that the coupling angle φ is dependent on both atomic concentration parameter, x, and the thicknesses, $t_{m1}$, $t_{m2}$, of magnetic layers 30, 40, where $t_{m1}$ is approximately equal to $t_{m2}$. It can also be seen from FIG. 12A that, in the case of a magnetic structure 10 of Co($t_{m1}$)/Ru$_{100-x}$Fe$_x$(0.75 nm)/Co($t_{m2}$), non-collinear coupling occurs over a wider range of values (and at lower values) of atomic concentration parameter, x, for lower values of thicknesses, $t_{m1}$, $t_{m2}$ and the rate of change of the coupling angle φ with respect to the parameter x is greater for larger values of thicknesses, $t_{m1}$, $t_{m2}$. FIG. 12A shows that independent of magnetic layer thickness, $t_{m1}$, $t_{m2}$, orthogonal or near orthogonal non-collinear coupling may occur at relatively similar values of the atomic concentration parameter, x. However, the rate of change of coupling angle φ with respect to atomic concentration parameter, x, when orthogonal or near orthogonal non-collinear coupling occurs may be different, as can be seen by the varying steepness of the curves in FIG. 12A as the curves cross the orthogonal (φ=90°) non-collinear coupling line. While FIG. 12A shows that the dependence of coupling angle φ on the atomic concentration parameter, x, is different for $t_{m1}$ and $t_{m2}$ equal to 2 nm or 8 nm, it is expected that less substantial differences in $t_{m1}$ and $t_{m2}$ would have less substantial impacts on the dependence of coupling angle φ on the atomic concentration parameter, x. For example, it is expected that if $t_{m1}$ and $t_{m2}$ are greater than 1.5 nm and less than 3 nm, the dependence of coupling angle φ on the atomic concentration parameter, x, would be relatively similar (e.g. within 10%, 5% or 2%).

FIG. 12B is a plot depicting the dependence of coupling angle φ on the atomic concentration parameter, x, for three different values of coupling layer 20 thickness, $t_c$ for a magnetic structure of Co($t_{m1}$)/Ru$_{100-x}$Co$_x$($t_c$)/Co($t_{m2}$). From FIG. 12B, it can be seen that the coupling angle φ is dependent on both atomic concentration parameter, x, and the thickness, $t_c$, of coupling layer 20. It can also be seen that non-collinear coupling occurs for lower values of atomic concentration parameter, x, when coupling layer 20 is thinner (i.e. for lower values of $t_c$) and the rate of change of the coupling angle φ with respect to the atomic concentration parameter x in the non-collinear coupling region is greater for larger values of coupling layer thickness, $t_c$. Non-collinear coupling may occur for lower values of atomic concentration parameter, x, when coupling layer 20 is thinner (i.e. for lower values of $t_c$) due to the relatively larger impact (at small $t_c$ values) for diffusion of magnetic material from magnetic layers 30, 40 into coupling layer 20.

Figure 13A:
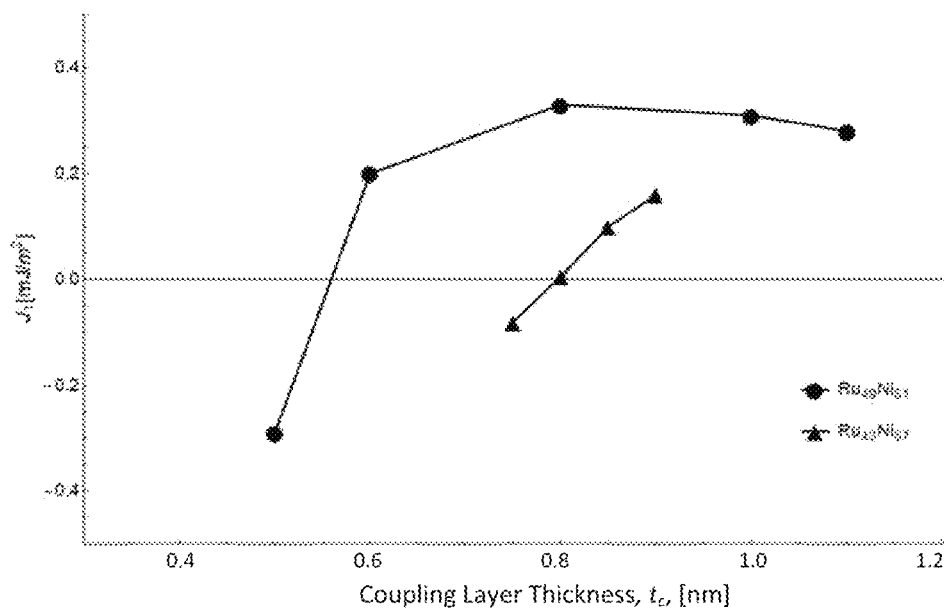
FIG. 13A depicts a plot of bilinear coupling strength, $J_1$, as a function of coupling layer thickness, $t_c$, for various magnetic structures fabricated with a coupling layer comprising Ru and Ni.
Figure 13B:
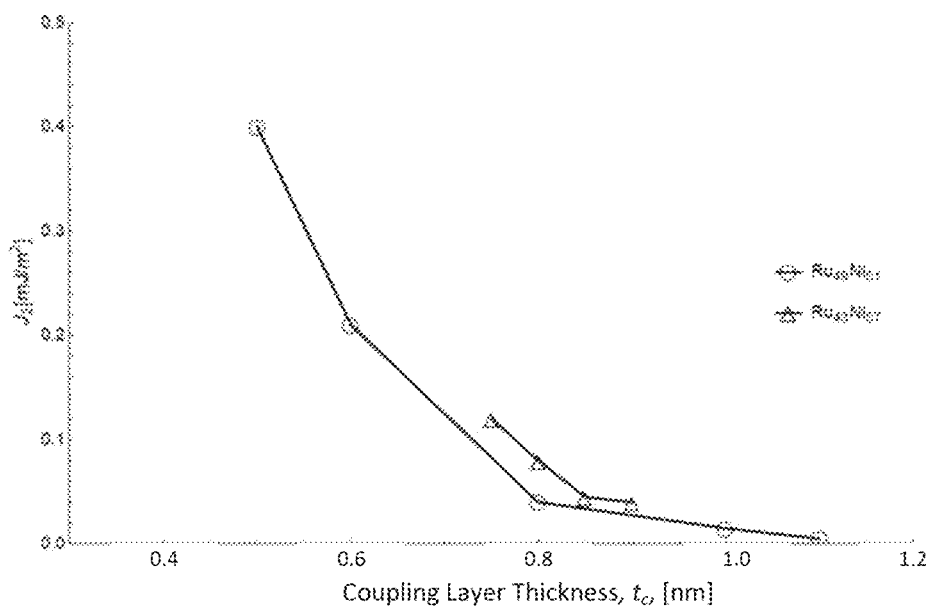
FIG. 13B depicts a plot of biquadratic coupling strength, $J_2$, as a function of coupling layer thickness, $t_c$, for various magnetic structures fabricated with a coupling layer comprising Ru and Ni.
Figure 13C:
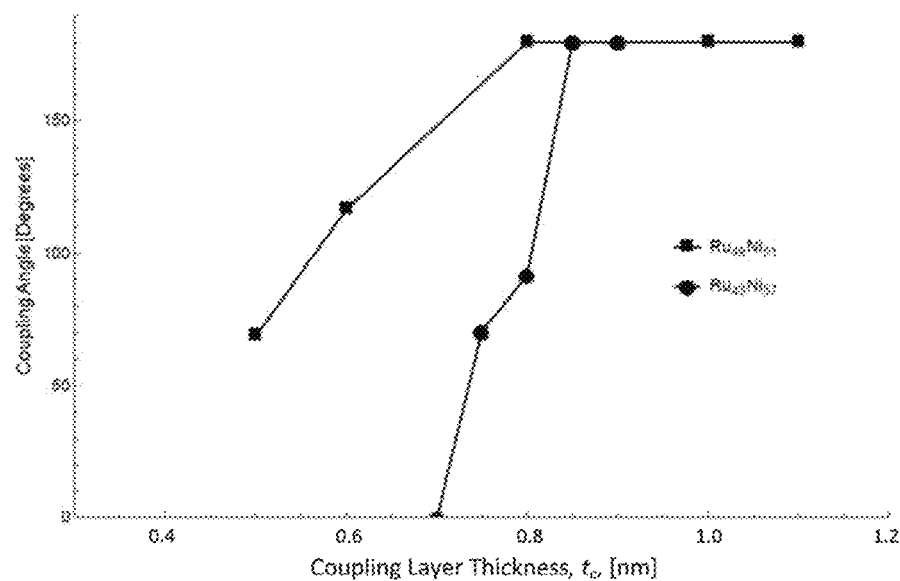
FIG. 13C depicts a plot of coupling angle as a function of coupling layer thickness, $t_c$, for various magnetic structures fabricated with a coupling layer comprising Ru and Ni.

FIGS. 13A and 13B are plots depicting the dependence of bilinear coupling strength $J_1$ and biquadratic coupling strength $J_2$, respectively, of the magnetic coupling between first and second magnetic layers 30, 40 as a function of the thickness $t_c$ of coupling layer 20 for magnetic structure 10 of Co($t_{m1}$)/Ru$_{100-x}$Ni$_x$($t_c$)/Co($t_{m2}$). FIG. 13C shows a dependence of the coupling angle φ of first and second magnetization directions 32, 42 on the thickness, $t_c$ for a magnetic structure 10 of Co($t_{m1}$)/Ru$_{100-x}$Ni$_x$($t_c$)/Co($t_{m2}$). These plots of FIGS. 13A, 13B and 13C are similar to the plots of FIGS. 8, 9 and 10 for magnetic structures 10 fabricated according to the RuCo Embodiment.

For atomic concentration parameter, x, of 51, bilinear coupling strength $J_1$ is negative and bilinear coupling strength $J_1$ increases steeply for low values of coupling layer 20 thickness $t_c$. As bilinear coupling strength $J_1$ crosses to positive values, $J_1$ remains relatively constant as $t_c$ values increase from about 0.58 nm to about 1.1 nm. Biquadratic coupling strength, $J_2$, for magnetic structure 10 of Co($t_{m1}$)/Ru$_{100-x}$Ni$_x$($t_c$)/Co($t_{m2}$) atomic concentration parameter, x, of 51 is at a maximum when coupling layer 20 thickness, $t_c$, is approximately 0.5 nm and biquadratic coupling strength, $J_2$, decreases as coupling layer 20 thickness, $t_c$, increases.

FIG. 13C shows a dependence of the coupling angle φ of first and second magnetization directions 32, 42 on the thickness, $t_c$ for a pair of magnetic structures 10 of $Co(t_{m1})/Ru_{100-x}Ni_x(t_c)/Co(t_{m2})$ having different values for the atomic concentration parameter x. As can be seen from FIG. 13C, non-collinear coupling may be achieved for magnetic structure 10 of $Co(t_{m1})/Ru_{100-x}Ni_x(t_c)/Co(t_{m2})$ when thickness, $t_c$, is greater than approximately 0.5 nm and less than about 0.8 nm for x=51 and greater than approximately 0.7 and less than about 0.85 nm for x=57. When thickness, $t_c$, is above 0.85 nm, magnetic structure 10 of $Co(t_{m1})/Ru_{100-x}Ni_x(t_c)/Co(t_{m2})$ exhibits antiferromagnetic coupling between first and second magnetic layers 30, 40 for 51≤x≤57. The results exhibited in FIGS. 13A, 13B, 13C for magnetic structures 10 of $Co(t_{m1})/Ru_{100-x}Ni_x(t_c)/Co(t_{m2})$ are similar to those shown in the plots of FIGS. 8, 9 and 10 for magnetic structures 10 fabricated according to the RuCo Embodiment. Accordingly, although there are limited experimental results for the $Co(t_{m1})/Ru_{100-x}Ni_x(t_c)/Co(t_{m2})$ embodiment, those skilled in the art could, based on the experimental data shown, select the parameters x and/or $t_c$ to achieve magnetic structures of $Co(t_{m1})/Ru_{100-x}Ni_x(t_c)/Co(t_{m2})$ exhibiting non-collinear coupling.

Figure 14:
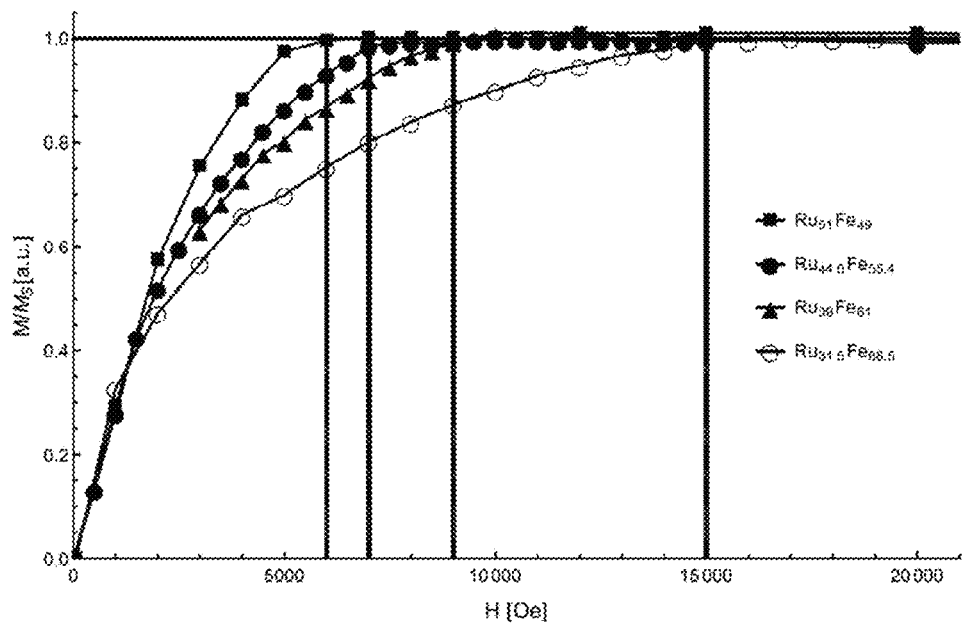
FIG. 14 depicts a plot of the normalized magnetization as a function of external magnetic field H for various magnetic structures fabricated with a coupling layer comprising Ru and Fe.

FIG. 14 shows the normalized magnetization as a function of external magnetic field H for a number of magnetic structures 10 of $Co(2.0\ nm)/Ru_{100-x}Fe_x(0.75\ nm)/Co(2.0\ nm)$ with different x values, where 49≤x≤68.5. The saturation field as discussed herein is defined as the smallest external magnetic field required to fully saturate first and second magnetic layers 30, 40, along the applied field direction (e.g. to align magnetic moments 32, 42 along the applied external field direction). At or above the saturation field, the normalized magnetization M/Ms is equal to 1. M is the measured magnetization at the given external magnetic field H and Ms is the saturation magnetization. In FIG. 14, the vertical solid lines are used to identify the saturation fields for magnetic structure 10 for each value of x (e.g. for each of x=49, 55.4, 61 and 68.5).

As can be seen from FIG. 14, the saturation field in the FIG. 14 structures significantly increases if Fe concentration, x, is above 60. The saturation field for antiferromagnetic coupling increases as $J_1$ and $J_2$ increase, such that $J_2 ≤ ½J_1$. Accordingly, the increase in saturation field shown in FIG. 14 is due to the increase in bilinear coupling strength $J_1$ when x is above 60 and the large values of $J_2$ that occur when x is above 60. $J_2$ is seen to be substantially smaller for x is less than 60 which leads to smaller saturation fields for x is below 60. The antiferromagnetic coupling strength is expected to increase for structures having a $Ru_{100-x}Fe_x$ coupling layer for magnetic layers 30, 40 having a wide range of materials (e.g. other than pure Co), if x is above 60 and x is below values where non-collinear coupling is observed.

Figure 15:
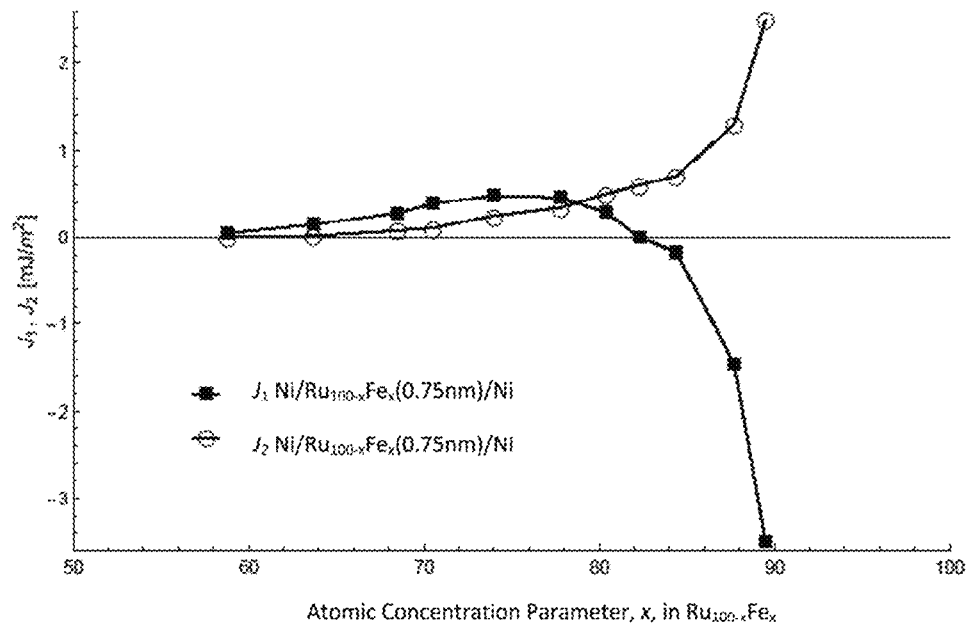
FIG. 15 depicts a plot of bilinear coupling strength, $J_1$, and biquadratic coupling strength, $J_2$, as a function of atomic concentration parameter, x, in a magnetic structure fabricated with a coupling layer comprising $Ru_{100-x}Fe_x$.

FIG. 15 is a plot of $J_1$ and $J_2$ for a magnetic structure 10 of $Ni(t_{m1})/Ru_{100-x}Fe_x(0.75\ nm)/Ni(t_{m2})$ as a function of x. For magnetic structure 10 of $Ni(t_{m1})/Ru_{100-x}Fe_x(0.75\ nm)/Ni(t_{m2})$, antiferromagnetic coupling between Ni magnetic layers is achieved for values of x greater than approximately 60 and less than approximately 74. Antiferromagnetic coupling between Ni magnetic layers 30, 40 quickly diminishes (both $J_1$ and $J_2$ are around zero) if x is below 60.

If a magnetic structure 10 has the structure $Co(t_{m1})/Ru(t_c)/Co(t_{m2})$, the antiferromagnetic coupling strength between Co magnetic layers 30, 40 across a Ru coupling layer 20, for coupling layer 20 thickness, $t_c$, greater than approximately 0.35 nm and less than approximately 1.1 nm, is relatively large (e.g. for $Co(t_{m1})/Ru(0.75\ nm)/Co(t_{m2})$, the bilinear coupling strength $J_1$ is approximately 0.65mJ/m² and the biquadratic coupling strength, $J_2$ is approximately near zero). In contrast, if magnetic structure 10 has the structure $Ni(t_{m1})/Ru(t_c)/Ni(t_{m2})$, the antiferromagnetic coupling strength and saturation field between Ni magnetic layers 30, 40 across a Ru coupling layer 20 is weak (e.g. at or near zero). However, if magnetic structure 10 has the structure, $Ni(t_{m1})/Ru_{100-x}Fe_x(t_c)/Ni(t_{m2})$, where x is greater than approximately 60 and less than approximately 74, the antiferromagnetic coupling strength between first and second magnetic layers 30, 40 and saturation field are comparable to that of a magnetic structure 10 having the structure $Co(t_{m1})/Ru(t_c)/Co(t_{m2})$. This can be seen in FIG. 15, where the magnitudes of both $J_1$ and $J_2$ increase from x=60 to x=74 for $Ni(t_{m1})/Ru(\mathbf{0.75})/Ni(t_{m2})$ For a structure 10 of $Ni(t_{m1})/Ru_{29.5}Fe_{70.5}(0.75\ nm)/Ni(t_{m2})$ as shown in FIG. 15, the antiferromagnetic coupling strength and saturation field are comparable to that of a $Co(t_{m1})/Ru(0.75\ nm)/Co(t_{m2})$. Antiferromagnetic coupling may also occur between first and second magnetic layers 30, 40 of Ni in a magnetic structure of $Ni(t_{m1})/Ru_{22.2}Fe_{77.8}(1.6\ nm)/Ni(t_{m2})$. There are many structures in which it may be preferable for first and second magnetic layers 30, 40 to comprise Ni. Previously, the antiferromagnetic coupling between Ni magnetic layers was achieved by separating Ni magnetic layers using a film having a first layer of Co (or Fe, or a Co or Fe alloy), a second layer of Ru and a third layer of Co (or Fe, or a Co or Fe alloy). By employing $Ru_{100-x}Fe_x$ coupling layers 20, the addition of Co interface layers can be avoided.

There is large price difference between Fe and Ru. Ru is a member of the platinum group, making it an expensive material. Accordingly, other things being equal, a coupling layer 20 comprising a relatively high Fe concentration and relatively low concentration of Ru (as compared to a relatively low (or no) concentration of Fe and a relatively high concentration of Ru) is ideal for commercial applications as the price of the material used for the coupling layer is dramatically reduced.

Figure 16:
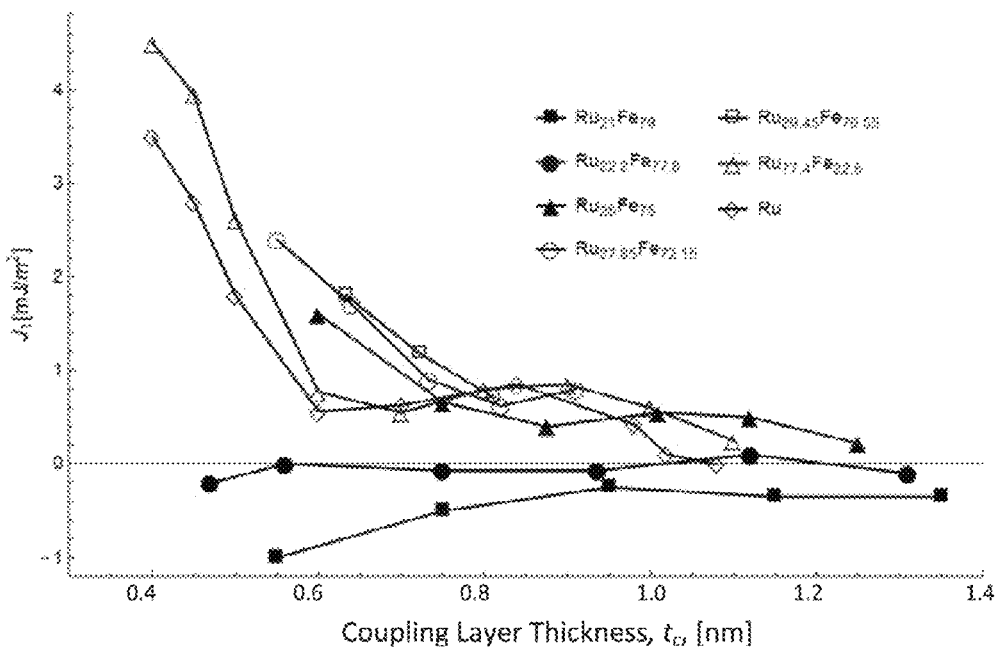
FIG. 16 depicts a plot of bilinear coupling strength, $J_1$, as a function of coupling layer thickness, $t_c$, for various magnetic structures fabricated with a coupling layer comprising $Ru_{100-x}Fe_x$ and one magnetic structure fabricated with a coupling layer comprising Ru.
Figure 17:
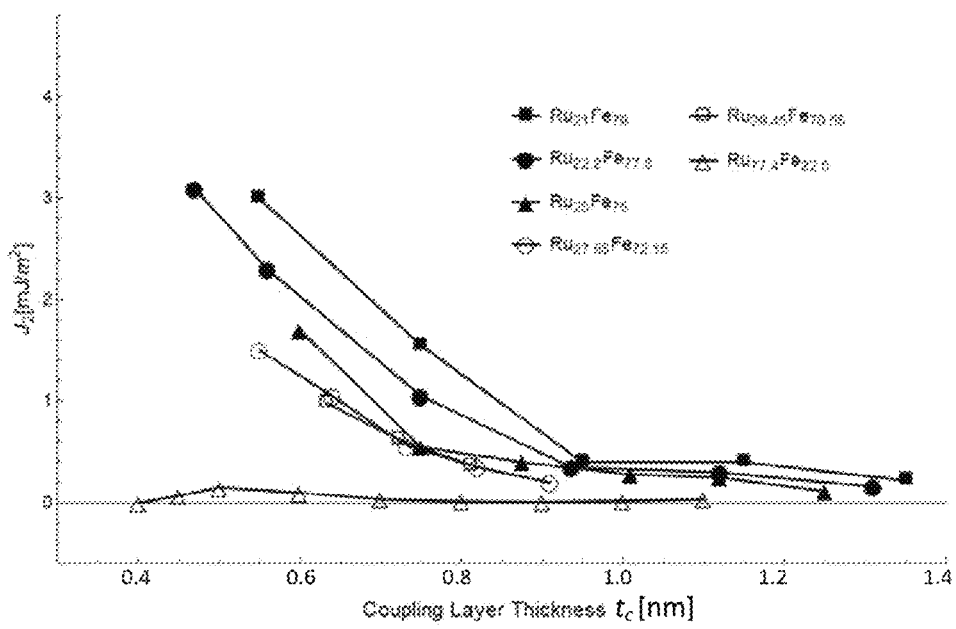
FIG. 17 depicts a plot of biquadratic coupling strength, $J_2$, as a function of coupling layer thickness, $t_c$, for various magnetic structures fabricated with a coupling layer comprising $Ru_{100-x}Fe_x$.

FIGS. 16 and 17 respectively show $J_1$ and $J_2$ for a number of magnetic structures 10 of $Co(2.0\ nm)/Ru_{100-x}Fe_x(t_c)/Co(2.0\ nm)$ where x=0 (not shown in FIG. 17), 22.6, 70.55, 72.15, 75, 77.8 and 79 and where $t_c$ is greater than 0.4 and less than 1.35 nm. FIG. 16 shows that $J_1$ is the largest for x=0 and 22.6 and $t_c$ between 0.4 and 0.5 nm. For x=70.55, 72.15 and 75, $J_1$ decreases with increasing $t_c$. For $t_c$ greater than 0.55 and less than 0.75 nm, $J_1$ for x=70.55, 72.15, and 75 is larger than $J_1$ for x=0 and 22.6. For x=77.8, $J_1$ is practically zero for $t_c$ between 0.45 and 1.3 nm in $Co(2.0\ nm)/Ru_{100-x}Fe_x(t_c)/Co(2.0\ nm)$. For x=79, $J_1$ is a negative value for $t_c$ greater than 0.55 and less than 1.35 nm in $Co(2.0\ nm)/Ru_{100-x}Fe_x(t_c)/Co(2.0\ nm)$. FIG. 16 therefore shows dependence of $J_1$ on x.

FIG. 17 shows that $J_2$ increases with increasing x. For x=22.6, $J_2$ is practically zero for $t_c$ greater than 0.4 and less than 1.1 nm. For x=0, 22.6, 70.55, 72.15, 75, 77.8 and 79, $J_2$ decreases with increasing $t_c$ for $t_c$ greater than approximately 0.47 and less than 0.9 nm. For x=77.8 and 79, $J_2$ is relatively large (e.g. comparable in magnitude to $J_1$ for a magnetic structure 10 of $Co(t_{m1})/Ru(0.4\ nm)/Co(t_{m1})$.

Figure 18:
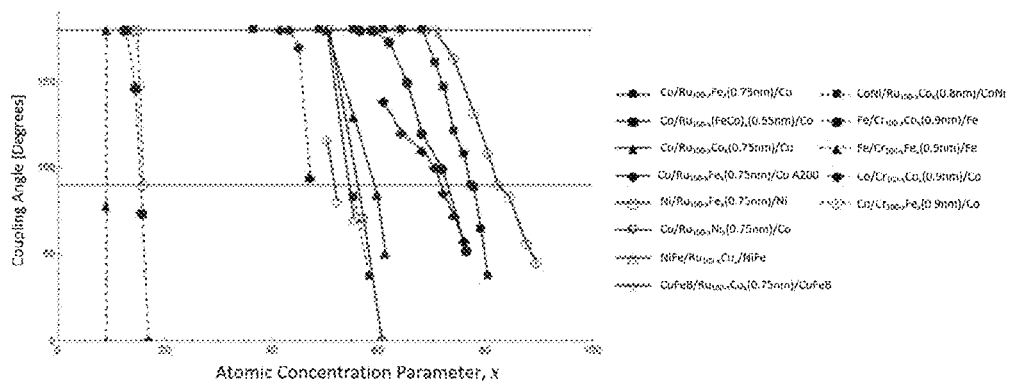
FIG. 18 depicts a plot of coupling angle as a function of atomic concentration parameter, x, for various magnetic structures having different coupling layers.

FIG. 18 depicts a plot of coupling angle φ as a function of the atomic concentration parameter, x, for various magnetic structures 10 having different coupling layers 20. In the magnetic structures 10 presented in FIG. 18, the coupling between the magnetic moment 32, 42 of first magnetic layer 30 and second magnetic layer 40 changes from antiferromagnetic to non-collinear to ferromagnetic as x increases. For lower values of x, the coupling between first and second magnetic layers 30, 40 is antiferromagnetic. As x increases further (i.e. the atomic concentration of Co, Ni, or Fe increases further relative to the atomic concentration of the first group element 24—Ru or Cr, as the case may be), the coupling transitions to non-collinear coupling, where the angle between the magnetic moments 32, 42 of first magnetic layer 30 and second magnetic layer 40 is a non-collinear angle. Further increases of x leads to ferromagnetic coupling, where the angle between the magnetic moments 32, 42 of first magnetic layer 30 and second magnetic layer 40 is 0°.

It may be desirable for the range of x in coupling layer 20, for which the coupling between magnetic layers 30, 40 is non-collinear (referred to herein as $\Delta x$), to be as large as possible. Increased $\Delta x$ enables better control of the angle $\varphi$ between magnetic moments 32, 42 of first and second magnetic layers 30, 40 in magnetic structure 10. Relatively large $\Delta x$ facilitates fabrication of coupling layer 20 by reducing the necessity for stringent manufacturing tolerances on x, and distribution of second group element 24 in first group element 22. In some embodiments, $\Delta x$ may depend on the composition of first and second magnetic layers 30, 40 and the composition and/or thickness $t_c$ of coupling layer 20, since the atoms of first and second magnetic layers 30, 40 and of coupling layer 20 may interact with one another (e.g. atoms from first and second magnetic layers 30, 40 may diffuse into coupling layer 20).

Pure (or almost pure) Ru coupling layers have been employed to establish antiferromagnetic coupling between magnetic layers. One aspect of the invention provides that by adding second group elements 24 (e.g. magnetic atoms) to Ru (e.g. a first group element 22), the angle of coupling $\varphi$ between first magnetic layer 30 and second magnetic layer 40 may be controlled as desired. FIG. 18 shows how the angle $\varphi$ between magnetic moments 32, 42 depends on x, where first and second magnetic layers 30, 40 comprise Co, Fe, Ni, NiFe, CoNi, and CoFeB. From FIG. 18 it follows that:

For a magnetic structure 10 of Ni($t_{m1}$)/Ru$_{100-x}$Fe$_x$(0.75 nm)/Ni($t_{m2}$), the coupling between first and second magnetic layers 30, 40 is observed to be antiferromagnetic if x is less than or equal to about 70.5. If x is greater than approximately 70.5 and less than approximately 89.5 (or even 94), the coupling angle $\varphi$ between first and second magnetic layers 30, 40 is non-collinear.

For a magnetic structure 10 of Co($t_{m1}$)/Ru$_{100-x}$Fe$_x$(0.75 nm)/Co($t_{m2}$), the coupling between first and second magnetic layers 30, 40 is observed to be antiferromagnetic if x is less than or equal to about 68.2. If x is greater than approximately 68.2 and less than approximately 80.4 (or even 82), the coupling angle $\varphi$ between first and second magnetic layers 30, 40 is non-collinear.

For a magnetic structure 10 of Co($t_{m1}$)/Ru$_{100-x}$Co$_x$(0.75 nm)/Co($t_{m2}$), the coupling between first and second magnetic layers 30, 40 is observed to be antiferromagnetic if x is less than or equal to about 50.3. If x is greater than approximately 50.3 and less than approximately 61.2 (or even 64), the coupling angle $\varphi$ between first and second magnetic layers 30, 40 is non-collinear.

For a magnetic structure of Co($t_{m1}$)/Ru$_{100-x}$(Co$_{100-y}$Fe$_y$)$_x$ (0.55 nm)/Co($t_{m2}$) where y=50, the coupling between first and second magnetic layers 30, 40 is antiferromagnetic if x is less than or equal to about 59.0. If x is greater than approximately 59.0 and less than approximately 76.5 (or even 80), the coupling angle $\varphi$ between first and second magnetic layers 30, 40 is observed to be non-collinear. The transition from antiferromagnetic to ferromagnetic coupling in the structure of Co($t_{m1}$)/Ru$_{100-x}$(Co$_{100-y}$Fe$_y$)$_x$(0.55 nm)/Co($t_{m2}$) is observed to occur for a larger atomic concentration parameter x than for Co/Ru$_{100-x}$Co$_x$(7.5 Å)/Co and at the lower magnetic atom concentration than for Co/Ru$_{100-x}$Fe$_x$ (7.5 Å)/Co as discussed in more detail in relation to FIG. 23.

After annealing of a magnetic structure 10 of Co($t_{m1}$)/Ru$_{100-x}$Fe$_x$(0.75 nm)/Co($t_{m2}$) at 200° C. (i.e. represented by solid line with solid diamonds in FIG. 18), non-collinear coupling is observed over a greater range of values of x. The occurrence of non-collinear coupling over a greater range of values of x (including lower values of x prior to annealing) may be due to the diffusion of magnetic material from magnetic coupling layers 30, 40 into coupling layer 20. It can also be seen that the angle $\varphi$ between the magnetic moments of the first and second Co layers 30, 40 changes from 140° for x=60.9, to 57.6° for x=76. The change in the angle $\varphi$ between first and second magnetization directions 32, 42 may be due to inter-diffusion of atoms at the interfaces between first and second magnetic layers 30, 40 and coupling layer 20.

From FIG. 18, it can be seen that changes in the material composition of magnetic layers 30, 40 for coupling layers 20 of RuCo may increase or decrease the values of x for which non-collinear coupling is observed. It should also be understood that changes in the material composition of magnetic layers 30, 40 for coupling layers 20 other than RuCo would have similar effects. For example, it is expected that replacing Co magnetic layers 30, 40 with CoNi for a coupling layer 20 of RuFe would decrease the atomic concentration parameter x values for which non-collinear coupling would be observed in a manner similar to the way that replacing Co magnetic layers 30, 40 with CoNi for a coupling layer 20 of RuCo is observed (form the data presented in FIG. 18) to decrease the atomic concentration parameter x values for which non-collinear coupling is observed.

Figure 19:
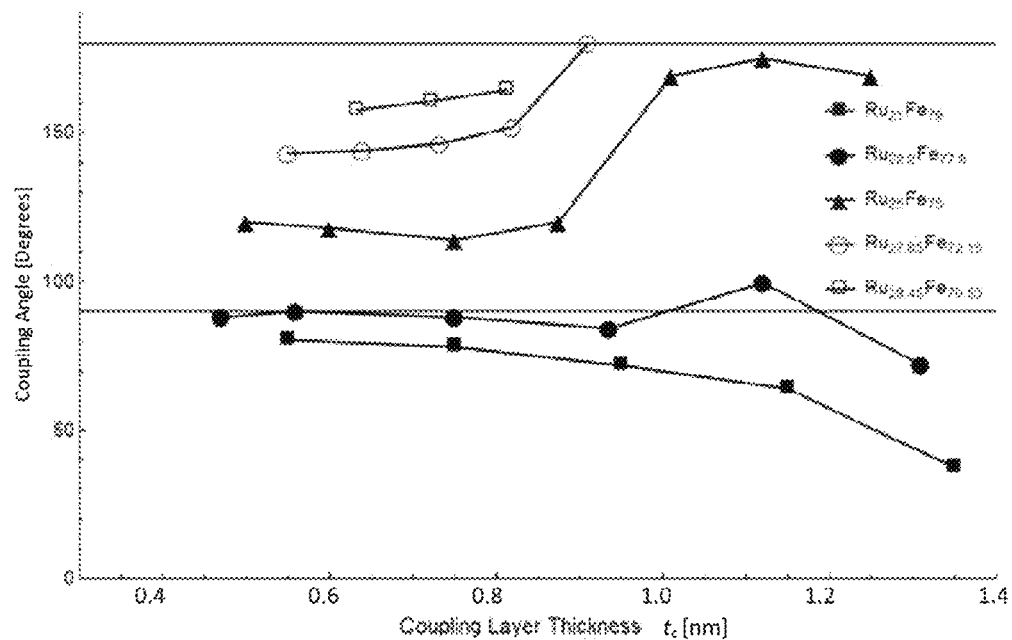
FIG. 19 depicts a plot of coupling angle as a function of coupling layer thickness, $t_c$, for various magnetic structures fabricated with a coupling layer comprising $Ru_{100-x}Fe_x$.

FIG. 19 shows a dependence of the coupling angle $\varphi$ of first and second magnetization directions 32, 42 on the thickness, $t_c$ for a number of magnetic structures 10 of Co($t_{m1}$)/Ru$_{100-x}$Fe$_x$($t_c$)/Co($t_{m2}$) having different values for their atomic concentration parameters x. From FIG. 19, it can be seen that for a given composition (e.g. atomic concentration parameter x) of the Ru$_{100-x}$Fe$_x$ coupling layer 20, the coupling angle $\varphi$ is relatively constant over a wide range of thickness values, $t_c$. For example FIG. 19 shows that for a coupling layer 20 of Ru$_{22.2}$Fe$_{77.8}$, the coupling angle $\varphi$ between magnetic moments 32, 42 is approximately 90° for $t_c$ greater than 0.47 nm and less than 0.94 nm. For a coupling layer 20 of Ru$_{25}$Fe$_{75}$, the coupling angle $\varphi$ between magnetic moments 32, 42 is relatively constant (e.g. 112°≤$\varphi$≤120°) for $t_c$ greater than 0.5 nm and less than 0.875 nm, and is relatively constant (e.g. 165°≤$\varphi$≤175°) for $t_c$ greater than 1.0 nm and less than 1.25 nm. For a coupling layer 20 of Ru$_{27.85}$Fe$_{72.15}$, the coupling angle $\varphi$ between magnetic moments 32, 42 is relatively constant (e.g. 142°≤$\varphi$≤152°) for $t_c$ greater than 0.55 nm and less than 0.82 nm. For a coupling layer 20 of Ru$_{29.45}$Fe$_{70.55}$, the coupling angle $\varphi$ between magnetic moments 32, 42 is relatively constant (e.g. 158°≤$\varphi$≤164°) for $t_c$ greater than 0.63 nm and less than 0.81 nm. From FIG. 19, it may be understood that in order to obtain a desired coupling angle $\varphi$ between magnetic moments 32, 42 in a magnetic structure of Co($t_{m1}$)/ $Ru_{100-x}Fe_x$($t_c$)/Co($t_{m2}$), it is relatively more important to precisely control the composition of the $Ru_{100-x}Fe_x$ coupling layer 20 (e.g. the atomic concentration parameter x) than to precisely control the coupling layer 20 thickness, $t_c$. Although FIG. 19 only shows data for values of x of 70.55, 72.15, 75, 77.8, and 79, it should be understood that values between 70.55 and 79 could be extrapolated from the FIG. 19 data. For example, it should be expected that a line representing x of 71 would fit between the data for x of 70.55 and 72.15. It should also be understood that the data presented in FIG. 19 could be extrapolated to $t_c$ of 0.4 nm.

Figure 20:
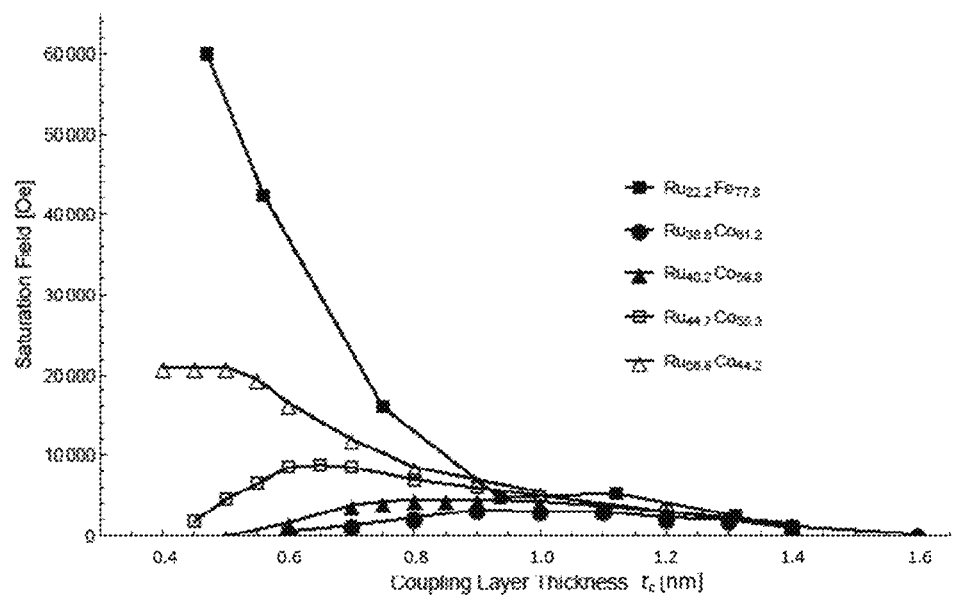
FIG. 20 depicts a plot of saturation field as a function of coupling layer thickness, $t_c$, for various magnetic structures fabricated with a coupling layer comprising $Ru_{100-x}Fe_x$ or a coupling layer comprising fabricated with a coupling layer comprising $Ru_{100-x}Co_x$.

FIG. 20 shows the saturation fields for a number of magnetic structures 10 of Co(2 nm)/$Ru_{100-x}Co_x$($t_c$)/Co(2 nm) and of Co(2 nm)/$Ru_{22.2}Fe_{77.8}$($t_c$)/Co(2 nm) as a function of $t_c$. For a coupling layer 20 of $Ru_{56.8}Co_{44.2}$ with $t_c$ of greater than 0.4 nm and less than 0.55 nm, the saturation field is relatively constant. For a coupling layer 20 of $Ru_{44.7}Co_{55.3}$ with a $t_c$ of greater than 0.55 nm and less than 0.9 nm, the saturation field is relatively constant. For coupling layers 20 of $Ru_{100-x}Co_x$ where x is greater than 59.8 and less than 61.2 and $t_c$ is greater than 0.7 nm and less than 1.2 nm, the saturation field is relatively constant. The saturation field for a coupling layer 20 of $Ru_{22.2}Fe_{77.8}$ is relatively constant when $t_c$ is greater than approximately 0.9 nm and less than approximately 1.3 nm. Such values of $t_c$ across which the saturation field is relatively constant may facilitate fabrication at relatively low cost and relatively high reliability (when compared to structures having lower values of $t_c$ across which the saturation field is relatively constant) and may thereby improve predictability and reliability of fabrication techniques and the resultant magnetic structures 10. For a coupling layer 20 of $Ru_{1-x}Fe_x$ at x=77.8 (and other values not shown), it is possible to achieve a substantially higher saturation field than for a coupling layer 20 of $Ru_{1-x}Co_x$ (as can be seen in FIG. 20 for $t_c$ of approximately 0.45 nm.

For a magnetic structure of Co($t_{m1}$)/Ru($t_c$)/Co($t_{m2}$), there may be intermixture or inter-diffusion of Co and Ru at the Co—Ru interfaces. Given that a Ru coupling layer 20 may only be a few monolayers in thickness (e.g. from less than 2 to about 10 monolayers), the Co concentration may be larger at the Co—Ru interfaces (e.g. the interfaces between coupling layer 20 and first and second magnetic layers 30, 40) and smaller near the center of the Ru coupling layer 20. When pure (or almost pure) Ru layers are less than about 5 monolayers thick, it may be observed that Co is present through the entire Ru coupling layer 20. Nonetheless, the amount of Co diffusing into Ru is likely to be too low to cause non-collinear coupling and only antiferromagnetic coupling is observed.

Figure 21:
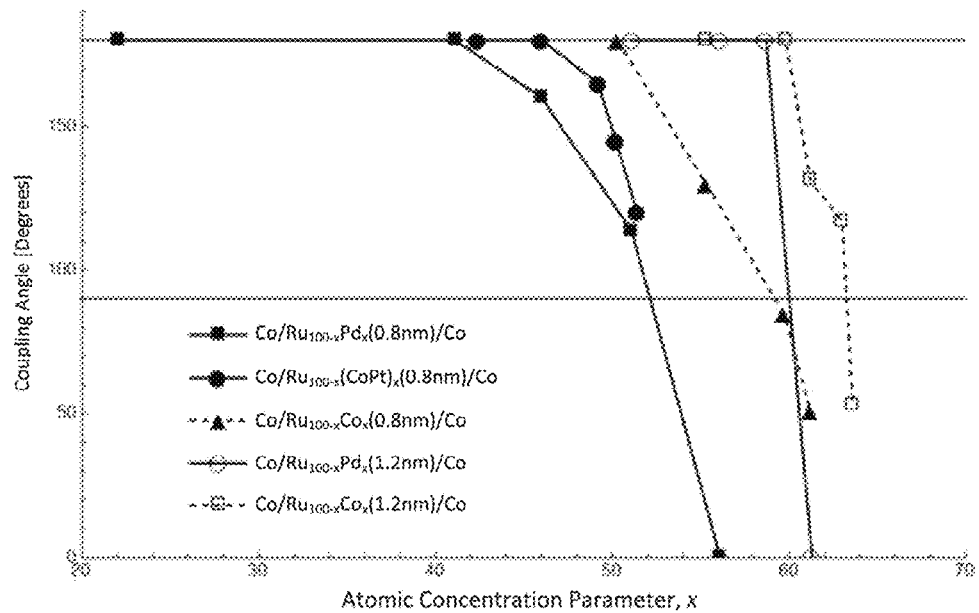
FIG. 21 depicts a plot of coupling angle as a function of atomic concentration parameter, x, for various magnetic structures having different coupling layers.

One aspect of the invention provides that magnetic polarization or polarizable materials such as Pt and Pd may be substituted for a portion of the at least one second (magnetic) group element 24, such that coupling layer 20 comprises at least one element from first group elements 22, at least one element from second group elements 24 and at least one polarizable element such as Pt or Pd. This can be seen for the structure of Co/$Ru_{1-x}$(CoPt)$_x$(0.8 nm)/Co shown in FIG. 21. Although non-collinear coupling may not be observed with a coupling layer of purely $Ru_{1-x}Pd_x$ or $Ru_{1-x}Pt_x$ (e.g. no second group element 24), if coupling layer 20 is thin enough such that Co (or some other magnetic elements) inter-diffuses into coupling layer 20 from the outer magnetic layers 30, 40, non-collinear coupling may be achievable. Such a phenomenon is depicted in FIG. 21. Where the coupling layer 20 is relatively thick (e.g. for the structure of Co($t_{m1}$)/$Ru_{1-x}Pd_x$(1.2 nm)/Co(($t_{m2}$) shown in FIG. 21), a sharp transition from antiferromagnetic to ferromagnetic coupling is observed with almost no non-collinear coupling. On the other hand, where coupling layer 20 is relatively thin (e.g. for the structure of Co($t_{m1}$)/$Ru_{1-x}Pd_x$(0.8 nm)/Co(($t_{m2}$) shown in FIG. 21), the $Ru_{1-x}Pd_x$ coupling layer 20 is thin enough for Co to inter-diffuse throughout its thickness such that the coupling layer 20 actually comprises $Ru_{1-y}$(CoPd)$_y$ where y>x and non-collinear coupling angles φ are observed. Thus, the addition of Pd or Pt in a thin Ru coupling layer 20 may assist in the occurrence of non-collinear coupling between Co magnetic layers 30, 40. The addition of Pd or Pt in a thin Ru coupling layer 20 may also assist in the occurrence of non-collinear coupling between non-Co magnetic layers 30, 40. For magnetic structures 10 where coupling layer 20 is thin, Pd and Pt may be added to coupling layer 20 to achieve non-collinear coupling.

Figure 22:
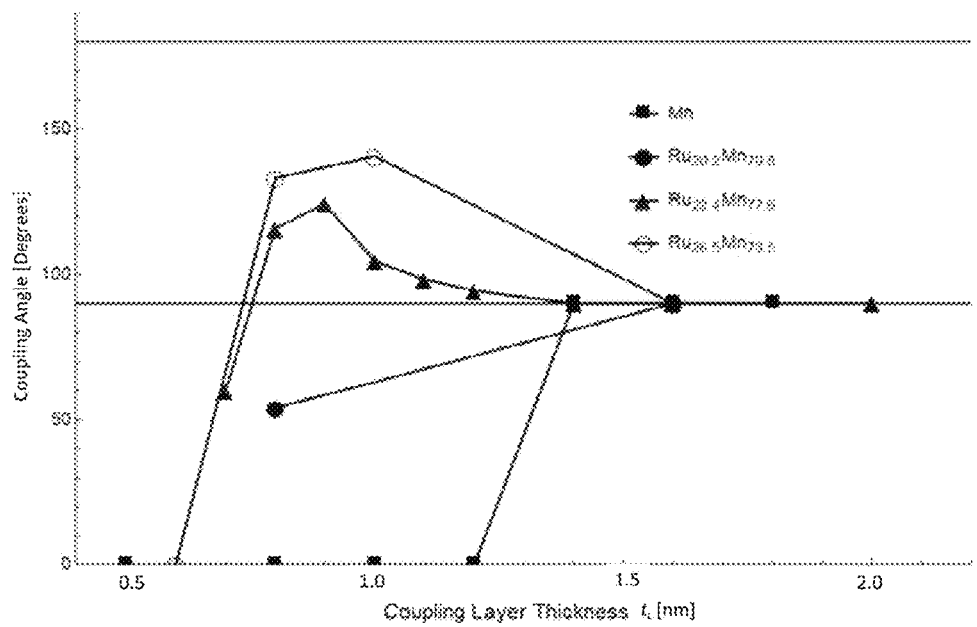
FIG. 22 depicts a plot of coupling angle as a function of coupling layer thickness, $t_c$, for various magnetic structures having different coupling layers.

FIG. 22 depicts the dependence of coupling angle φ on coupling layer thickness $t_c$ for a number of magnetic structures 10 of Co/$Ru_{1-x}Mn_x$(0.8 nm)/Co for x values of 73.5, 77.6, 79.8 and 100. For $t_c$ of less than or equal to 1.2 nm, pure (or relatively pure) Mn displays ferromagnetic coupling while for greater than 1.4 nm, pure (or relatively pure) Mn displays orthogonal non-collinear coupling. One explanation for the difference in behaviour for $t_c$ is less than or equal to 1.2 nm and for $t_c$ is equal to or greater than 1.4 nm could be that for lower values of $t_c$, there is diffusion of Co from magnetic layers 30, 40 into coupling layer 20 whereas for higher values of $t_c$, there is little to no effect caused by such diffusion.

For magnetic structures 10 of Co/$Ru_{1-x}Mn_x$($t_c$)/Co where x is greater than 73.5 and less than 79.8, non-collinear coupling is observed for $t_c$ is greater than 0.6 nm and less than 2.0 nm. For magnetic structures 10 of Co/$Ru_{1-x}Mn_x$($t_c$)/Co where x is 73.5 or 79.8, non-orthogonal non-collinear coupling is achievable for $t_c$ below 1.6 nm (likely due to diffusion of magnetic material from magnetic layers 30, 40 into the relatively thin coupling layer 20) while above $t_c$ of 1.6 nm, orthogonal non-collinear coupling is observed (likely due to the low "effective" concentration of magnetic material that diffuses into the Mn coupling layer 20 from the magnetic layers 30, 40—the low "effective" concentration because of the relatively large coupling layer 20 thickness $t_c$). Similarly, for magnetic structures 10 of Co/$Ru_{1-x}Mn_x$($t_c$)/Co where x is 77.6, non-orthogonal non-collinear coupling is achievable for $t_c$ below 1.4 nm (likely due to diffusion of magnetic material from magnetic layers 30, 40 into the relatively thin coupling layer 20) while above 1.4 nm, orthogonal non-collinear coupling is observed (likely due to the low "effective" concentration of magnetic material that diffuses into the Mn coupling layer 20 from the magnetic layers 30, 40).

While a coupling layer 20 of pure (or relatively pure) Mn may achieve orthogonal non-collinear coupling, non-collinear coupling is no longer observed when a small amount of a magnetic element is added to the pure (or relatively pure) Mn coupling layer 20. This can be observed in FIG. 22 below $t_c$=0.12 nm due to the diffusion of Co. This was also experimentally observed with a magnetic structure 10 of Co/$Mn_{96}Fe_4$(1.4 nm)/Co, for which non-collinear coupling was not observed. Furthermore, it is not possible to anneal structures having a coupling layer 20 of pure (or relatively pure) Mn, while maintaining non-collinear coupling since annealing encourages diffusion of magnetic material from first and second magnetic layers 30, 40 into coupling layer 20. For example, a magnetic structure 10 of Co/Mn(1.6 nm)/Co was created and was found to exhibit orthogonal non-collinear coupling. However, after magnetic structure 10 of Co/Mn(1.6 nm)/Co was annealed at 200° C., non-collinear coupling was no longer observed (see FIG. 1).

In some embodiments, it may be desirable to include two or more second group elements 24 (e.g. two magnetic elements) in a coupling layer 20. For example, it may be desired to include both Fe and Co, Fe and Ni, or Co and Ni in a coupling layer 20. Further, it may be desirable to include Fe and Mn, Co and Mn, or Ni and Mn.

Figure 23:
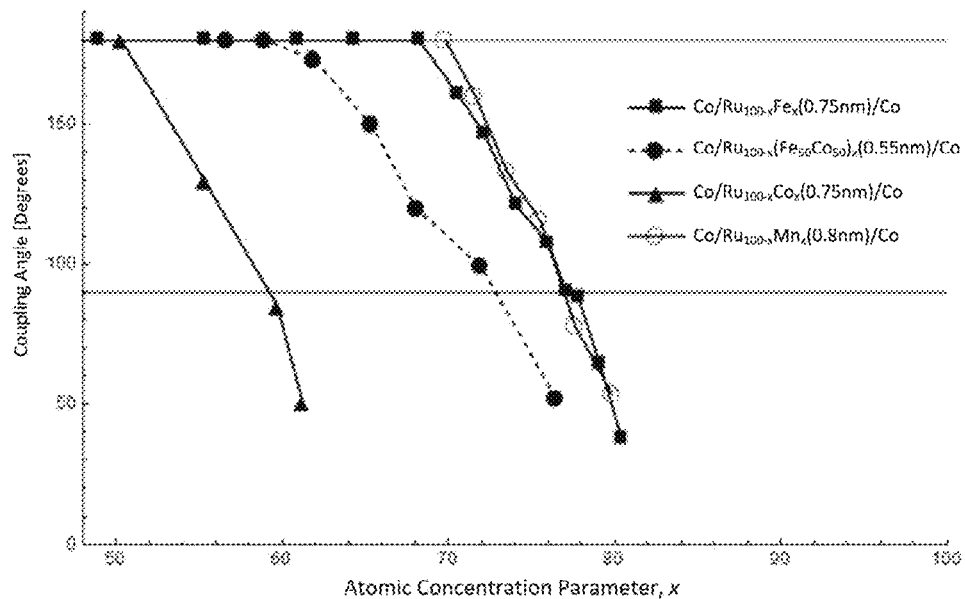
FIG. 23 depicts a plot of coupling angle as a function of atomic concentration parameter, x, for various magnetic structures having different coupling layers.

FIG. 23 depicts the dependence of coupling angle φ on atomic concentration parameter x for various magnetic structures 10 such as $Co/Ru_{1-x}(Fe_{50}Co_{50})_x(0.55\ nm)/Co$. Of note, the plotted values for as $Co/Ru_{1-x}(Fe_{50}Co_{50})_x(0.55\ nm)/Co$ fall between the plotted values for $Co/Ru_{1-x}Fe_x(0.75\ nm)/Co$ and $Co/Ru_{1-x}Co_x(0.75\ nm)/Co$. It is expected that such a relationship would hold true for other magnetic structures having two second group elements 24 (e.g. two magnetic elements). For example, it is expected that the values for $Co/Ru_{1-x}(Fe_yNi_{100-y})_x(t_c)/Co$ would fall between the plotted values for $Co/Ru_{1-x}Fe_x(t_c)/Co$ and $Co/Ru_{1-x}Ni_x(t_c)/Co$, that the values for $Co/Ru_{1-x}(Co_yNi_{100-y})_x(t_c)/Co$ would fall between the plotted values for $Co/Ru_{1-x}Co_x(t_c)/Co$ and $Co/Ru_{1-x}Ni_x(t_c)/Co$, that the values for $Co/Ru_{1-x}(Fe_yMn_{100-y})_x(t_c)/Co$ would fall between the plotted values for $Co/Ru_{1-x}Fe_x(t_c)/Co$ and $Co/Ru_{1-x}Mn_x(t_c)/Co$, etc. It is also expected that as y is increased for each of these structures, the coupling layer 20 and the resultant magnetic structure 10 will behave (in regard to the coupling layer 20 thickness $t_c$ for which non-collinear coupling is achieved for each value of x and the coupling angle φ that would be achieved for each value of x) more closely to a coupling layer having only the element for which the concentration is increased. For example, for a structure of $Co/Ru_{1-x}(Co_yNi_{100-x})_x(t_c)/Co$, an increase in y would make the structure behave more closely to $Co/Ru_{1-x}(Co)_x(t_c)/Co$ and, correspondingly, a decrease in y would make the structure behave more closely to $Co/Ru_{1-x}(Ni)_x(t_c)/Co$. Furthermore, it is expected that the first group element 22 (e.g. Ru in the above-discussed examples) could be replaced with other first group elements 22 with similar effect.

For example, in the case of $Co/Ru_{1-x}(Fe_yMn_{100-x})_x(t_c)/Co$, as y is increased, coupling layer 20 will behave more like $Co/Ru_{1-x}Fe_x(t_c)/Co$ and if y is decreased, coupling layer 20 will behave (in regard to the coupling layer 20 thickness $t_c$ for which non-collinear coupling is achieved for each value of x and the coupling angle φ that would be achieved for each value of x) more like $Co/Ru_{1-x}Mn_x(t_c)/Co$. This is discussed in more detail below in relation to FIGS. 24, 25 and 26.

Figure 24:
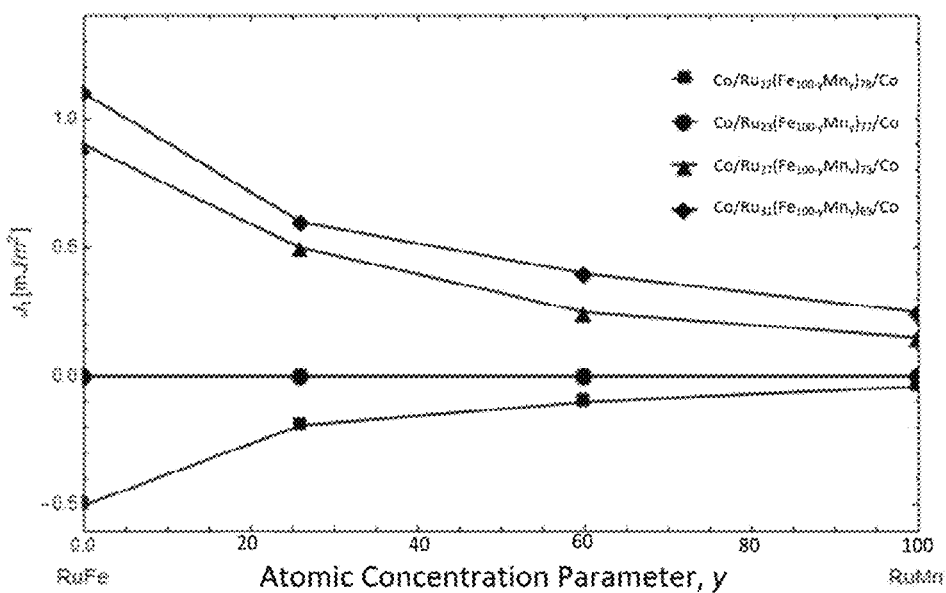
FIG. 24 depicts a plot bilinear coupling strength, $J_1$, as a function of atomic concentration parameter, x, for various magnetic structures fabricated with coupling layers comprising Ru, Fe and Mn.
Figure 25:
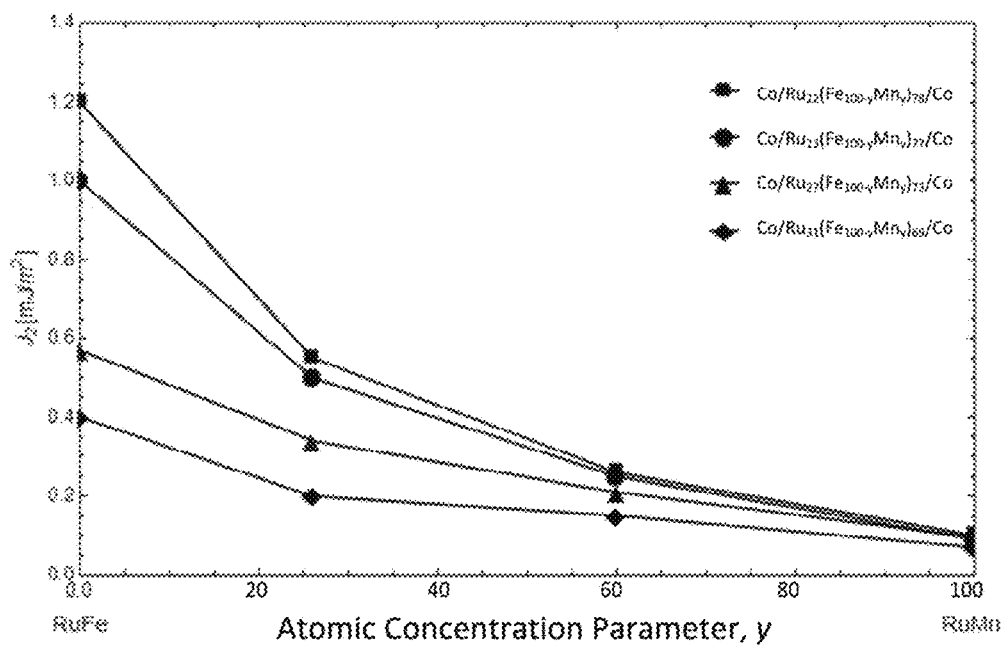
FIG. 25 depicts a plot biquadratic coupling strength, $J_2$, as a function of atomic concentration parameter, x, for various magnetic structures fabricated with coupling layers comprising Ru, Fe and Mn.

FIGS. 24 and 25 depict the dependence of bilinear coupling strength, $J_1$, and biquadratic coupling strength, $J_2$, on the atomic concentration parameter, y, for magnetic structures of $Co/Ru_{22}(Fe_{100-y}Mn_y)_{78}/Co$, $Co/Ru_{23}(Fe_{100-y}Mn_y)_{77}/Co$, $Co/Ru_{27}(Fe_{100-y}Mn_y)_{73}/Co$ and $Co/Ru_{31}(Fe_{100-y}Mn_y)_{69}/Co$. As can be seen from FIGS. 24 and 25, the magnitudes of bilinear coupling strength, $J_1$, and biquadratic coupling strength, $J_2$, decrease as the atomic concentration parameter, y, increases (e.g. as coupling layer 20 becomes more like RuMn and less like RuFe). While non-collinear coupling at various angles φ may still be achieved with values of atomic concentration parameter, y, greater than 68 and less than 80 (as can be seen by comparing magnetic structure 10 of $Co/RuMn(t_c)/Co$ to magnetic structure 10 of $Co/RuFe(t_c)/Co$ in FIG. 22), the coupling strength decreases as the atomic concentration parameter, y, increases (i.e. as the amount of Mn increases). Non-collinear, non-orthogonal coupling of magnetic structure 10 of $Co/RuMn(t_c)/Co$ may be achieved due to diffusion of Co from magnetic layers 30, 40 into coupling layer 20 when coupling layer 20 is sufficiently thing (e.g. $t_c$ is sufficiently low) that diffusion can occur throughout the entire (or close to the entire) thickness, $t_c$, of coupling layer 20.

Figure 26:
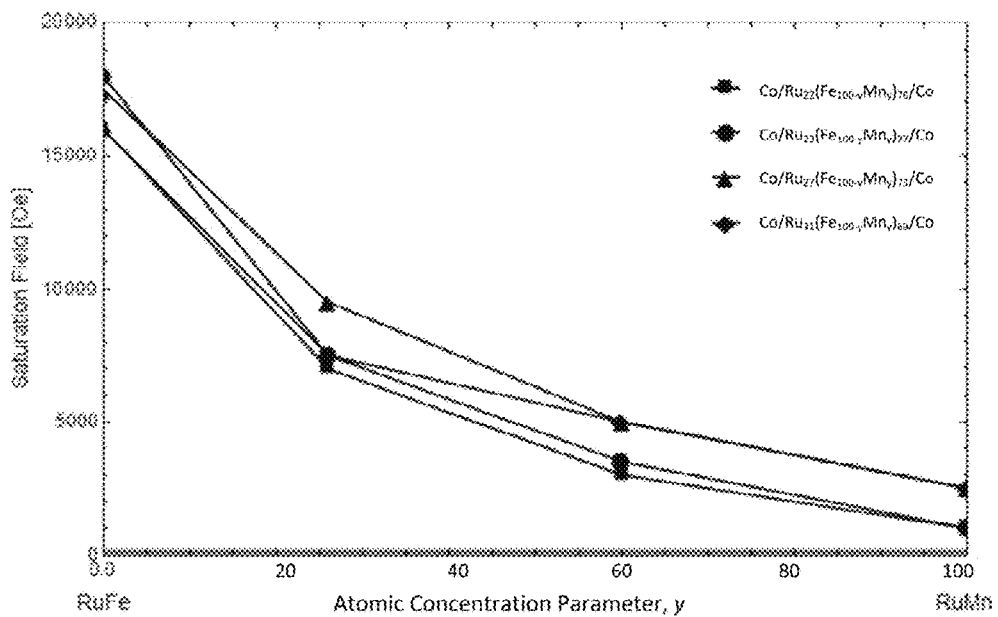
FIG. 26 depicts a plot of saturation field as a function of atomic concentration parameter, x, for various magnetic structures fabricated with coupling layers comprising Ru, Fe and Mn.

FIG. 26 depicts the dependence of saturation field on atomic concentration parameter, y, for magnetic structures 10 of $Co/Ru_{22}(Fe_{100-y}Mn_y)_{78}/Co$, $Co/Ru_{23}(Fe_{100-y}Mn_y)_{77}/Co$, $Co/Ru_{27}(Fe_{100-y}Mn_y)_{73}/Co$ and $Co/Ru_{31}(Fe_{100-y}Mn_y)_{69}/Co$. As can be seen from FIG. 26, the magnitude of the saturation field of the magnetic structures decreases as the atomic concentration parameter y increases (i.e. as the amount of Mn increases).

Although not mandatory and unless otherwise specified, first and second magnetization directions 32, 42 of the example embodiments and experimental results discussed in this section are "in-plane" magnetization directions—that is that first and second magnetization directions 32, 42 extend in an XY plane and do not extend substantially in the Z-direction. It should be understood that first and second magnetization directions 32, 42 (or some component thereof) could extend in the Z-direction, however, the resultant coupling angles may vary due to anisotropy of first and second magnetic layers 32, 42. Most magnetic materials have magnetic anisotropy. There are several sources of magnetic anisotropy such as: shape anisotropy due to material shape, surface anisotropy due to change in the symmetry between two materials, magnetocrystalline anisotropy due to spin orbital coupling and symmetry from crystal structure, and magnetoelastic anisotropy induced by expansion or contraction of magnetic material. The magnetic anisotropy may modify the coupling angle between first and second magnetization direction 32, 42.

Magnetic anisotropy can therefore be taken into consideration to obtain a desired coupling angle between magnetic moments 32, 42 of magnetic layers 30, 40. In addition, magnetic fields that are produced by other magnetic materials or external fields may also change the coupling angle between magnetic moments 32, 42 of magnetic layers 30, 40.

Applications

Magnetic structure 10 and/or coupling layer 20 may be incorporated into many different applications or devices such as sensors, magnetic memory, oscillators, diodes, microwave detectors, temperature sensors, energy harvesters or combinations of two or more of the above applications or devices. Devices that incorporate magnetic structure 10 and/or coupling layer 20 may be reduced in size as compared to prior art devices, may require less energy as compared to prior art devices as described herein, may be more reliable as compared to prior art devices and/or may be faster than prior art devices.

In some embodiments, magnetic structure 10 and/or coupling layer 20 as described herein is incorporated into a sensor. By incorporating magnetic structure 10 into a sensor, magnetic structure 10 may serve to replace antiferromagnetic pinning layers traditionally used in magnetic sensors and may thereby reduce the size of such sensors. Magnetic structure 10 may allow for stronger magnetic coupling between magnetic layers of the sensor which in turn increases the range of applied magnetic fields that may be sensed by such a sensor. Magnetic structure 10 may also allow for easier fabrication of sensors and may reduce or eliminate a need for annealing steps normally involved in fabrication of prior art sensors.

The following magnetic devices (e.g. magnetic devices 100, 200, 300, 400, 500 etc.) may be employed as or as part of sensors, magnetic memory, oscillators, diodes, microwave detectors, temperature sensors, energy harvesters, combinations of two or more of the above and/or other devices used for other applications. In some circumstances, one or more of the following magnetic devices are described in the context of a sensor or of a magnetic memory device in order to provide a more full disclosure of how a particular magnetic device may be employed. However, it should be understood that each of the following devices (e.g. magnetic devices 100, 200, 300, 400, 500 etc.) can nonetheless be employed as or as part of sensors, magnetic memory, oscillators, diodes, microwave detectors, temperature sensors, energy harvesters, combinations of two or more of the above and/or other devices used for other applications.

Magnetic structures 10, and/or coupling layers 20 disclosed herein may be employed in a device to, for example, set a free magnetization direction of the device at a non-collinear angle with respect to other (free or fixed) magnetization directions within the device, to set a fixed magnetization direction of the device at a non-collinear angle with respect to other magnetization directions within the device, or to set a free magnetization direction of the device at a non-collinear angle with respect to a fixed magnetization direction of the device. By employing magnetic structure 10, and/or coupling layer 20 as described herein, it may be possible to achieve stable states at angles that would not otherwise be possible, such as in FIG. 28 described further herein.

Figure 27A:
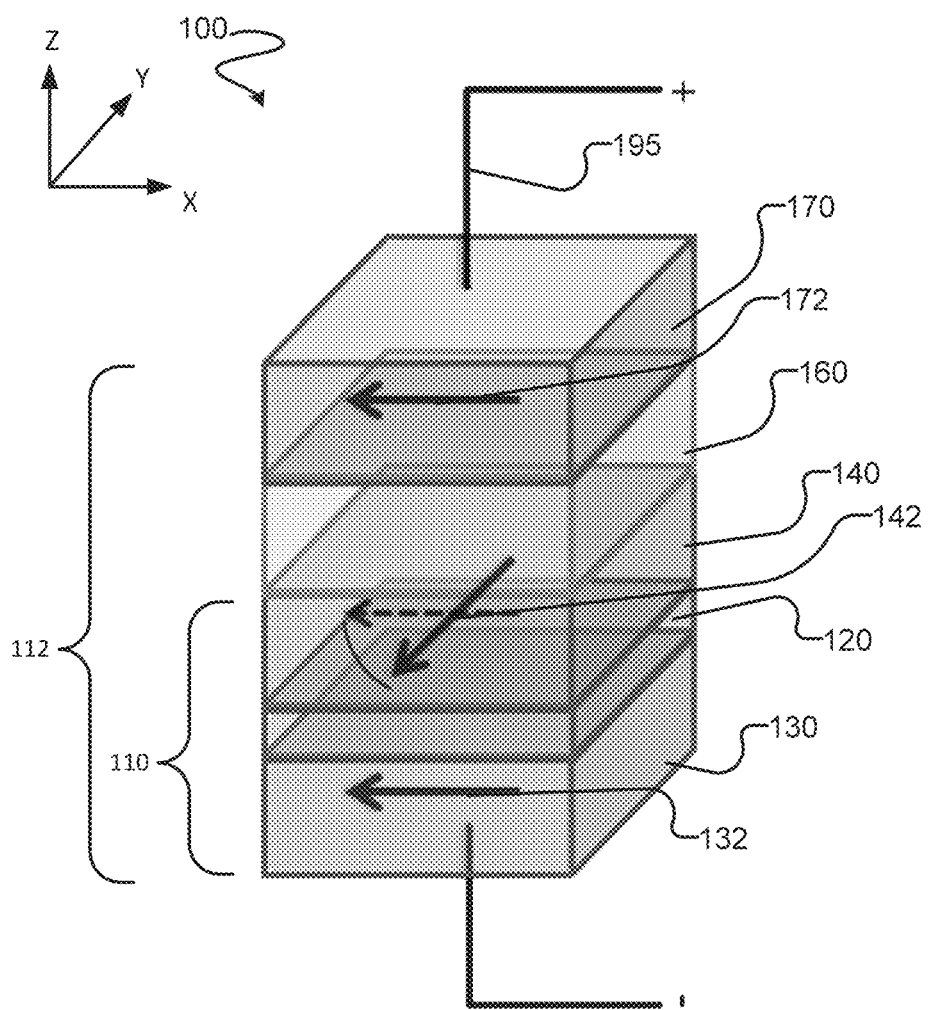
FIG. 27A schematically depicts a magnetic device according to a particular embodiment of the invention.

FIG. 27A is a schematic diagram of a magnetic device 100 according to one aspect of the invention. In some embodiments, magnetic device 100 may be used as, or as part of, a sensor. Magnetic device 100 comprises a magnetic structure 110 that may be substantially similar to any magnetic structures 10 described herein. Magnetic structure 110 comprises a first magnetic layer 130, a coupling layer 120, and a second magnetic layer 140. First magnetic layer 130 of magnetic device 100 has a first magnetization direction 132, second magnetic layer 140 has a second magnetization direction 142. First and second magnetic layers 130, 140 are coupled to one another across coupling layer 120, such that their respective magnetization directions 132, 142 are oriented at a non-collinear angle, $\varphi$, with respect to one another in the absence of an external applied magnetic field. Magnetic device 100 may also optionally comprise a magnetoresistive layer 160 separating a second magnetic layer 140 and a third magnetic layer 170. Together, first magnetic layer 130, coupling layer 120, second magnetic layer 140, magnetoresistive layer 160 and third magnetic layer 170 may be referred to as body 112 of device 100 (or device body 112). In practice, magnetic device 100 may be used to detect externally applied magnetic fields by measuring changes of resistance across body 112 due to effects on magnetic device 100 caused by applied magnetic fields—e.g. external magnetic fields in a vicinity of device 100.

Third magnetic layer 170 may be substantially similar to one or both of first and second magnetic layers 130, 140, although this is not mandatory. Third magnetic layer 170 has a third magnetization direction 172.

Magnetoresistive layer 160 may optionally be employed to amplify resistance changes across magnetic device 100. Magnetoresistive layer 160 is not mandatory as magnetic structure 10 itself may exhibit changes in resistance in response to externally applied magnetic fields. However, such changes in resistance of magnetic structure 10 may be relatively small and it may be beneficial to employ magnetoresistive layer 160.

Magnetoresistive layer 160 may comprise any suitable magnetoresistive material that amplifies changes in electrical resistance across body 112 in response to changes in the relative angle between magnetization direction 142 and magnetization direction 172. For example, magnetoresistive layer 160 may comprise a conductive magnetoresistive layer such as but not limited to Cu, Cr, Ru, Al, Ag, and alloys thereof in addition to magnetoresistive layers that are commonly used for GMR or a non-conductive magnetoresistive layer such as, but not limited to, magnesium oxide (MgO) and aluminum oxide ($AlO_x$) in addition to magnetoresistive layers that are commonly that are used for TMR.

First magnetization direction 132 may be described as being "fixed" as compared to second magnetization direction 142 which may be described as being "free". In other words, second magnetization direction 142 may change directions in response to an externally applied magnetic field having a first magnitude, a, while first magnetization direction 132 would remain constant in response to the externally applied magnetic field having the first magnitude, a. In practice, as used throughout this description and the accompanying claims, unless the context dictates otherwise, a magnetization direction that is "constant" or "fixed" may actually vary or fluctuate by a small amount but maintains substantially the same orientation in response to applied magnetic field, a, when compared to corresponding changes in the "free" magnetization direction in response to the same applied magnetic field, a. First magnetization direction 132 (the "fixed" magnetization direction of the FIG. 27A embodiment), might only change direction in response to an externally applied magnetic field greater or equal to a second magnitude, b, where b is greater than a. In some embodiments, b is substantially greater than a. For example, b may be double a or b may be an order of magnitude greater than a.

Like first magnetization direction 132, third magnetization direction 172 may also be fixed as compared to second magnetization direction 142. Like first magnetization direction 132, third magnetization direction 172 would remain substantially constant in response to the externally applied magnetic field having the first magnitude, a, and might only change in response to an externally applied magnetic field greater or equal to a third magnitude, c, wherein c is greater than a. The third magnitude, c, may be greater than, less than or equal to the second magnitude, b.

In practice, it is preferable that magnetic device 100 is employed in the presence of external magnetic fields having a magnitude less than each of the second and third magnitudes, b and c. Accordingly, unless the context dictates otherwise, when a magnetization direction is discussed herein as being "fixed", the magnetization direction will not change appreciably in the presence of an applied magnetic field, where the applied magnetic field has a magnitude less than the operating limits of the device. On the other hand, unless the context dictates otherwise, when a magnetization direction is discussed herein as being "free", the magnetization direction may be changeable in the presence of an applied magnetic field where the applied magnetic field has a magnitude less than the operating limits of the device.

Any suitable apparatus or method may be employed to fix first and third magnetization directions 132, 172. For example, the materials of first and third magnetic layers 130, 170 may be chosen such that magnetization directions 132, 172 are fixed while second magnetization direction 142 is free. Alternatively, additional magnetic layers may be ferromagnetically coupled or coupled by a coupling layer (e.g. ferromagnetically, antiferromagnetically or non-collinearly coupled) to one or both of first and third magnetic layers 130, 170 to thereby fix first and third magnetization directions 132, 172. In some embodiments, a secondary applied field may be applied to fix one or more of first and third magnetization directions 132, 172.

The angular difference between first and second magnetization directions 132, 142 may be described as first angle, a, and the angular difference between first and third magnetization directions 132, 172 may be described as second angle, R.

In some embodiments, in the absence of applied field or heat, first angle, a is approximately 90° and second angle, β is approximately 180°. Such embodiments, may improve the sensitivity of magnetic device 100 since the change in resistance of magnetic device 100 is relatively more linear when second and third magnetization directions 142, 172 are at 90° with respect to one another. In other embodiments, first angle, a and second angle, β are not equal to 90° and 180° respectively but may be chosen such that second and third magnetization directions 142, 172 are at 90° with respect to one another.

Although the FIG. 27A embodiment of magnetic device 100 depicts first and second and third magnetization directions 132, 142, 172 as extending within the X-Y plane, this is not mandatory. First and second and third magnetization directions 132, 142, 172 may have any combination of X, Y and Z components.

A circuit 195 may be connected to first and third magnetic layers, 130, 170 to measure a resistance across body 112, as is known in the art. Circuit 195 may include any suitable resistance measuring component(s) to measure resistance across body 112 of magnetic device 100.

When the angle between second magnetization direction 142 and third magnetization direction 172 changes in response to any applied magnetic field having a first magnitude, a (less than the second and third magnitudes, b and c), a resultant change in resistance of body 112 occurs. The resultant change in resistance of body 112 may optionally be magnified due magnetoresistive layer 160 located between second and third magnetic layers 140, 170. Magnetic device 100 can be used to determine the presence and/or direction and/or magnitude of an applied magnetic field by measuring the resistance across body 112. In some embodiments, magnetoresistive layer 160 is not employed and the resistance across body 112 may still be measured, although the change in resistance may be smaller.

In some embodiments, magnetic device 100 may be employed as a temperature sensor. FIG. 27B is a plot depicting the relationship of the non-collinear coupling angle, a, between first and second magnetic layers 130, 140 on temperature. As can be seen from FIG. 27B, the non-collinear coupling angle, a, between first and second magnetic layers 130, 140 may be temperature dependent. The solid line with diamonds represents a first sample configured to detect temperatures below 300K. The first sample comprised a $Ru_{100-x}Co_x$ coupling layer 120. The solid line with circles represents a second sample configured to detect temperatures near 300K. The second sample comprised a $Ru_{100-x}Co_x$ coupling layer 120 where x is different than for the first sample. The solid line with triangles represents an extrapolation of the second sample data based on the first sample data for higher temperatures than have been measured for the second sample. Since the non-collinear coupling angle, α, between first and second magnetic layers 130, 140 changes with changes in temperature and the resistance of magnetic device 100 changes with changes in the non-collinear coupling angle, α, between first and second magnetic layers 130, 140, the temperature of magnetic device 100 may be determined based on changes in resistance of magnetic device 100. Temperature magnetic device 100 may be configured for different temperature ranges by changing the atomic concentration parameter, x, of coupling layer 120, the coupling layer 120 thickness, $t_c$, the coupling layer 120 composition, the magnetic layer 30, 40 thickness $t_{m1}$, $t_{m2}$, or the magnetic layer 30, 40 composition as discussed herein such that a linear or generally linear region of the dependence of coupling angle, α, on temperature is centered or near-centered on a desired temperature range.

In some embodiments, magnetic structures 10 and/or coupling layers 20 disclosed herein may be incorporated into a magnetic memory device. A magnetic memory device incorporating magnetic structure 10 may function with reduced current (relative to prior art devices without non-collinearly coupled magnetic structure 110) to switch between states and may have greater reliability of switching (relative to prior art devices without non-collinearly coupled magnetic structure 110). Moreover, switching between states may require less time and/or current due to the smaller change in angle required between states, as compared to prior art magnetic memory devices (without non-collinearly coupled magnetic structure 110).

Figure 28:
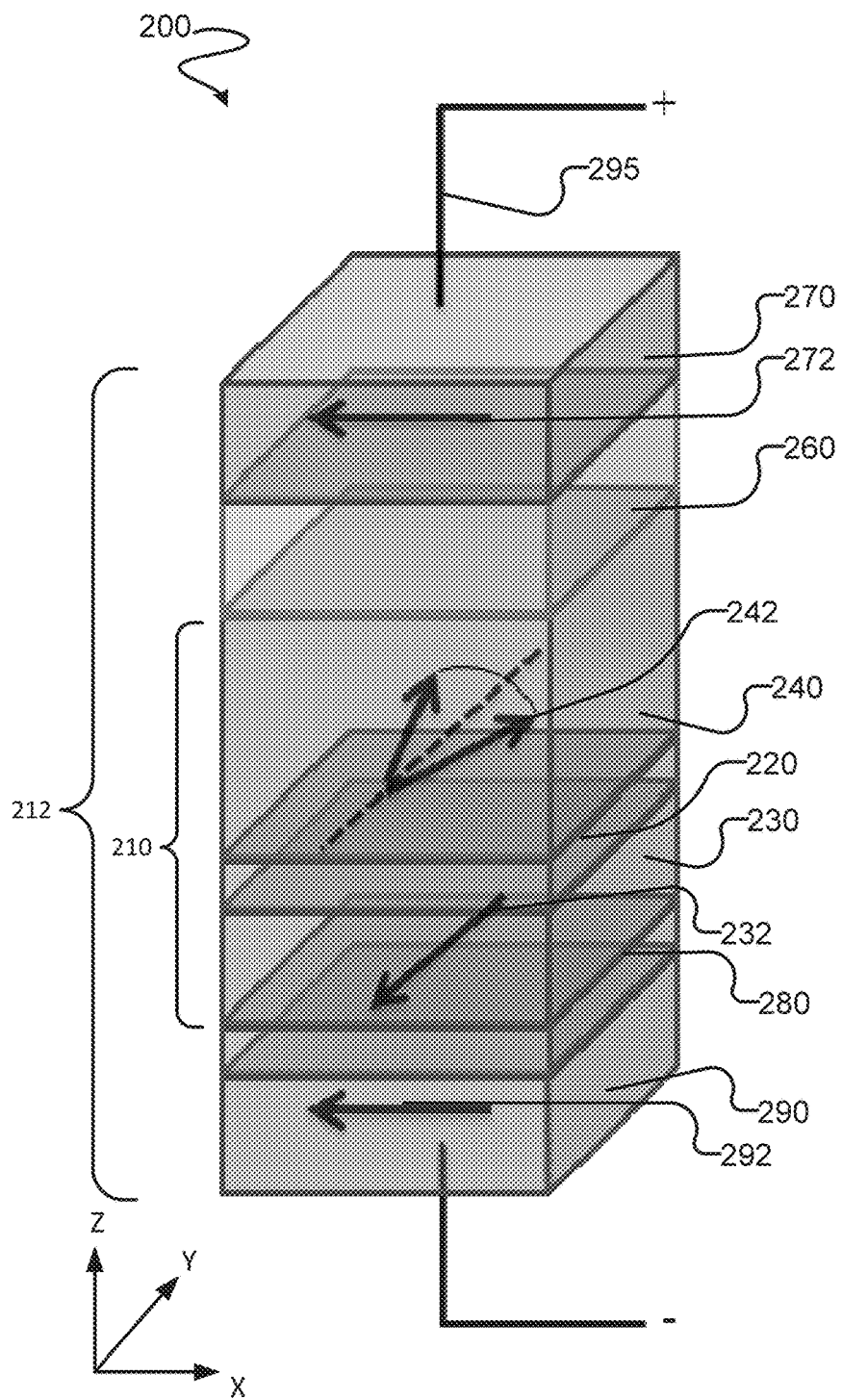
FIG. 28 schematically depicts a magnetic device according a particular embodiment of the invention.

FIG. 28 is a schematic diagram of a magnetic device 200 according to one embodiment of the invention. Magnetic device 200 may be employed as a memory device. Magnetic device 200 may be substantially similar to magnetic device 100 except as described below. For example, magnetic device 200 comprises a magnetic structure 210 similar to magnetic structure 110, first, second and third magnetic layers 230, 240, 270 having first, second and third magnetization directions 232, 242, 272 similar to first, second and third magnetic layers 130, 140, 170 having first, second and third magnetization directions 132, 142, 172, a first coupling layer 220 similar to coupling layer 120, a magnetoresistive layer 260 similar to magnetoresistive layer 160 and circuit 295 similar to circuit 195. Magnetic device 200 differs from magnetic device 100 in that it also includes an optional second coupling layer 280 and an optional fourth magnetic layer 290. In the illustrated embodiment, second coupling layer 280 and fourth magnetic layer 290 are employed to fix first magnetization direction 232 and may be replaced by any other suitable mechanism for fixing first magnetization direction 232. Together, first, second, third and fourth magnetic layers 230, 240, 270, 290, first and second coupling layers 220, 280, and magnetoresistive layer 260 may be referred to as body 212 of device 200 (or device body 212).

Fourth magnetic layer 290 may be substantially similar to any of the magnetic layers disclosed herein (e.g. magnetic layers, 30, 40, 70, 130, 140, 170, 230, 240, 270, etc.), although this is not mandatory.

Coupling layer 220 may be substantially similar to any of the coupling layers disclosed herein (e.g. coupling layer 20, 120, etc.), although this is not mandatory.

First and second magnetic layers 230, 240 may be non-collinearly coupled in a first state in which the first magnetization direction 232 is oriented at θ° (e.g. in a clockwise direction) relative to the second magnetization direction or a second state in which the first magnetization direction 232 is oriented at −θ° (e.g. in a counter-clockwise direction) relative to the second magnetization direction.

First magnetization direction 232 may be fixed as compared to second magnetization direction 242 which may be described as being free. Like first magnetization direction 232, third magnetization direction 272 may also be fixed as compared to second magnetization direction 242.

Any suitable apparatus or method may be employed to fix first and third magnetization directions 232, 272. For example, the materials of first and third magnetic layers 230, 270 may be chosen such that magnetization directions 232, 272 are fixed. Alternatively, additional magnetic layers, such as fourth magnetic layer 290 may be coupled by a coupling layer such as second coupling layer 280 to one or both of first and third magnetic layers 230, 270 to thereby fix first and third magnetization directions 232, 272.

In FIG. 28, first and second magnetization directions 232, 242 are depicted as being in-plane (e.g. in an XY plane defined by the X and Y directions). This is not mandatory. First and/or second magnetization directions 232, 242 may extend partially or completely in the Z direction or one or more of first and second magnetization directions 232, 242 may extend in some combination of the X, Y and Z directions. For example, FIG. 30A depicts first and second magnetization directions 432, 442 that extend out of the XY plane.

Second magnetization direction 242 of second magnetic layer 240 can be caused to change between its first and second states by spin torque transfer (e.g. applying a current through circuit 295). By passing the current through third magnetic layer 270, electric current is polarized. By passing the polarized current through second magnetic layer 240, the polarized current may cause the second magnetic layer 240 to change from its first stable state to its second stable state (or vice versa). The amount of charge for second magnetic layer 240 to change between its states may depend on the angular difference between the first and second states of second magnetic layer 240. The charge may be reduced by reducing the angular difference between the first and second states of second magnetic layer 240. Reducing the angular difference between the first and second states of second magnetic layer 240 may be accomplished with non-collinear coupling (e.g. by employing magnetic structure 10 and/or coupling layer 20, as described herein). In some embodiments, by reducing the angular difference between the first and second states of second magnetic layer 240, the switching time between states may correspondingly decrease (i.e. switching will be faster). Therefore, in some embodiments, it may be desirable reduce the angular difference between the first and second states of second magnetic layer 240 to achieve suitably fast switching times for a desired application. Conversely, increasing the angular difference between the first and second states of second magnetic layer 240 may increase the difference between the resistance across magnetic device 200 in the first state of second magnetic layer 240 and the resistance across magnetic device 200 in the second state of second magnetic layer 240. Therefore, in some embodiments, it may be desirable to increase the angular difference between the first and second states of second magnetic layer 240 to achieve sufficiently large resistance changes between states for a desired application.

By coupling first and second magnetization directions 232, 242 at a non-collinear angle, the amount of current to change second magnetic layer 240 between its first and second states may be reduced considerably as compared to ferromagnetic coupling and/or antiferromagnetic coupling. Moreover, the time to switch between stable states may be reduced and the reliability of switching of magnetic device 200 may be relatively greater than prior art devices which do not have non-collinearly coupled structure 210.

When second magnetic layer 240 is in its first state, the resistance across body 212 (as can be measured by circuit 295) may have a first value. When second magnetic layer 240 is in its second state, the resistance across body 212 (as can be measured by circuit 295) may have a second value, different from the first value. Therefore, by determining the resistance across body 112 (as can be measured by circuit 295), it is possible to determine the state of second magnetic layer 240. Information such as a bit can therefore be stored on magnetic device 200. For example, the first state of second magnetic layer 240 (and its associated first value of resistance) could correspond to a "0" bit and the second state of second magnetic layer 240 (and its associated second value of resistance) could correspond to a "1" bit.

Figure 29:
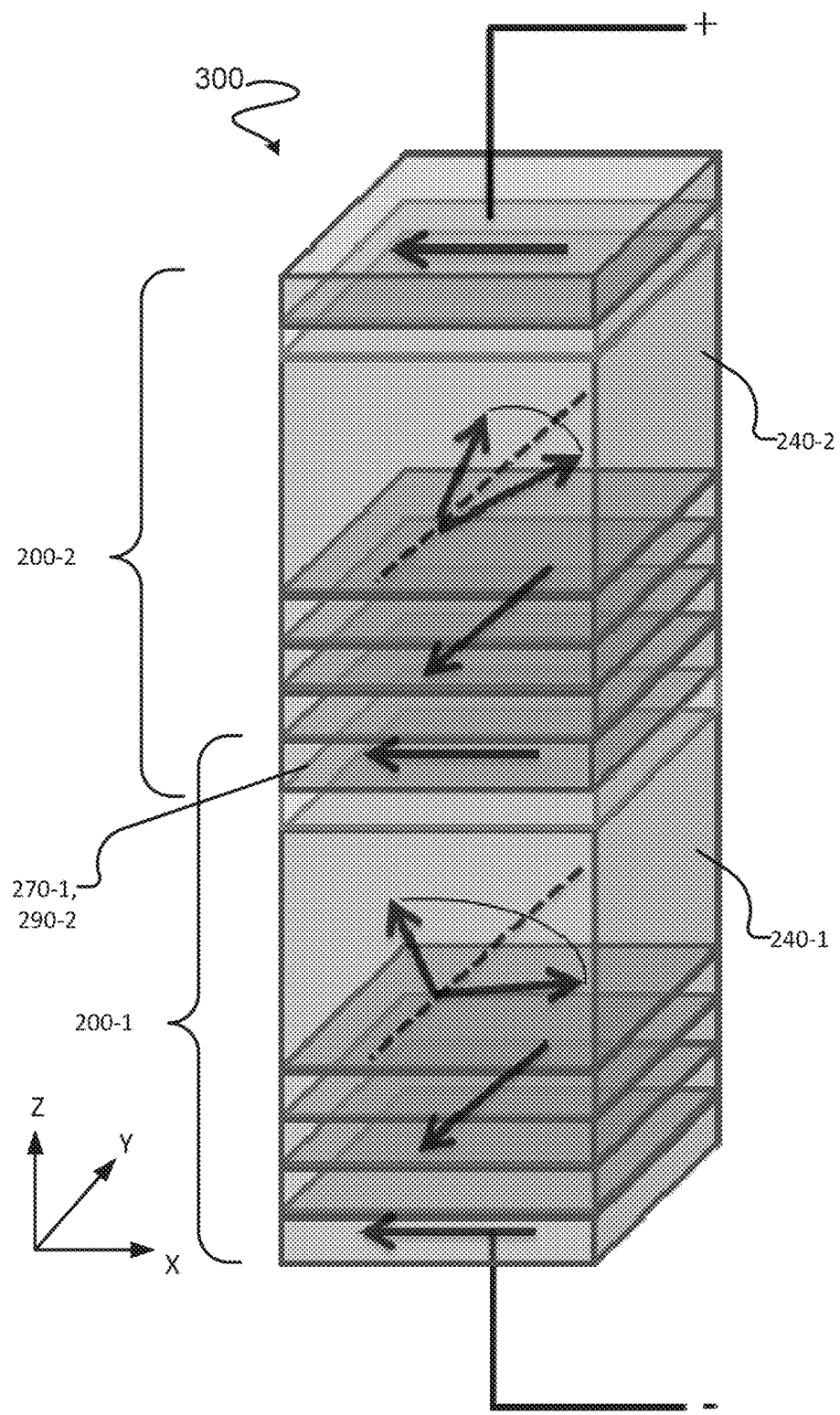
FIG. 29 schematically depicts a magnetic device according another particular embodiment of the invention.

Additional layers may be added to magnetic device 200 to allow additional information to be stored in magnetic device 200. For example, FIG. 29 is a schematic depiction of a magnetic device 300 according to another embodiment of the invention. Magnetic device 300 is substantially similar to magnetic device 200 except in that it comprises two magnetic devices 200-1, 200-2 stacked on top of one another wherein a third magnetic layer 270-1 of the first magnetic device 200-1 also serves as a fourth magnetic layer 290-2 of the second magnetic device 200-2.

By stacking two magnetic memory devices 200-1, 200-2 on top of one another, magnetic device 300 may have four separate states that could represent information stored on magnetic device 300. In particular, magnetic device 300 may have:

state A in which the second magnetic layer 240-1 of the first magnetic device 200 is in a first state and the second magnetic layer 240-2 of the second magnetic device 200 is in a first state;

state B in which the second magnetic layer 240-1 of the first magnetic device 200 is in a first state and the second magnetic layer 240-2 of the second magnetic device 200 is in a second state;

state C in which the second magnetic layer 240-1 of the first magnetic device 200 is in a second state and the second magnetic layer 240-2 of the second magnetic device 200 is in a first state; and state D in which the second magnetic layer 240-1 of the first magnetic device 200 is in a second state and the second magnetic layer 240-2 of the second magnetic device 200 is in a second state.

First magnetic layer 240-1 may use a different switching current (and/or different switching current characteristics) to switch between its first and second states as compared to second magnetic layer 240-2. Accordingly, the state of second magnetic layer 240-1 may be changed independently of the state of second magnetic layer 240-2. The switching current for first magnetic layer 240-1 may differ from the switching current for second magnetic layer 240-1 in that the polarization could be different, the amount of time during which the current is applied could be different, etc. In some embodiments, the switching current is dependent upon the magnitude of the change of angle between first and second states (e.g. more current may be required to change between states that have a larger angular difference). The magnitude of the change of angle between first and second states may be reduced by employing non-collinear coupling (e.g. by employing magnetic structures 10 and/or coupling layer 20) relative to prior art devices which do not have non-collinearly coupled structures 210.

While FIG. 29 depicts a magnetic device 300 having two layers of magnetic devices 200, it should be understood that more than two layers of devices 200 can be stacked to create more complex memory states. For example, with three magnetic devices 200 stacked on top of one another, there would be eight possible memory states. As more layers are added, the potential number of memory states increases by a power of two.

Magnetic structures 10 and/or coupling layers 20 may be employed in an oscillator device, diodes, microwave detectors, energy harvesters and/or other devices. By employing magnetic structure 10 and/or coupling layer 20, it may be possible to align a free magnetization direction with a precession angle of a magnetic layer to allow for precession of the free magnetization direction. In some embodiments, non-orthogonal non-collinear coupling is employed to align a free magnetization direction with a precession angle of a magnetic layer to allow for precession of the free magnetization direction. Without non-orthogonal non-collinear coupling, it would be difficult to achieve precession of the free magnetization direction.

FIG. 30A is a schematic diagram depicting a magnetic device 400 according to a non-limiting embodiment of the invention. Magnetic device 400 may be employed as an oscillator. Magnetic device 400 may be substantially similar to magnetic device 100 except as described herein. Magnetic device 400 comprises a magnetic structure 410 similar to magnetic structure 110, first, second and third magnetic layers 430, 440, 470 having first, second and third magnetization directions 432, 442, 472 similar to first, second and third magnetic layers 130, 140, 170, a first coupling layer 420 similar to coupling layer 120, a magnetoresistive layer 460 similar to magnetoresistive layer 160, a body 412 similar to body 112 and circuit 495 similar to circuit 195. Magnetic device 400 differs from magnetic device 100 in that the first, second and third magnetization directions 432, 442, 472 may be different than the first, second, and third magnetization directions 132, 142, 172, as discussed further herein.

In the FIG. 30A embodiment, first and third magnetization directions 432, 472 are fixed while second magnetization direction 442 is free.

First and second magnetization directions 432, 442 are coupled to one another across coupling layer 420 such that their respective magnetization directions 432, 442 are oriented at a non-collinear angle with respect to one another in the absence of an external applied magnetic field wherein the non-collinear angle is such that second magnetization direction 442 is aligned with, or approximately aligned with, a precession angle of second magnetic layer 440. To align second magnetization direction 442 with the precession angle of second magnetic layer 440, second magnetization direction 442 may be chosen based on the material of second magnetic layer 440, the thickness of second magnetic layer 440 or the desired operating current.

In some embodiments, in the absence of applied magnetic field, heat, etc. third magnetization direction 472 is non-parallel with first magnetization direction 432. In some embodiments, third magnetization direction 472 is orthogonal to first magnetization direction 432. In some embodiments, a difference between first magnetization direction 432 and second magnetization direction 442 remains relatively constant even as second magnetization direction 442 changes. On the other hand, a difference between third magnetization direction 472 and second magnetization direction 442 changes as second magnetization direction 442 changes.

When a current is applied to magnetic device 400 by circuit 495, the spin torque of the current causes second magnetization direction 442 to precess around a precession axis. In some embodiments, the precession axis is parallel or almost parallel with the Z-direction, although this is not mandatory. As second magnetization direction 442 precesses, its angular relationship with third magnetization direction 472 changes. In some positions along its precession, a component of second magnetization direction 442 points in the same direction as third magnetization direction 472 while in other positions along its precessions, no component of second magnetization direction 442 points in the same direction as third magnetization direction 472. As second magnetization direction 442 precesses, the resistance across body 412 changes. This change may optionally be amplified by magnetoresistive layer 460. During one precession of magnetization direction 442, the resistance goes from a minimum (when a component of second magnetization direction 442 points in the same direction as third magnetization direction 472) and a maximum (when no component of second magnetization direction 442 points in the same direction as third magnetization direction 472). As magnetization direction 442 precesses, the resistance cycles through this minimum and maximum. This cyclic change in resistance across body 412 can be used to create an oscillating signal in circuit 495. By employing magnetic structure 410, the amount of current and/or applied external field to induce precession may be reduced relative to prior art devices that do not use non-collinearly coupled structure 410.

FIG. 30B is a schematic diagram depicting a magnetic device 500 according to a non-limiting embodiment of the invention. Magnetic device 500 may be employed as an oscillator. Magnetic device 500 is substantially similar to magnetic device 400 except as described herein. Magnetic device 500 comprises a magnetic structure 510 similar to magnetic structure 410, first, second and third magnetic layers 530, 540, 570 having first, second and third magnetization directions 532, 542, 572 similar to first, second and third magnetic layers 430, 440, 470, a first coupling layer 520 similar to coupling layer 420, a magnetoresistive layer 560 similar to magnetoresistive layer 460, an body 512 similar to body 412 and circuit 595 similar to circuit 495.

Magnetic device 500 differs from magnetic device 400 in that first magnetization direction 532 is free while first magnetization direction 432 is fixed. Although FIG. 30B shows that first magnetization direction 532 and second magnetization direction 542 are precessing at similar (but opposite) angles, this is not necessary and first and second magnetization directions 532, 542 may precess at different angles. In some embodiments, current may be passed through magnetic device 500 in opposite directions or different currents or currents having different characteristics may be passed through magnetic device 500 to cause first and second magnetization directions 532, 542 to precess at different frequencies.

FIG. 30C is a schematic diagram depicting a magnetic device 600 according to a non-limiting embodiment of the invention. Magnetic device 600 is substantially similar to magnetic device 500 except as follows. Magnetic device 600 comprises a magnetic structure 610 similar to magnetic structure 510, first, second and third magnetic layers 630, 640, 670 having first, second and third magnetization directions 632, 642, 672 similar to first, second and third magnetic layers 530, 540, 570, a first coupling layer 620 similar to coupling layer 520, a magnetoresistive layer 660 similar to magnetoresistive layer 560, an body 612 similar to body 512 and circuit 595 similar to circuit 595.

Magnetic device 600 differs from magnetic device 500 in that second magnetization direction 642 is limited in the X-Y plane while second magnetization direction 542 extends out of the X-Y plane. Since third magnetization direction 672 is also fixed in the X-Y plane, it is possible that second and third magnetization directions 642, 672 may be oriented at 0° and 180° relative to one another thereby leading to larger changes in resistance across body 612 as compared to bodies 412, 512 and larger amplitude oscillations of the signal as compared to magnetic devices 400, 500.

While the above embodiments discuss applying direct current to magnetic devices 400, 500, 600, in some embodiments, the current applied to magnetic devices 400, 500, 600 may be oscillating. In such embodiments, when the oscillation frequency is within the corresponding oscillation frequency range of magnetic devices 400, 500, 600, the signal produced by magnetic devices 400, 500, 600 may be direct current.

In another application, a magnetic field could be applied to magnetic device 400 (or any of magnetic devices 500, 600) to cause or assist magnetization direction 442 to oscillate. As magnetization direction 442 oscillates due to the applied magnetic field or is assisted in oscillation by the applied magnetic field, the magnetoresistive effects of magnetoresistive layer 460 may be used to power or add power to circuit 495 and energy is thereby harvested by magnetic device 400 (or any of magnetic devices 500, 600). In some embodiments, the applied magnetic field may be the earth's magnetic field.

In some embodiments, magnetic devices 400, 500, 600 may each be employed to sense one or more external magnetic fields. For example, a magnetic field could be applied to device 400 (or any other device herein such as devices 500, 600) to disrupt, change or distort the oscillation (e.g. the amplitude, frequency or shape of the oscillation) of magnetization direction 442. Such disruption, change or distortion of the oscillation of magnetization direction 442 due to the applied magnetic field may be correlated with an applied magnetic field strength and/or direction. In this way a device employed as an oscillator can also be employed as a magnetic field sensor.

In another application, thermal fluctuations could be employed to cause or assist magnetization direction 442 of magnetic device 400 (or one of magnetization directions 542, 642 of magnetic devices 500, 600 respectively) to oscillate. As magnetization direction 442 oscillates due to the thermal fluctuations or assisted by the thermal fluctuations, the magnetoresistive effects of magnetoresistive layer 460 may be used to power or add power to circuit 495 and energy is thereby harvested by magnetic device 400 (or one of magnetic devices 500, 600). In some embodiments, the thermal fluctuations could be combined with an applied magnetic field or/and an applied current to cause magnetization direction 442 to oscillate.

In some embodiments, one or more of magnetic device 100, magnetic device 200 (and/or 300), magnetic device 400 (and/or 500, 600) may be combined to form a single device by stacking two or more such devices on top of another in a similar fashion to the way that magnetic device 300 comprises two magnetic devices 200 stacked on top of one another. In some such embodiments, two or more of the stacked devices may share one or more magnetic layers, coupling layers, and/or magnetoresistive layers, although this is not mandatory.

Figure 31B:
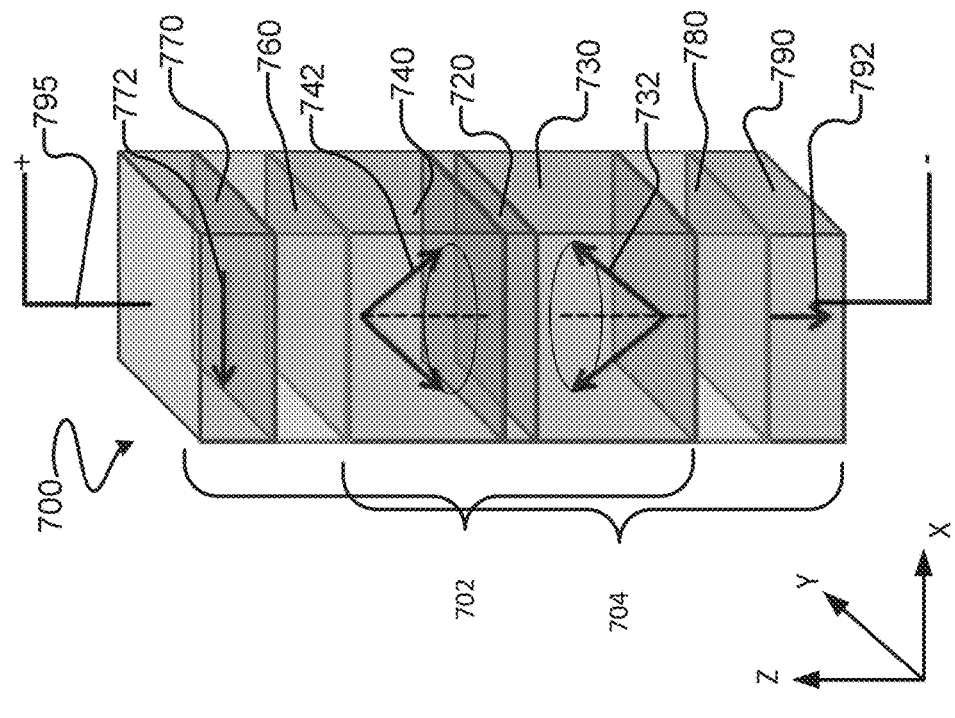
FIGS. 31A and 31B schematically depict a magnetic device combined with a memory device according to a particular embodiment of the invention in a first state and in a second state, respectively.
Figure 31A:
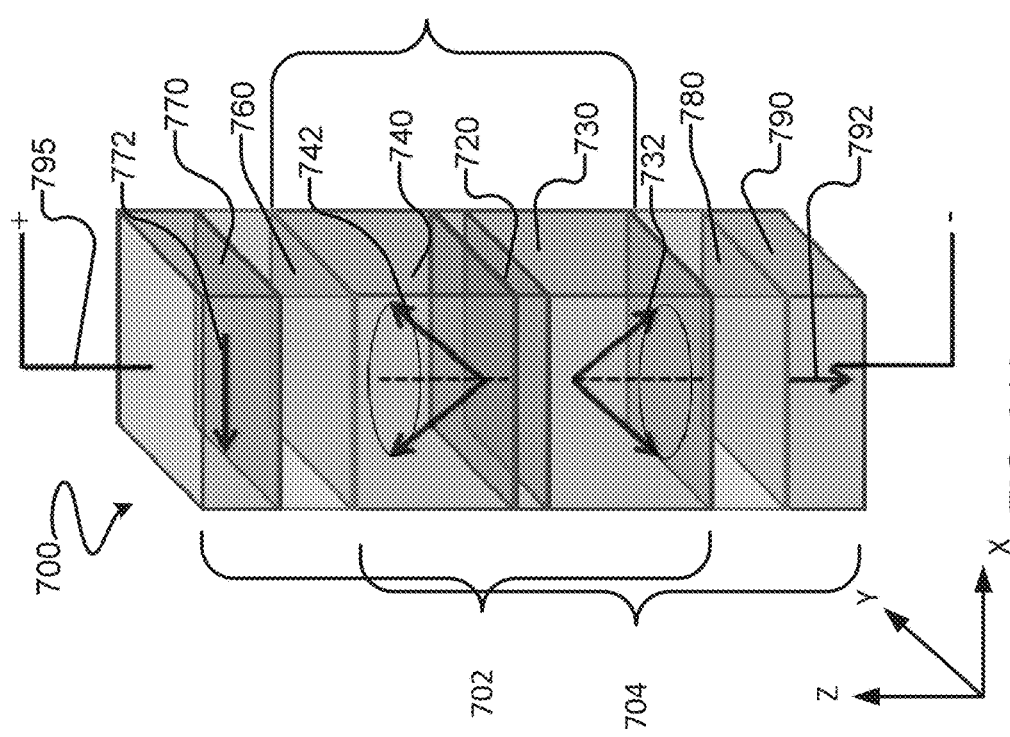

FIGS. 31A and 31B are schematic depictions of an oscillator device 702 and a memory device 704 combined to form a single device 700 according to one embodiment of the invention. Oscillator device 702 may be substantially similar to magnetic device 500. Magnetic device 700 comprises a magnetic structure 710 similar to magnetic structure 510, first, second and third magnetic layers 630, 740, 770 having first, second and third magnetization directions 732, 742, 772 similar to first, second and third magnetic layers 530, 540, 570, a first coupling layer 720 similar to coupling layer 520, a magnetoresistive layer 760 similar to magnetoresistive layer 560 and circuit 795 similar to circuit 595. Memory device 704 may be substantially similar to memory device 200, except as described herein. For example, magnetic memory device 704 comprises a magnetic structure 710 similar to magnetic structure 210, first, second and fourth magnetic layers 730, 740, 790 having first, second and fourth magnetization directions 732, 742, 792 similar to first, second and third magnetic layers 230, 240, 270 having first, second and third magnetization directions 232, 242, 272, a first coupling layer 720 similar to coupling layer 220, a magnetoresistive layer 780 similar to magnetoresistive layer 260 and circuit 795 similar to circuit 295. Magnetic memory device 704 differs from magnetic device 200 in that first magnetization direction 732 may precess.

FIG. 31A depicts a first memory state in which first magnetization direction 732 precesses at a first precession angle and FIG. 31B depicts a second memory state in which magnetization direction 732 precesses at a second precession angle. The angular difference between the first and second states also corresponds to an angular difference between fourth magnetization direction 792 and first magnetization direction 732 which causes a change in resistance that may be detected by circuit 795. In either state, despite the precession of first magnetization direction 732, the relationship between fourth magnetization direction 792 and first magnetization direction 732 is constant, which allows first magnetic layer 732 to be shared by oscillator 702 and magnetic memory 704.

Although, magnetic structures 10, 110, 210 etc. and magnetic devices 100, 200, 300, 400, 500, 600, 700 are depicted as having rectangular or square XY plane cross-sections, this is not necessary. Magnetic structures 10, 110, 210 etc. and magnetic devices 100, 200, 300, 400, 500, 600, 700 may have any suitable XY cross-section. In some embodiments, by changing the XY cross-section, magnetization directions (e.g. magnetization directions 32, 42, 132, 142, etc.) may behave differently. In some embodiments, the XY plane cross-sectional shape of a structure or device (e.g. 10, 110, 100, 200 etc.) may be chosen to achieve desired effects on magnetization directions (e.g. magnetization directions 32, 42, 132, 142, etc.). For example, it may be desirable to construct a memory device having an ellipse XY plane cross-sectional shape to strengthen stable states. As another example, it may be desired for an oscillator to have a circular XY plane cross-sectional shape to assist precession of magnetization direction 442, 542 etc. or to have an ellipse XY plane cross-sectional shape to slow down precession of magnetization direction 442, 542 etc.

Figure 32B:
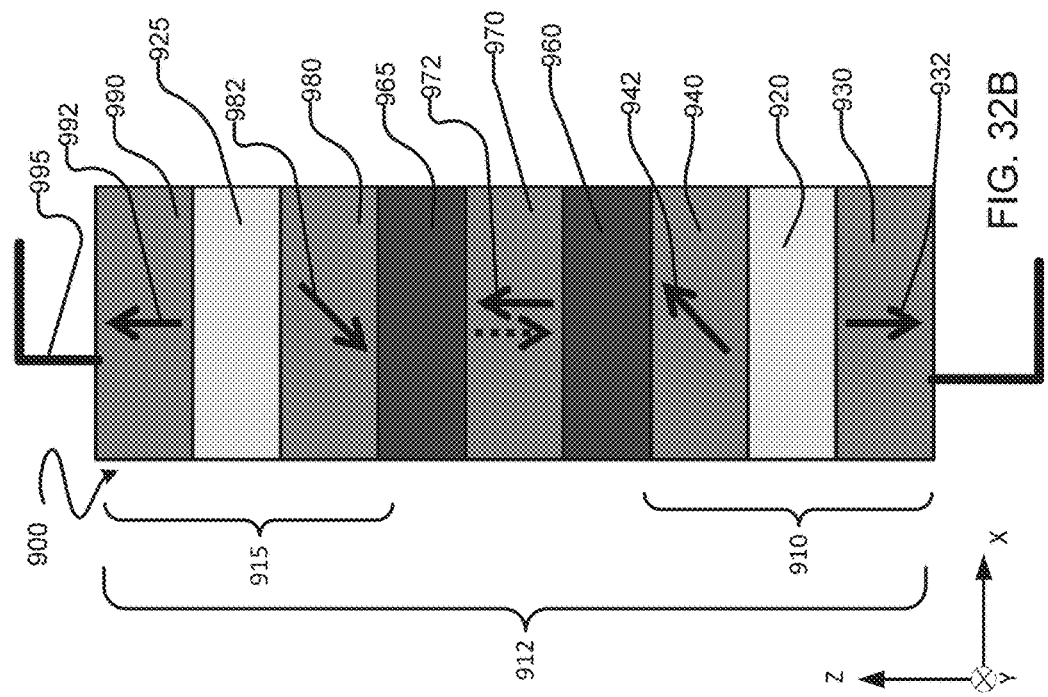
FIGS. 32A and 32B schematically depict magnetic devices according to particular embodiments of the invention.
Figure 32A:
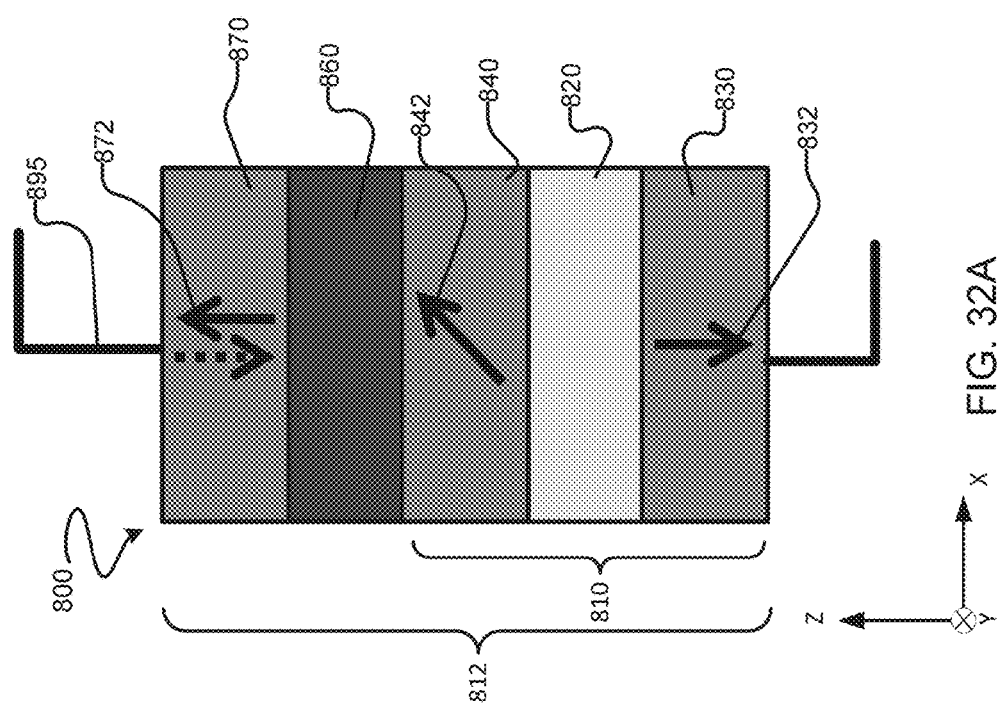

FIG. 32A is a schematic diagram of a magnetic device 800 according to one embodiment of the invention. Magnetic device 800 may be employed as (or as part of), for example, a magnetic memory device, a magnetic sensor device, an oscillator device, a diode, a microwave generator or an energy harvesting device.

Magnetic device 800 is substantially similar to magnetic device 100 except as described below. Moreover, magnetic device 800 may be employed in the same way that magnetic device 100 may be employed as described above and magnetic device 800 may have the same (or some of the same) advantages that magnetic device 100 has as described above in addition to those described below. Magnetic device 800 comprises a magnetic structure 810 similar to magnetic structure 110, first, second and third magnetic layers 830, 840, 870 having first, second and third magnetization directions 832, 842, 872 similar to first, second and third magnetic layers 130, 140, 170 having first, second and third magnetization directions 132, 142, 172, a first coupling layer 820 similar to coupling layer 120, a magnetoresistive layer 860 similar to magnetoresistive layer 160 and a circuit 895 similar to circuit 195. Together, first, second and third magnetic layers 830, 840, 870, first coupling layer 820, and magnetoresistive layer 860 may be referred to as body 812.

First and second magnetic layers 830, 840 may be non-collinearly coupled such that first magnetization direction 832 is oriented at a non-collinear angle with respect to second magnetization direction 842. First magnetization direction 832 is oriented in either the positive Z direction or the negative Z direction (e.g. orthogonal to the XY plane). First magnetization direction 832 is fixed. Second magnetization direction 842 is oriented at least partially in the Z direction and at least partially in one or both of the X and Y directions. Second magnetization direction 842 is fixed at a non-collinear angle with respect to first magnetization direction 832. It should be understood that in some embodiments second magnetization direction 842 may rotate about a Z direction axis while remaining fixed to first magnetization direction 832 at non-collinear angle. As discussed in relation to FIGS. 3A and 3B, such rotation could be reduced by elongating the XY-plane cross-sectional shape of second magnetic layer 840 in one of the X and Y directions.

Any suitable apparatus or method may be employed to fix first magnetization direction 832. For example, the material of first magnetic layer 830 may be chosen such that magnetization direction 832 is fixed. Alternatively, additional magnetic layers may be ferromagnetically coupled or coupled by a coupling layer (e.g. ferromagnetically, antiferromagnetically or non-collinearly coupled) to first magnetic layers 830 to thereby fix first magnetization direction 832.

Unlike third magnetization direction 172 of magnetic device 100, third magnetization direction 872 is free relative to first and second magnetization directions 832, 842. Specifically, third magnetization direction 872 is free to change between a first state wherein third magnetization direction 872 is oriented generally in the positive Z direction or a second state wherein third magnetization direction 872 is oriented generally in the negative Z direction.

In some embodiments, second magnetic layer 840 of magnetic device 800 has an XY-plane cross-section that is elongated in the X direction. Referring back to the discussion of FIG. 3B, the elongated XY-plane cross-section may urge or limit the orientation of second magnetization direction 842 in the XZ-plane. Therefore, in such embodiments, to maintain the non-collinear coupling angle between first and second magnetization directions 832, 842, second magnetization direction 842 is practically limited to two possible orientations in the XZ-plane between which it can "flip". Alternatively, if magnetic layer 840 has X and Y direction dimensions that are approximately equal, second magnetization direction 842 may have infinite orientations and may be allowed to rotate about a Z direction axis, as discussed above in relation to FIG. 3A.

Third magnetization direction 872 of third magnetic layer 870 can be caused to change between its first and second states by spin torque transfer (e.g. applying a current through circuit 895). By passing the current through second magnetic layer 840, the electric current is polarized. By passing the polarized current through third magnetic layer 870, the polarized current may cause the third magnetic layer 870 to change from its first stable state to its second stable state (or vice versa). The amount of current for changing the state of third magnetic layer 870 may depend on the angular difference between third magnetization direction 872 and second magnetization direction 842. The current may be reduced by changing the angular difference between the third magnetization direction 872 and second magnetization direction 842. Changing the angular difference between third magnetization direction 872 and second magnetization direction 842 may be accomplished with non-collinear coupling (e.g. by employing magnetic structure 10 and/or coupling layer 20, as described herein) between first and second magnetic layers 830, 840. In some embodiments, by changing the angular difference between third magnetization direction 872 and second magnetization direction 842, switching time may be increased and resistance changes between states may be decreased.

By coupling first and second magnetization directions 832, 842 at a non-collinear angle, the amount of current to change third magnetic layer 870 between its first and second states is reduced considerably, as compared to ferromagnetic coupling and/or antiferromagnetic coupling between first magnetic layer 830 and second magnetic layer 840. Moreover, the time to switch between stable states may be reduced and the reliability of switching of magnetic device 800 may be relatively greater than prior art devices which do not include non-collinearly coupled structure 810.

When third magnetic layer 870 is in its first state, the resistance across body 812 (as can be measured by circuit 895) may have a first value. When third magnetic layer 870 is in its second state, the resistance across body 812 (as can be measured by circuit 895) may have a second value, different from the first value. Therefore, by determining the resistance across body 812 (as can be measured by circuit 895), it is possible to determine the state of third magnetic layer 870. Information such as a bit can therefore be stored on magnetic device 800. For example, the first state of third magnetic layer 870 (and its associated first value of resistance) could correspond to a "0" bit and the second state of third magnetic layer 870 (and its associated second value of resistance) could correspond to a "1" bit.

FIG. 32B is a schematic diagram of a magnetic device 900 according to one embodiment of the invention. Magnetic device 900 may be employed as (or as part of), for example, a magnetic memory device, a magnetic sensor device, an oscillator device, a diode, a microwave generator or an energy harvesting device.

Magnetic device 900 is substantially similar to magnetic device 800 except as described below. Moreover, magnetic device 900 may be employed in the same way that magnetic device 800 may be employed as described above and magnetic device 900 may have the same (or some of the same) advantages that magnetic device 800 has as described above in addition to those described below. Magnetic device 900 comprises a first magnetic structure 910 similar to magnetic structure 810, first, second and third magnetic layers 930, 940, 970 having first, second and third magnetization directions 932, 942, 972 similar to first, second and third magnetic layers 830, 840, 870 having first, second and third magnetization directions 832, 842, 872, a first coupling layer 920 similar to coupling layer 820, a first magnetoresistive layer 960 similar to magnetoresistive layer 860 and a circuit 995 similar to circuit 895.

Magnetic device 900 also comprises a second magnetic structure 915 comprising fourth magnetic layer 980 having fourth magnetization direction 982 and fifth magnetic layer 990 having fifth magnetization direction 992 separated by a second coupling layer 925. Fourth magnetic layer 980 is spaced apart from third magnetic layer 970 by second magnetoresistive layer 965. Together, first, second, third, fourth and fifth magnetic layers 930, 940, 970, 980, 990, first coupling layer 920, second coupling layer 925, first magnetoresistive layer 960 and second magnetoresistive layer 965 may be referred to as body 912.

First and second magnetic layers 930, 940 may be non-collinearly coupled such that first magnetization direction 932 is oriented at a non-collinear angle with respect to second magnetization direction 942. First magnetization direction 932 is oriented in either the positive Z direction or the negative Z direction (e.g. orthogonal to the XY plane). First magnetization direction 932 is fixed. Second magnetization direction 942 is oriented at least partially in the Z direction and at least partially in one or both of the X and Y directions. It should be understood that in some embodiments second magnetization direction 942 may rotate (or have any relative orientation) about a Z direction axis while remaining fixed to first magnetization direction 932 at the non-collinear angle.

Fourth and fifth magnetic layers 980, 990 may also be non-collinearly coupled such that fourth magnetization direction 982 is oriented at a non-collinear angle with respect to fifth magnetization direction 992. Fifth magnetization direction 992 is oriented in either the positive Z direction or the negative Z direction (e.g. orthogonal to the XY plane). Fifth magnetization 992 direction is fixed. Fourth magnetization direction 982 is oriented at least partially in the Z direction and at least partially in one or both of the X and Y directions. It should be understood that in some embodiments fourth magnetization direction 982 may rotate (or have any relative orientation) about a Z direction axis while remaining fixed to fifth magnetization direction 992 at the non-collinear angle. The non-collinear coupling angle between fourth and fifth magnetic layers 980, 990 may be different from the non-collinear coupling angle between first and second magnetic layers 930, 940.

Any suitable apparatus or method may be employed to fix first and fifth magnetization directions 932, 992. For example, the materials of first and fifth magnetic layers 930, 990 may be chosen such that magnetization directions 932, 992 are fixed. Alternatively, additional magnetic layers may be ferromagnetically coupled or coupled by a coupling layer (e.g. ferromagnetically, antiferromagnetically or non-collinearly coupled) to first and fifth magnetic layers 930, 990 to thereby fix first and fifth magnetization directions 932, 992.

Third magnetization direction 972 is free relative to first and second magnetization directions 932, 942 and fourth and fifth magnetization directions 982, 992. Specifically, third magnetization direction 972 is free to change between a first state wherein third magnetization direction 972 is oriented generally in the positive Z direction and a second state wherein third magnetization direction 972 is oriented generally in the negative Z direction.

When third magnetic layer 970 is in its first state, the resistance across body 912 (as can be measured by circuit 995) may have a first value. When third magnetic layer 970 is in its second state, the resistance across body 912 (as can be measured by circuit 995) may have a second value, different from the first value. Therefore, by determining the resistance across body 912 (as can be measured by circuit 995), it is possible to determine the state of third magnetic layer 970. Information such as a bit can therefore be stored on magnetic device 900. For example, the first state of third magnetic layer 970 (and its associated first value of resistance) could correspond to a "0" bit and the second state of third magnetic layer 970 (and its associated second value of resistance) could correspond to a "1" bit.

As compared to magnetic device 800, the difference between the resistance of body 912 when third magnetic layer 970 is in its first state as compared to the resistance of body 912 when third magnetic layer 970 is in its second state may be higher than the difference between the resistance of body 812 when third magnetic layer 870 is in its first state as compared to the resistance of body 812 when third magnetic layer 870 is in its second state. This relatively greater resistance difference (of device 900 relative to device 800) may be a result of constructive interference of torque of the polarized current that has passed through second magnetic layer 940 (or fourth magnetic layer 980) and torque of the current that is reflected by fourth magnetic layer 980 (or by second magnetic layer 940), thereby resulting in an increase in net torque on third magnetization direction 972. Further explanation of such constructive interference is described below in relation to magnetic device 3100.

Third magnetization direction 972 of third magnetic layer 970 can be caused to change between its first and second states by spin torque transfer (e.g. applying a current through circuit 995). By passing the current through second magnetic layer 940 (or through fourth magnetic layer 980), the electric current is polarized in a first direction. By passing the polarized current through third magnetic layer 970, the polarized current causes the third magnetic layer 870 to change from its first stable state to its second stable state (or vice versa). The amount of current for changing third magnetic layer 970 between its stable states may depend on the angular difference between third magnetization direction 972 and second magnetization direction 942 and/or the angular difference between third magnetization direction 972 and fourth magnetization direction 982 depending on which way current is passed through body 912. If current is passed first through first magnetic layer 932, the current may be reduced by changing the angular difference between the third magnetization direction 972 and second magnetization direction 942. If current is passed first through fifth magnetic layer 992, the current may be reduced by changing the angular difference between third magnetization direction 972 and fourth magnetization direction 982. Changing the angular difference between third magnetization direction 972 and second magnetization direction 942 and/or changing the angular difference between third magnetization direction 972 and fourth magnetization direction 982 may be accomplished with non-collinear coupling (e.g. by employing magnetic structure 10 and/or coupling layer 20, as described herein) between first and second magnetic layers 930, 940 and/or between fourth and fifth magnetic layers 980, 990, respectively. In some embodiments, by changing the angular difference between third magnetization direction 972 and second magnetization direction 942 and/or changing the angular difference between third magnetization direction 972 and fourth magnetization direction 982, switching time may be increased and resistance changes between states may be decreased.

By coupling first and second magnetization directions 932, 942 at a non-collinear angle and by coupling fourth and fifth magnetization directions 982, 992 at a non-collinear angle, the amount of current to change third magnetic layer 970 between its first and second states may be reduced considerably as compared to prior art devices which use ferromagnetic coupling and/or antiferromagnetic coupling between first magnetic layer 930 and second magnetic layer 940 and/or between fourth magnetic layer 980 and fifth magnetic layer 980. Moreover, the time to switch between stable states may be reduced and the reliability of switching of magnetic device 900 may be relatively greater when compared to prior art devices which do not use non-collinearly coupling.

In FIGS. 32A and 32B, first magnetization directions 832, 932 are depicted as being out-of-plane (e.g. at least a component of each of first magnetization directions 832, 932 extends out of the XY-plane). This is not mandatory. First magnetization directions 832, 932 may be in-plane (e.g. first magnetization directions 832, 932 may have substantially no Z-direction components).

FIGS. 33A and 33B are schematic diagrams of magnetic devices 1000 and 1100, which are respectively substantially similar to magnetic devices 800 and 900, except as described below. Magnetic devices 1000, 1100 may each be employed as (or as part of), for example, a magnetic memory device, a magnetic sensor device, an oscillator device, a diode, a microwave generator or an energy harvesting device. Moreover, magnetic devices 1000, 1100 may be employed in the same way that magnetic devices 800, 900 respectively may be employed as described above and magnetic devices 1000, 1100 have the same advantages that magnetic devices 800, 900 respectively have as described above in addition to those described below.

Magnetic device 1000 comprises a magnetic structure 1010 similar to magnetic structure 810, first, second and third magnetic layers 1030, 1040, 1070 having first, second and third magnetization directions 1032, 1042, 1072 similar to first, second and third magnetic layers 830, 840, 870 having first, second and third magnetization directions 832, 842, 872, a first coupling layer 1020 similar to coupling layer 820, a magnetoresistive layer 1060 similar to magnetoresistive layer 860 and a circuit 1095 similar to circuit 895. Together, first, second and third magnetic layers 1030, 1040, 1070, first coupling layer 1020, and magnetoresistive layer 1060 may be referred to as body 1012.

In the depicted embodiment, magnetic device 1000 differs from magnetic device 800 in that first magnetization direction 1032 is in-plane (e.g. first magnetization direction 1032 does not have a Z direction component) and is oriented in the X direction as opposed to first magnetization direction 832 which is out-of-plane (e.g. first magnetization direction 832 has a Z direction component and extends out of the XY-plane). It should be understood, that first magnetization direction 1032 could also be in-plane and oriented in the Y direction or a combination of the X and Y directions.

In some embodiments, second magnetic layer 1040 of magnetic device 1000 (or all of magnetic device 1000) has an XY-plane cross-section that is elongated in the X direction. Referring back to the discussion of FIG. 3B, the elongated X-direction of the XY-plane cross-section may urge or limit the orientation of second magnetization direction 1042 to be in the XZ-plane. Therefore, in such embodiments, to maintain the non-collinear coupling angle between first and second magnetization directions 1032, 1042, second magnetization direction 1042 is fixed in a single orientation in the XZ-plane. By limiting second magnetization direction 1042 to a single orientation, the number of pinning layers (or other pinning features) may be reduced in such embodiments, compared to embodiments having non-elongated X-Y plane cross-sections.

Magnetic device 1100 comprises a first and second magnetic structures 1110, 1115 similar to magnetic structures 910, 915 first, second, third, fourth and fifth magnetic layers 1130, 1140, 1170, 1180, 1190 having first, second, third, fourth and fifth magnetization directions 1132, 1142, 1172, 1182, 1192 similar to first, second, third, fourth and fifth magnetic layers 930, 940, 970, 980, 990 having first, second, third, fourth and fifth magnetization directions 932, 942, 972, 982, 992, first and second coupling layer 1120, 1125 similar to coupling layers 920, 925, first and second magnetoresistive layers 1160, 1165 similar to magnetoresistive layers 960, 965 and a circuit 1195 similar to circuit 995. Together, first, second, third, fourth and fifth magnetic layers 1130, 1140, 1170, 1180, 1190, first coupling layer 1120, second coupling layer 1125, first magnetoresistive layer 1160 and second magnetoresistive layer 1165 may be referred to as body 1112.

In the depicted embodiment, magnetic device 1100 differs from magnetic device 900 in that first and fifth magnetization directions 1032, 1092 are in-plane (e.g. first and fifth magnetization directions 1032, 1092 do not have Z direction components) and are oriented in the X direction as opposed to first and fifth magnetization direction 932, 992 which are out-of-plane (e.g. first and fifth magnetization directions 932, 992 have Z direction components and extend out of the XY-plane).

In some embodiments, second and/or fourth magnetic layers 1140, 1180 of magnetic device 1100 (or all of magnetic device 1100) each have an XY-plane cross-section that is elongated in the X direction. Referring back to the discussion of FIG. 3B, the elongated X-dimension of the XY-plane cross-section may urge or limit the orientation of second magnetization direction 1142 and/or fourth magnetization direction 1182 to be in the XZ-plane. Therefore, in such embodiments, to maintain the non-collinear coupling angle between first and second magnetization directions 1132, 1142 and/or fourth and fifth magnetization directions 1182, 1192, second and/or fourth magnetization directions 1142, 1182 are fixed in a single orientation in the XZ-plane. By limiting second and/or fourth magnetization directions 1142, 1182 to a single orientation, the number of pinning layers (or other pinning features) may be reduced in such embodiments, compared to embodiments having non-elongated X-Y plane cross-sections.

Figure 34B:
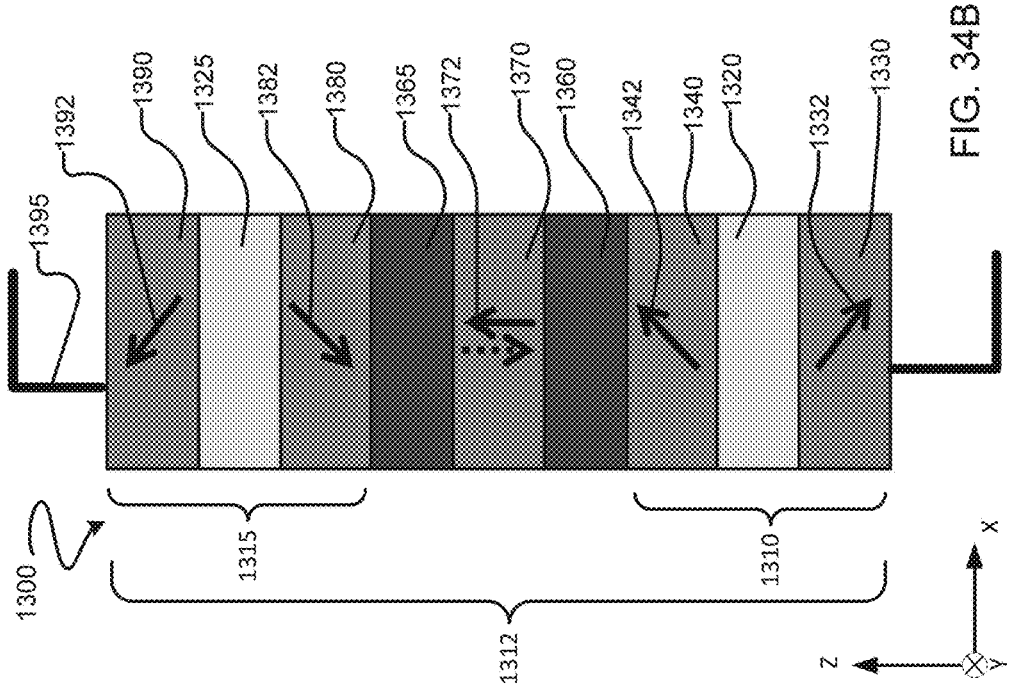
FIGS. 34A and 34B schematically depict magnetic devices according to particular embodiments of the invention.
Figure 34A:
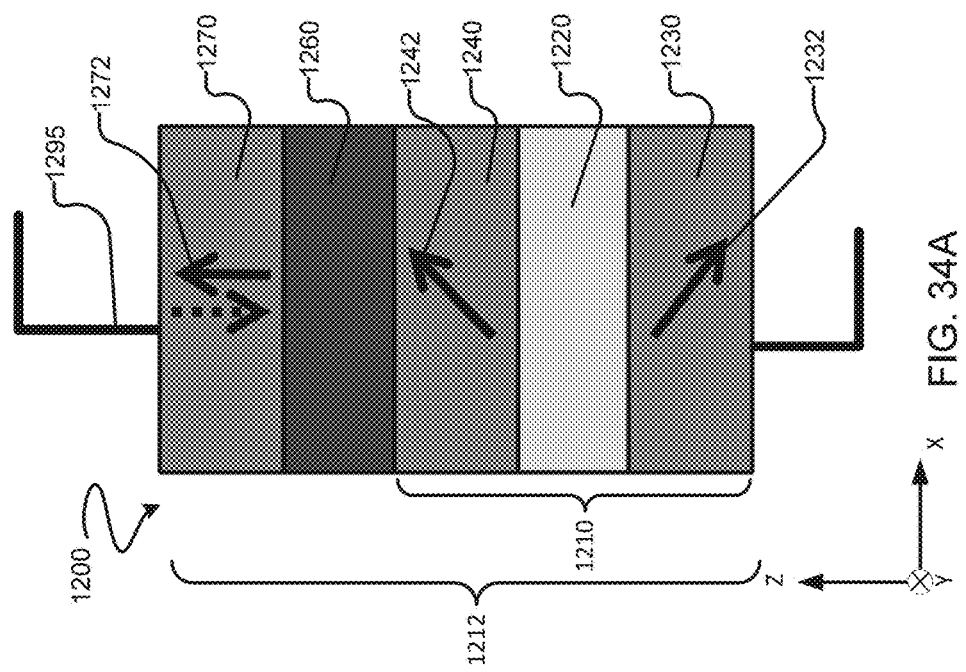

While FIGS. 33A and 33B depict first magnetization directions 1032, 1132 as extending in the X direction and having no Z direction component, it may also be possible to fix second magnetization directions 1042, 1142 and fourth magnetization direction 1182 in a single orientation even if first magnetization directions 1032, 1132 and fifth magnetization direction 1192 have non-zero Z direction components, non-zero X direction components and/or non-zero Y direction components. For example, FIGS. 34A and 34B depict magnetic devices 1200, 1300 substantially similar to magnetic devices 1000, 1100 respectively, in which first magnetization directions 1232, 1332 of magnetic devices 1200, 1300 have non-zero X direction components and non-zero Z direction components. Magnetic devices 1200, 1300 may be substantially similar to magnetic devices 1000, 1100 respectively, except as described below. Moreover, magnetic devices 1200, 1300 may be employed in the same way that magnetic devices 1000, 1100 respectively may be employed as described above and magnetic devices 1200, 1300 have the same advantages that magnetic devices 1000, 1100 have as described above in addition to those described below.

Magnetic device 1200 comprises a magnetic structure 1210 similar to magnetic structure 1010, first, second and third magnetic layers 1230, 1240, 1270 having first, second and third magnetization directions 1232, 1242, 1272 similar to first, second and third magnetic layers 1030, 1040, 1070 having first, second and third magnetization directions 1032, 1042, 1072, a first coupling layer 1220 similar to coupling layer 1020, a magnetoresistive layer 1260 similar to magnetoresistive layer 1060 and a circuit 1295 similar to circuit 1095. Together, first, second and third magnetic layers 1230, 1240, 1270, first coupling layer 1220, and magnetoresistive layer 1260 may be referred to as body 1212.

In the depicted embodiment, magnetic device 1200 differs from magnetic device 1000 in that first magnetization direction 1232 has a non-zero Z direction component as opposed to first magnetization direction 1032 which is in-plane (e.g. first magnetization direction 1032 has no Z direction component).

In some embodiments, second magnetic layer 1240 of magnetic device 1200 (or all of magnetic device 1200) has an XY-plane cross-section that is elongated in the X direction. Referring back to the discussion of FIG. 3B, the elongated XY-plane cross-section may urge or limit the orientation of second magnetization direction 1242 to be in the XZ-plane. Therefore, in such embodiments, to maintain the non-collinear coupling angle between first and second magnetization directions 1232, 1242, second magnetization direction 1242 is fixed in a single orientation in the XZ-plane. By limiting second magnetization direction 1242 to a single orientation, the number of pinning layers (or other pinning features) may be reduced in such embodiments, compared to embodiments having non-elongated X-Y plane cross-sections.

Magnetic device 1300 comprises a first and second magnetic structures 1310, 1315 similar to magnetic structures 1110, 1115 first, second, third, fourth and fifth magnetic layers 1330, 1340, 1370, 1380, 1390 having first, second, third, fourth and fifth magnetization directions 1332, 1342, 1372, 1382, 1392 similar to first, second, third, fourth and fifth magnetic layers 1130, 1140, 1170, 1180, 1190 having first, second, third, fourth and fifth magnetization directions 1132, 1142, 1172, 1182, 1192, first and second coupling layer 1320, 1325 similar to coupling layers 1120, 1125, first and second magnetoresistive layers 1360, 1365 similar to magnetoresistive layers 1160, 1165 and a circuit 1395 similar to circuit 1195. Together, first, second, third, fourth and fifth magnetic layers 1330, 1340, 1370, 1380, 1390, first coupling layer 1320, second coupling layer 1325, first magnetoresistive layer 1360 and second magnetoresistive layer 1365 may be referred to as body 1312.

In the depicted embodiment, magnetic device 1300 differs from magnetic device 1100 in that first and fifth magnetization directions 1332, 1392 each have a non-zero Z direction component as opposed to first and fifth magnetization direction 1132, 1192 which are have substantially no Z-direction components.

In some embodiments, second and/or fourth magnetic layers 1340, 1380 of magnetic device 1300 (or all of magnetic device 1300) each have an XY-plane cross-section that is elongated in the X direction. Referring back to the discussion of FIG. 3B, the elongated XY-plane cross-section may urge or limit the orientation of second magnetization direction 1342 and/or fourth magnetization direction 1382 to be in the XZ-plane. Therefore, in such embodiments, to maintain the non-collinear coupling angle between first and second magnetization directions 1332, 1342 and/or fourth and fifth magnetization directions 1382, 1392, second and/or fourth magnetization directions 1342, 1382 are fixed in a single orientation in the XZ-plane. By limiting second and/or fourth magnetization directions 1342, 1382 to a single orientation, the number of pinning layers (or other pinning features) may be reduced in such embodiments, compared to embodiments having non-elongated X-Y plane cross-sections.

First magnetic layers 1230, 1330 and fifth magnetic layer 1390 of magnetic devices 1200, 1300 may be orthogonally, non-collinearly coupled to second magnetic layers 1240, 1340, and fourth magnetic layer 1380 respectively, although this is not necessary.

While the free layers in magnetic devices 800, 900, 1000, 1100, 1200, 1300 discussed above have been depicted and discussed as having third magnetization directions 872, 972, 1072, 1172, 1272, 1372 oriented in the Z direction without having any X or Y direction components, this is not mandatory. Third magnetization directions 872, 972, 1072, 1172, 1272, 1372 may be oriented substantially in the X direction (e.g. if the XY plane cross-sections of magnetic devices 800, 900, 1000, 1100, 1200, 1300 (or at least free third magnetic layers 870, 970, 1070, 1170, 1270, 1370) are elongated in the X direction). Similarly, the third magnetization directions 872, 972, 1072, 1172, 1272, 1372 may be oriented in the Y direction (e.g. if the XY plane cross-sections of magnetic devices 800, 900, 1000, 1100, 1200, 1300 (or at least third magnetic layers 870, 970, 1070, 1170, 1270, 1370) are elongated in the Y direction).

FIGS. 35A, 35B, 36A, 36B, 37A and 37B are schematic diagrams of magnetic devices 1400, 1500, 1600, 1700, 1800, 1900 respectively. Magnetic devices 1400, 1500, 1600, 1700, 1800, 1900 are substantially similar to magnetic devices 800, 900, 1000, 1100, 1200, 1300 respectively, except that the XY plane cross-sections of free third magnetic layers 1470, 1570, 1670, 1770, 1870, 1970 are elongated in the X direction and the corresponding third magnetization directions 1472, 1572, 1672, 1772, 1872, 1972 are oriented in the XY-plane. Moreover, magnetic devices 1400, 1500, 1600, 1700, 1800, 1900 may be employed in the same way that magnetic devices 800, 900, 1000, 1100, 1200, 1300 respectively may be employed as described above and magnetic devices 1400, 1500, 1600, 1700, 1800, 1900 have the same advantages that magnetic devices 800, 900, 1000, 1100, 1200, 1300 have as described above in addition to those described below.

Magnetic device 1400 comprises a magnetic structure 1410 similar to magnetic structure 810, first, second and third magnetic layers 1430, 1440, 1470 having first, second and third magnetization directions 1432, 1442, 1472 similar to first, second and third magnetic layers 830, 840, 870 having first, second and third magnetization directions 832, 842, 872, a first coupling layer 1420 similar to coupling layer 820, a magnetoresistive layer 1460 similar to magnetoresistive layer 860 and a circuit 1495 similar to circuit 895. Together, first, second and third magnetic layers 1430, 1440, 1470, first coupling layer 1420, and magnetoresistive layer 1460 may be referred to as body 1412.

Magnetic device 1500 comprises first and second magnetic structures 1510, 1515 similar to magnetic structures 910, 915 first, second, third, fourth and fifth magnetic layers 1530, 1540, 1570, 1580, 1590 having first, second, third, fourth and fifth magnetization directions 1532, 1542, 1572, 1582, 1592 similar to first, second, third, fourth and fifth magnetic layers 930, 940, 970, 980, 990 having first, second, third, fourth and fifth magnetization directions 932, 942, 972, 982, 992, first and second coupling layer 1520, 1525 similar to coupling layers 920, 925, first and second magnetoresistive layers 1560, 1565 similar to magnetoresistive layers 960, 965 and a circuit 1595 similar to circuit 995. Together, first, second, third, fourth and fifth magnetic layers 1530, 1540, 1570, 1580, 1590, first coupling layer 1520, second coupling layer 1525, first magnetoresistive layer 1560 and second magnetoresistive layer 1565 may be referred to as body 1512.

Magnetic device 1600 comprises a magnetic structure 1610 similar to magnetic structure 1010, first, second and third magnetic layers 1630, 1640, 1670 having first, second and third magnetization directions 1632, 1642, 1672 similar to first, second and third magnetic layers 1030, 1040, 1070 having first, second and third magnetization directions 1032, 1042, 1072, a first coupling layer 1620 similar to coupling layer 1020, a magnetoresistive layer 1660 similar to magnetoresistive layer 1060 and a circuit 1695 similar to circuit 1095. Together, first, second and third magnetic layers 1630, 1640, 1670, first coupling layer 1620, and magnetoresistive layer 1660 may be referred to as body 1612.

Magnetic device 1700 comprises a first and second magnetic structures 1710, 1715 similar to magnetic structures 1110, 1115 first, second, third, fourth and fifth magnetic layers 1730, 1740, 1770, 1780, 1790 having first, second, third, fourth and fifth magnetization directions 1732, 1742, 1772, 1782, 1792 similar to first, second, third, fourth and fifth magnetic layers 1130, 1140, 1170, 1180, 1190 having first, second, third, fourth and fifth magnetization directions 1132, 1142, 1172, 1182, 1192, first and second coupling layer 1720, 1725 similar to coupling layers 1120, 1125, first and second magnetoresistive layers 1760, 1765 similar to magnetoresistive layers 1160, 1165 and a circuit 1795 similar to circuit 1195. Together, first, second, third, fourth and fifth magnetic layers 1730, 1740, 1770, 1780, 1790, first coupling layer 1720, second coupling layer 1725, first magnetoresistive layer 1760 and second magnetoresistive layer 1765 may be referred to as body 1712.

Magnetic device 1800 comprises a magnetic structure 1810 similar to magnetic structure 1210, first, second and third magnetic layers 1830, 1840, 1870 having first, second and third magnetization directions 1832, 1842, 1872 similar to first, second and third magnetic layers 1230, 1240, 1270 having first, second and third magnetization directions 1232, 1242, 1272, a first coupling layer 1820 similar to coupling layer 1220, a magnetoresistive layer 1860 similar to magnetoresistive layer 1260 and a circuit 1895 similar to circuit 1295. Together, first, second and third magnetic layers 1830, 1840, 1870, first coupling layer 1820, and magnetoresistive layer 1860 may be referred to as body 1812.

Magnetic device 1900 comprises a first and second magnetic structures 1910, 1915 similar to magnetic structures 1310, 1315 first, second, third, fourth and fifth magnetic layers 1930, 1940, 1970, 1980, 1990 having first, second, third, fourth and fifth magnetization directions 1932, 1942, 1972, 1982, 1992 similar to first, second, third, fourth and fifth magnetic layers 1330, 1340, 1370, 1380, 1390 having first, second, third, fourth and fifth magnetization directions 1332, 1342, 1372, 1382, 1392, first and second coupling layer 1920, 1925 similar to coupling layers 1320, 1325, first and second magnetoresistive layers 1960, 1965 similar to magnetoresistive layers 1360, 1365 and a circuit 1995 similar to circuit 1395. Together, first, second, third, fourth and fifth magnetic layers 1930, 1940, 1970, 1980, 1990, first coupling layer 1920, second coupling layer 1925, first magnetoresistive layer 1960 and second magnetoresistive layer 1965 may be referred to as body 1912.

If the XY plane cross-sections of free third magnetic layers 1470 1570, 1670, 1770, 1870, 1970 are elongated in the X direction and corresponding the third magnetization directions 1472, 1572, 1672, 1772, 1872, 1972 are oriented in the X direction, then third magnetization directions 1472, 1572, 1672, 1772, 1872, 1972 may have two stable states (as opposed to infinite stable states if the X and Y direction dimensions are approximately equal). The first stable state may be oriented in the positive X direction and the second stable state may be oriented in the negative X direction. Otherwise, magnetic devices 1400, 1500, 1600, 1700, 1800, 1900 can be employed and function in substantially the same way as magnetic devices 800, 900, 1000, 1100, 1200, 1300 discussed above.

Figure 38B:
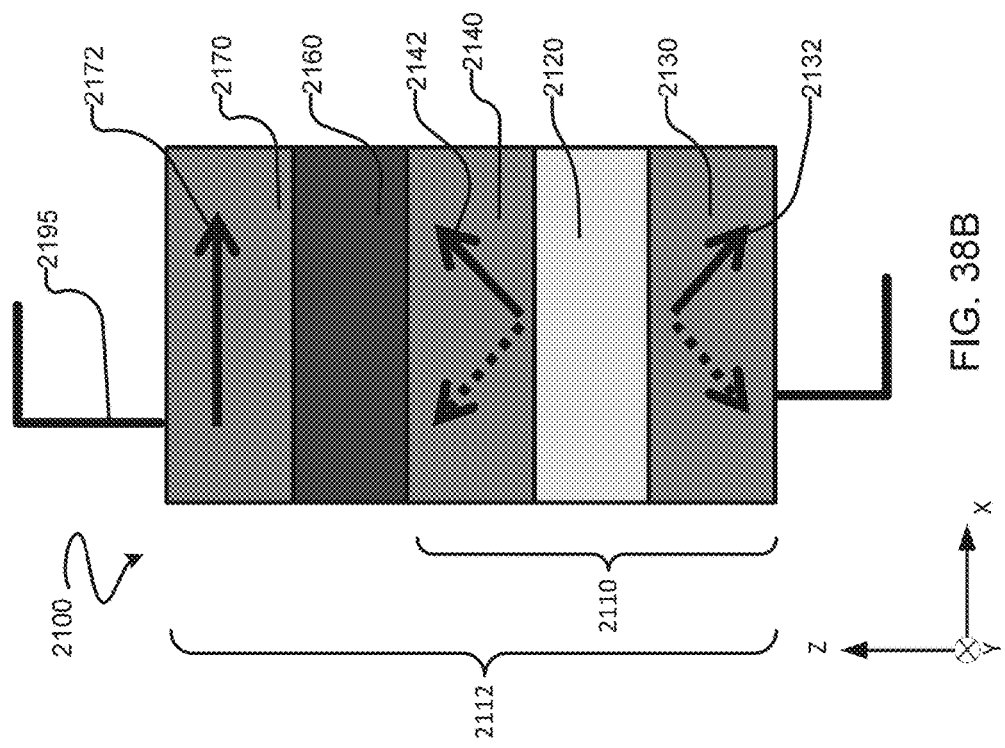
Figure 38A:
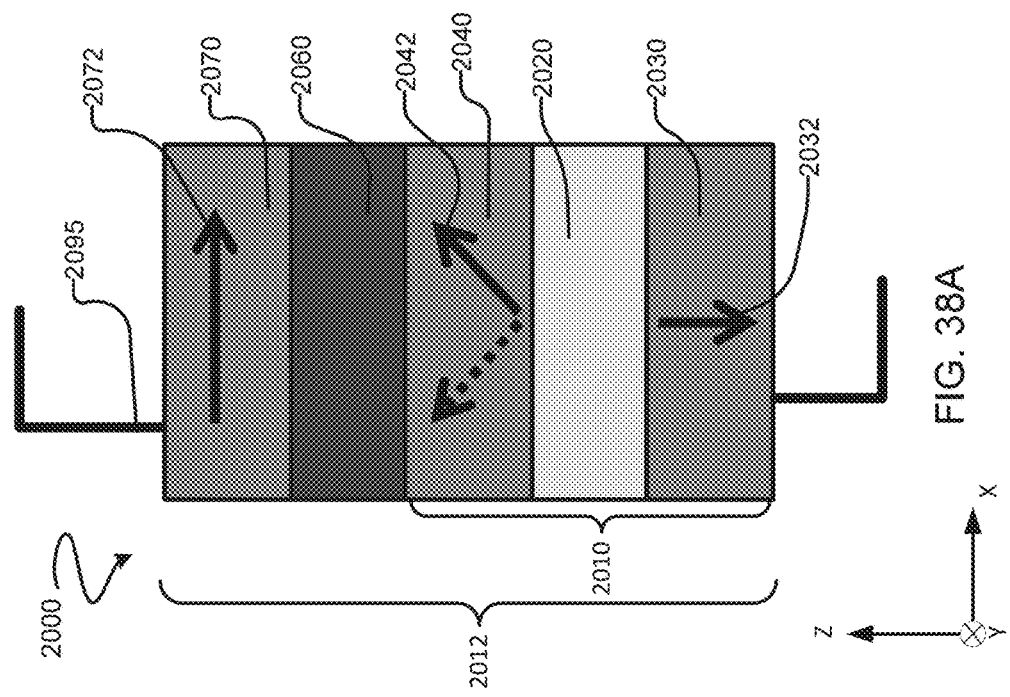

FIG. 38A is a schematic diagram of a magnetic device 2000 according to a particular embodiment. Magnetic device 2000 is substantially similar to magnetic device 400 except in that while the X direction dimension and the Y direction dimension of magnetic device 400 are substantially equal to one another (see FIG. 30A), the X direction dimension of magnetic device 2000 may be elongated as compared to the Y direction dimension of magnetic device 2000. Magnetic device 2000 may be employed in the same way that magnetic device 400 may be employed as described above in addition to as described below and magnetic device 2000 may have the same (or some of the same) advantages that magnetic device 400 has as described above in addition to those described below. Magnetic device 2000 comprises a magnetic structure 2010 similar to magnetic structure 410, first, second and third magnetic layers 2030, 2040, 2070 having first, second and third magnetization directions 2032, 2042, 2072 similar to first, second and third magnetic layers 430, 440, 470, a first coupling layer 2020 similar to coupling layer 420, a magnetoresistive layer 2060 similar to magnetoresistive layer 460, a body 2012 similar to body 412 and a circuit 2095 similar to circuit 495.

Like first, second and third magnetization directions 432, 442, 472, first and third magnetization directions 2032, 2072 are fixed while second magnetization direction 2042 is free. However, while second magnetization direction 442 of magnetic device 400 is allowed to rotate about the Z direction axis while being non-collinearly coupled to first magnetization direction 432, second magnetization direction 2042 is biased not to rotate about the Z direction axis due to the elongation of second magnetic layer 2040 in the X direction (as compared to the Y direction). Instead, second magnetization direction 2042 has two stable states in the XZ-plane: a first state in which second magnetization direction 2042 extends in the positive Z direction and the positive X direction and a second state in which second magnetization direction 2042 extends in the positive Z direction and the negative X direction. Alternatively, second magnetization direction 2042 could have two stable states in the XZ-plane: a first state in which second magnetization direction 2042 extends in the negative Z direction and the positive X direction and a second state in which second magnetization direction 2042 extends in the negative Z direction and the negative X direction.

Second magnetization direction 2042 of second magnetic layer 2040 can be caused to change between its first and second states by spin torque transfer (e.g. applying a current through circuit 2095). By passing the current through third magnetic layer 2070, the electric current is polarized. By passing the polarized current through second magnetic layer 2040, the polarized current may cause the second magnetic layer 2040 to change from its first stable state to its second stable state (or vice versa). The amount of current for changing second magnetic layer 2040 between its two states may depend on the angular difference between first magnetization direction 2032 and second magnetization direction 2042. The current may be reduced by changing the angular difference between the third magnetization direction 2072 and second magnetization direction 2042. Changing the angular difference between third magnetization direction 2072 and second magnetization direction 2042 may be accomplished with non-collinear coupling (e.g. by employing magnetic structure 10 and/or coupling layer 20, as described herein) between first and second magnetic layers 2030, 2040.

FIG. 38B is a schematic diagram of a magnetic device 2100 according to a particular embodiment. Magnetic device 2100 is substantially similar to magnetic device 500 except in that while the X direction dimension and the Y direction dimension of magnetic device 500 are substantially equal to one another (see FIG. 30B), the X direction dimension of magnetic device 2100 may be elongated as compared to the Y direction dimension of magnetic device 2100. Moreover, magnetic device 2100 may be employed in the same way that magnetic device 500 may be employed as described above and magnetic device 2100 may have the same (or some of the same) advantages that magnetic device 500 has as described above in addition to those described below. Magnetic device 2100 comprises a magnetic structure 2110 similar to magnetic structure 510, first, second and third magnetic layers 2130, 2140, 2170 having first, second and third magnetization directions 2132, 2142, 2172 similar to first, second and third magnetic layers 530, 540, 570, a first coupling layer 2120 similar to coupling layer 520, a magnetoresistive layer 2160 similar to magnetoresistive layer 560, a body 2112 similar to body 512 and a circuit 2195 similar to circuit 595. First and second magnetic layers 2130, 2140 may be coupled at an orthogonal, non-collinear angle, although this is not necessary.

Like first, second and third magnetization directions 532, 542, 572, third magnetization direction 2172 is fixed while first and second magnetization directions 2132, 2142 are free. However, while first and second magnetization directions 532, 542 of magnetic device 500 are allowed to rotate about the Z direction axis while being non-collinearly coupled, first and second magnetization directions 2132, 2142 are biased not to rotate about the Z direction axis due to the elongation of second magnetic layer 2140 in the X direction (as compared to the Y direction). Instead, first and second magnetization directions 2132, 2142 each have two stable states in the XZ-plane. First magnetization direction 2132 has a first state in which first magnetization direction extends in the negative Z direction and the positive X direction and a second state in which first magnetization direction extends in the negative Z direction and the negative X direction. Second magnetization direction 2142 has a first state in which second magnetization direction 2142 extends in the positive Z direction and the positive X direction and a second state in which second magnetization direction 2142 extends in the positive Z direction and the negative X direction.

First and second magnetization directions 2132, 2142 can be caused to change between their first and second states by spin torque transfer (e.g. applying a current through circuit 2195). By passing the current through third magnetic layer 2170, the electric current is polarized. By passing the polarized current through second magnetic layer 2140, the polarized current may cause the first and second magnetic layers 2130, 2140 to change between stable states. The amount of current for changing first and second magnetic layers 2130, 2140 between their respective may depend on the angular difference between third magnetization direction 2172 and second magnetization direction 2142. The current may be reduced by changing the angular difference between the third magnetization direction 2172 and second magnetization direction 2142. Changing the angular difference between third magnetization direction 2172 and second magnetization direction 2142 may be accomplished with non-collinear coupling (e.g. by employing magnetic structure 10 and/or coupling layer 21, as described herein) between first and second magnetic layers 2130, 2140.

In some embodiments, the X direction dimension of magnetic device 2100 is approximately equal to the Y direction dimension of magnetic device 2100 and each of first and second magnetization directions 2132, 2142 may rotate (or precess) about a Z direction axis.

FIG. 38C is a schematic diagram of a magnetic device 2200 according to a particular embodiment. Magnetic device 2200 is substantially similar to magnetic device 2100 except as described below. Moreover, magnetic device 2200 may be employed in the same way that magnetic device 2100 may be employed as described above and magnetic device 2200 may have the same (or some of the same) advantages that magnetic device 2100 has as described above in addition to those described below.

Magnetic device 2200 comprises a magnetic structure 2210 similar to magnetic structure 2110, first, second and third magnetic layers 2230, 2240, 2270 having first, second and third magnetization directions 2232, 2242, 2272 similar to first, second and third magnetic layers 2130, 2140, 2170, a first coupling layer 2220 similar to coupling layer 2120, a first magnetoresistive layer 2260 similar to magnetoresistive layer 2160, and a circuit 2295 similar to circuit 2195. Magnetic device 2200 also comprises a second magnetoresistive layer 2265 spaced between first magnetic layer 2230 and a fourth magnetic layer 2280 having a fourth magnetization direction 2282. Together, first, second, third and fourth magnetic layers 2230, 2240, 2270, 2280, first and second magnetoresistive layers 2260, 2265 and coupling layer 2220 may be referred to as body 2212. Like magnetic device 2100, both of first and second magnetization directions 2232, 2242 are free and third magnetization direction 2272 is fixed. First and second magnetic layers 2232, 2242 may in practice, in combination with coupling layer 2220, act or be treated as one free magnetic layer. Fourth magnetization direction 2282 may also be fixed. The addition of second magnetoresistive layer 2265 and fourth magnetic layer 2280 may serve to increase the resistive change across body 2212 of magnetic device 2200 when first and second magnetic layers 2230, 2240 change states, reduce switching time and/or reduce current for switching relative to device 2100.

FIG. 38D is a schematic diagram of a magnetic device 2300 according to a particular embodiment. Magnetic device 2300 may be substantially similar to magnetic device 2200 except as described below. Moreover, magnetic device 2300 may be employed in the same way that magnetic device 2200 may be employed as described above and magnetic device 2300 may have the same (or some of the same) advantages that magnetic device 2200 has as described above in addition to those described below.

Magnetic device 2300 comprises a magnetic structure 2310 similar to magnetic structure 2210, first, second, third and fourth magnetic layers 2330, 2340, 2370, 2380 having first, second, third and fourth magnetization directions 2332, 2342, 2372, 2282 similar to first, second, third and fourth magnetic layers 2230, 2240, 2270, 2280 a first coupling layer 2320 similar to coupling layer 2220, first and second magnetoresistive layers 2360, 2365 similar to magnetoresistive layers 2260, 2265 and a circuit 2395 similar to circuit 2295. Together, first, second, third and fourth magnetic layers 2330, 2340, 2370, 2380, first and second magnetoresistive layers 2360, 2365 and coupling layer 2320 may be referred to as body 2312. Like magnetic device 2200, both of first and second magnetization directions 2332, 2342 are free and third and fourth magnetization directions 2372, 2382 are fixed.

Magnetic device 2300 differs from magnetic device 2200 in that first magnetization direction 2332 is in-plane (e.g. first magnetization direction 2332 has no Z direction component) while first magnetization direction 2232 is out-of-plane (e.g. first magnetization direction 2232 has a Z direction component).

In some embodiments, the X direction dimension of magnetic device 2300 is approximately equal to the Y direction dimension of magnetic device 2300 and each of first and second magnetization directions 2332, 2342 may rotate about a Z direction axis. In other embodiments, the X direction dimension of magnetic device 2300 is elongated with respect to the Y direction dimension of magnetic device 2300 and each of first and second magnetization directions 2332, 2342 may flip from a first state where their respective X direction components are oriented in the positive X direction and a second state where their respective X direction components are oriented in a negative X direction.

Since first magnetization direction 2332 is in-plane, the changes in resistance across second magnetoresistive layer 2365 are increased as compared to changes in resistance across magnetoresistive layer 2265. However, more torque may be required to change states of first magnetization direction 2332 which may in turn lead to increased switching time. Accordingly, it follows that for embodiments where it is beneficial to have greater changes in resistance across body 2312, it is desirable for first and/or second magnetization directions 2332, 2342 to be in-plane whereas for where it is beneficial to have faster switching times and/or reduced switching current/torque, it is desirable for first and/or second magnetization directions 2332, 2342 to be out-of-plane (e.g. to have Z direction components). By having one of first and/or second magnetization directions 2332, 2342 be in-plane and one of first and/or second magnetization directions 2332, 2342 have a Z direction component, it may be possible to balance between a desire for reduced switching current/torque (and/or faster switching times) and increased changes in resistance between states.

FIG. 39A is a schematic diagram of a magnetic device 2400 according to a particular embodiment. Magnetic device 2400 may be substantially similar to magnetic device 2000 except as described below. Moreover, magnetic device 2400 may be employed in the same way that magnetic device 2000 may be employed as described above and magnetic device 2400 may have the same (or some of the same) advantages that magnetic device 2000 has as described above in addition to those described below. Magnetic device 2400 comprises a magnetic structure 2410 similar to magnetic structure 2010, first, second and third magnetic layers 2430, 2440, 2470 having first, second and third magnetization directions 2432, 2442, 2472 similar to first, second and third magnetic layers 2030, 2040, 2070, a first coupling layer 2420 similar to coupling layer 2020, a magnetoresistive layer 2460 similar to magnetoresistive layer 2060, a body 2412 similar to body 2012 and a circuit 2495 similar to circuit 2095.

Like first, second and third magnetization directions 2032, 2042, 2072, first and third magnetization directions 2432, 2472 are fixed while second magnetization direction 2442 is free. However, while second magnetization direction 2042 of magnetic device 2000 has first and second states that differ between their positive and negative X direction orientations (while their Z direction orientations remain constant), second magnetization direction 2442 has first and second states that remain constant in their X direction orientation but change in their Z direction orientation. In other words, second magnetization direction 2042 may rotate or switch about a Z direction axis to change states, whereas second magnetization direction 2442 may rotate or switch about an X direction axis to change states.

Third magnetization direction 2472 is depicted as being oriented in the positive Z direction. This is not mandatory. Third magnetization direction 2472 could be oriented in the negative Z direction. Moreover, third magnetization direction 2472 could have an X direction component (and/or a Y direction component). By orienting third magnetization direction 2472 without a substantial X direction component, the changes in resistance across body 2412 are greater as second magnetization direction 2442 changes states as compared to if third magnetization direction 2472 were to have a substantial X direction component.

Second magnetization direction 2442 of second magnetic layer 2440 can be caused to change between its first and second states by spin torque transfer (e.g. applying a current through circuit 2495). By passing the current through third magnetic layer 2470, the electric current is polarized. By passing the polarized current through second magnetic layer 2440, the polarized current may cause the second magnetic layer 2440 to change from its first stable state to its second stable state (or vice versa).

The amount of current for changing states of second magnetic layer 2440 may depend on the angular difference between third magnetization direction 2472 and second magnetization direction 2442. The current may be reduced by changing the angular difference between the third magnetization direction 2472 and second magnetization direction 2442. Changing the angular difference between third magnetization direction 2472 and second magnetization direction 2442 may be accomplished with non-collinear coupling (e.g. by employing magnetic structure 10 and/or coupling layer 24, as described herein) between first and second magnetic layers 2430, 2440.

FIG. 39B is a schematic diagram of a magnetic device 2500 according to a particular embodiment. Magnetic device 2500 may be substantially similar to magnetic device 2400 except as described below. Moreover, magnetic device 2500 may be employed in the same way that magnetic device 2400 may be employed as described above and magnetic device 2500 may have the same (or some of the same) advantages that magnetic device 2400 has as described above in addition to those described below. Magnetic device 2500 comprises a magnetic structure 2510 similar to magnetic structure 2410, first, second and third magnetic layers 2530, 2540, 2570 having first, second and third magnetization directions 2532, 2542, 2572 similar to first, second and third magnetic layers 2430, 2440, 2470, a first coupling layer 2520 similar to coupling layer 2420, a magnetoresistive layer 2560 similar to magnetoresistive layer 2460, a body 2512 similar to body 2412 and a circuit 2595 similar to circuit 2495.

First magnetization direction 2532 is free, second magnetization direction 2542 is free and third magnetization direction 2572 is fixed. First and second magnetic layers 2530, 2540 may be coupled at an orthogonal, non-collinear angle, although this is not necessary. First magnetization direction 2532 has first and second states. In the first and second states, the X direction orientation of first magnetization remains constant but the Z direction orientation changes. In other words, first magnetization direction 2532 may switch or rotate about an X direction axis to change states. Accordingly, as second magnetization direction 2542 switches between stable states, the non-collinear angular difference between first and second magnetization directions 2532, 2542 is not maintained. Instead, second magnetization direction 2542 may temporarily break free of the non-collinear coupling as it changes between stable states. For this reason, second magnetization direction 2542 may be less likely to change states undesirably. The stable states of second magnetization direction 2542 may be more stable (than the stable states of second magnetization direction 2442 of device 2400), since second magnetization direction 2542 must break free of the non-collinear coupling to change between states.

Third magnetization direction 2572 is depicted as being oriented in the positive Z direction. This is not mandatory. Third magnetization direction 2572 could be oriented in the negative Z direction. Moreover, third magnetization direction 2572 could have an X direction component (and/or a Y direction component). By orienting third magnetization direction 2572 without a substantial X direction component, the changes in resistance across body 2512 are greater as second magnetization direction 2542 changes states, as compared to if third magnetization direction 2572 were to have a substantial X direction component.

First and second magnetization directions 2532, 2542 can be caused to change between their first and second states by spin torque transfer (e.g. applying a current through circuit 2595). By passing the current through third magnetic layer 2570, the electric current is polarized. By passing the polarized current through second magnetic layer 2540, the polarized current may cause the first and second magnetic layers 2530, 2540 to change between stable states. The amount of current for first and second magnetic layers 2530, 2540 to change states may depend on the angular difference between third magnetization direction 2572 and second magnetization direction 2542. The current may be reduced by changing the angular difference between the third magnetization direction 2572 and second magnetization direction 2542. Changing the angular difference between third magnetization direction 2572 and second magnetization direction 2542 may be accomplished with non-collinear coupling (e.g. by employing magnetic structure 10 and/or coupling layer 25, as described herein) between first and second magnetic layers 2530, 2540.

Figure 39C:
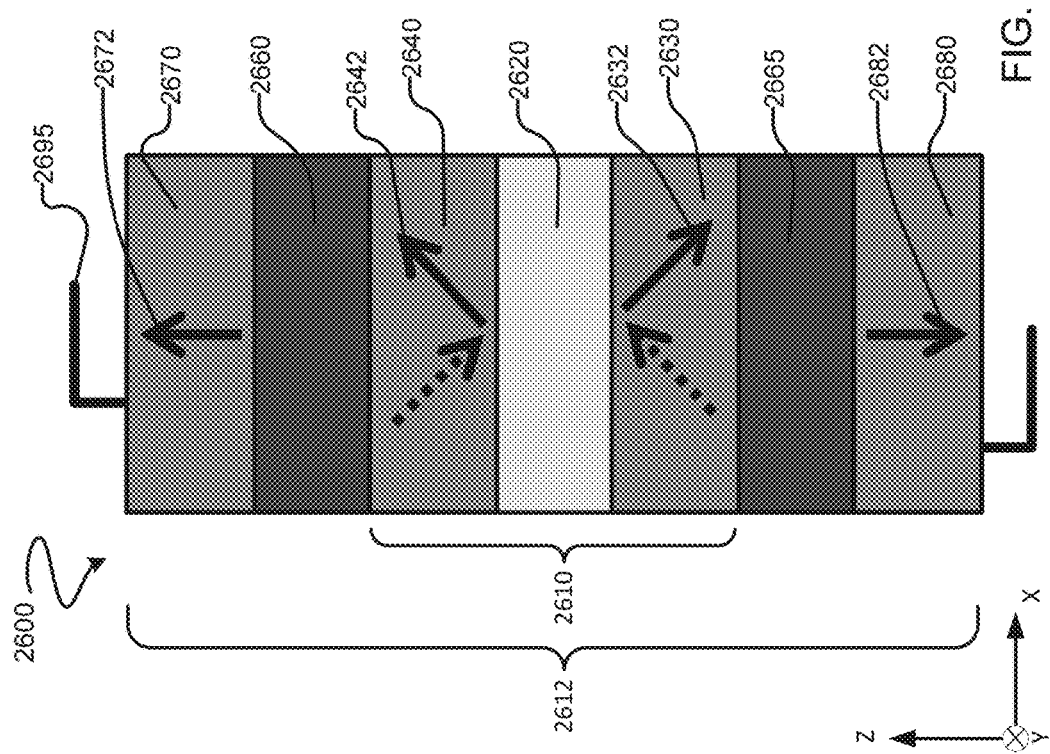

FIG. 39C is a schematic diagram of a magnetic device 2600 according to a particular embodiment. Magnetic device 2600 may be substantially similar to magnetic device 2500 except as described below. Moreover, magnetic device 2600 may be employed in the same way that magnetic device 2500 may be employed as described above and magnetic device 2600 may have the same (or some of the same) advantages that magnetic device 2500 has as described above in addition to those described below.

Magnetic device 2600 comprises a magnetic structure 2610 similar to magnetic structure 2510, first, second and third magnetic layers 2630, 2640, 2670 having first, second and third magnetization directions 2632, 2642, 2672 similar to first, second and third magnetic layers 2530, 2540, 2570, a first coupling layer 2620 similar to coupling layer 2520, a first magnetoresistive layer 2660 similar to magnetoresistive layer 2560, and a circuit 2695 similar to circuit 2595. Magnetic device 2600 also comprises a second magnetoresistive layer 2665 spaced between first magnetic layer 2630 and a fourth magnetic layer 2680 having a fourth magnetization direction 2682. Together, first, second, third and fourth magnetic layers 2630, 2640, 2670, 2680, first and second magnetoresistive layers 2660, 2665 and coupling layer 2620 may be referred to as body 2612. Like magnetic device 2500, both of first and second magnetization directions 2632, 2642 are free and third magnetization direction 2672 is fixed. First and third magnetic layers 2632, 2642 may in practice, in combination with coupling layer 2620, act or be treated as one free magnetic layer. Fourth magnetization direction 2682 may also be fixed. The addition of second magnetoresistive layer 2665 and fourth magnetic layer 2680 may serve to increase the resistive change across body 2612 of magnetic device 2600 when first and second magnetic layers 2630, 2640 change states, decrease switching time, or current for switching (as compared to similar characteristics of device 2500).

FIG. 40A to 40D are schematic diagrams of various configurations of circuits that may be employed with the magnetic devices described herein (e.g. such as in place of or as part of circuits 195, 295, 395 . . . 2495, 2595, 2695, etc.). The FIG. 40A-40D circuits may be used as driver circuits (e.g. to drive current which may switch the states of one or more magnetization layer (s)) and/or as measurement circuits (e.g. to evaluate the resistance of a magnetic device). In some embodiments, driver circuits (e.g. circuits used to drive current which may switch states of one or more magnetization layer(s)) can be embodied separately from the measurement circuits and/or can be implemented in parallel with the measurement circuits. The use of the FIG. 40A-40D circuits as measurement circuits is described below, it being appreciates that driver circuits can be similarly implemented using suitable driver circuits for current sources and without the need for corresponding voltmeters.

Figure 40A:
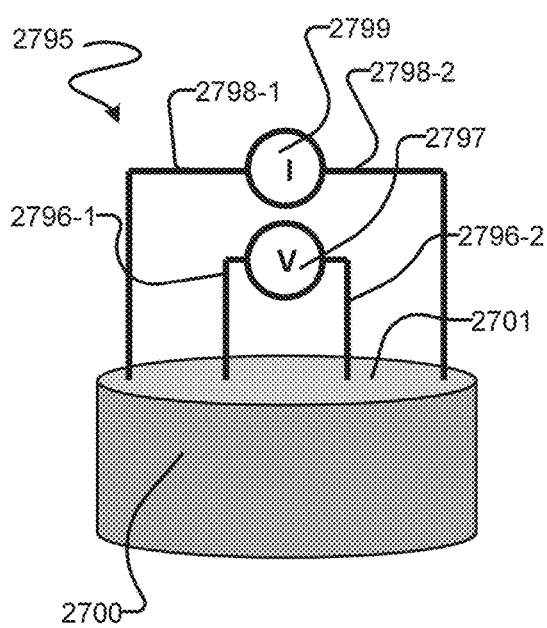
FIGS. 40A, 40B, 40C and 40D depict schematic diagrams of circuits for magnetic devices according to particular embodiments of the invention.

FIG. 40A depicts a circuit 2795 having first and second leads 2796-1, 2796-2 connected between magnetic device 2700 and voltmeter (or suitable voltage measurement circuit) 2797. Circuit 2795 also comprises third and fourth leads 2798-1, 2798-2 connected between magnetic device 2700 and current source (or suitable current source circuit) 2799.

Magnetic device 2700 may be any magnetic device described herein. Voltmeter 2797 may comprise any suitable voltage measuring device or circuit. Current source 2799 may be any suitable current source. As can be seen from FIG. 40A, first, second, third and fourth leads 2796-1, 2796-2, 2798-1, 2798-2 are connected to a first surface 2701 of magnetic device 2700. First surface 2701 may correspond to a magnetic layer, such as, for example, magnetic layer 170, 270, 670, 990, 1990, etc. that is located at a first end of a magnetic device as described herein. In the alternative, first surface 2701 may correspond to a magnetic layer, such as, for example, magnetic layer 130, 230, 630, 930, 1930, 2380, etc. that is located at a second end of a magnetic device as described herein. In the alternative, first surface 2701 may correspond to a portion of magnetic device 2700 that is not at the first or second end of a magnetic device such as, for example, magnetic layers 140, 240, 730, 740, 1540, 1570, 1980, etc., coupling layers 120, 220, 720, 1520, 1920, etc., and/or magnetoresistive layers 160, 260, 760, 1560, 1960, etc.

Although first, second, third and fourth leads 2796-1, 2796-2, 2798-1, 2798-2 are depicted as contacting surface 2701 in a particular pattern, this is merely shown for convenience and is not necessary. First, second, third and fourth leads 2796-1, 2796-2, 2798-1, 2798-2 may be arranged in any suitable spatial pattern or configuration on surface 2701.

Figure 40B:
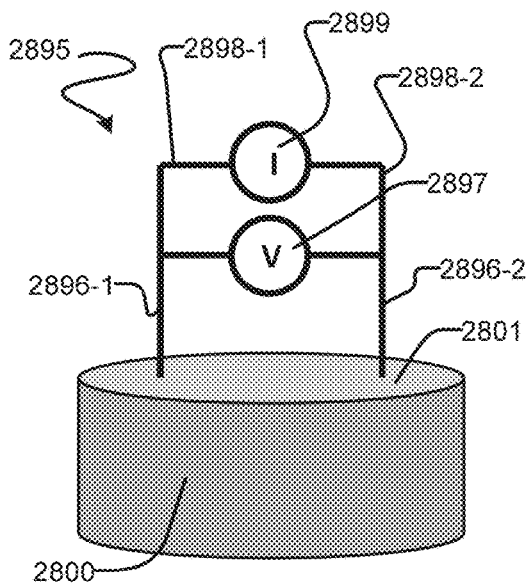

FIG. 40B depicts a circuit 2895 substantially similar to circuit 2795 except as described below. Circuit 2895 comprises first and leads 2896-1, 2896-2 connected between a first surface 2801 of magnetic device 2800 and voltmeter (or suitable voltage measurement circuit) 2897. Circuit 2895 also comprises third and fourth leads 2898-1, 2898-2 connected between the first surface 2801 of magnetic device 2800 and current source 2899. Circuit 2895 differs from circuit 2795 in that third and fourth leads 2898-1, 2898-2 are connected to surface 2701 via first and second leads 2896-1, 2896-2 instead of being connected directly to surface 2801. Circuit 2895 may simplify manufacturing as compared to circuit 2795 and may be beneficial in embodiments where surface 2801 is limited in size.

Figure 40C:
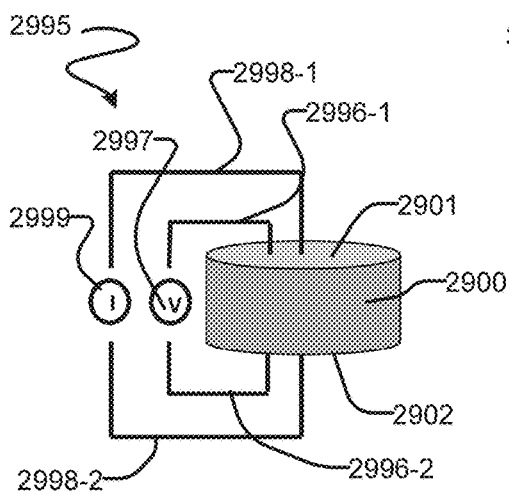

FIG. 40C depicts a circuit 2995 substantially similar to circuit 2795 except as described below. Circuit 2995 comprises a first lead 2996-1 connected between a first surface 2901 of magnetic device 2900 and voltmeter (or suitable voltage measurement circuit) 2997, a second lead 2996-2 connected between a second surface 2902 of magnetic device 2900 and voltmeter (or suitable voltage measurement circuit) 2997, a third lead 2998-1 connected between the first surface 2901 of magnetic device 2900 and a current source 2999 and a fourth lead 2998-2 connected between the second surface 2902 of magnetic device 2900 and current source 2999. First surface 2901 may correspond to a magnetic layer, such as, for example, magnetic layer 170, 270, 670, 990, 1990, etc. that is located at a first end of a magnetic device as described herein. In the alternative, first surface 2901 may correspond to a magnetic layer, such as, for example, magnetic layer 130, 230, 630, 930, 1930, 2380, etc. that is located at a second end of a magnetic device as described herein. In the alternative, first surface 2901 may correspond to a portion of magnetic device 2700 that is not at the first or second end of a magnetic device such as, for example, magnetic layers 140, 240, 730, 740, 1540, 1570, 1980,*etc.*, coupling layers 120, 220, 720, 1520, 1920, etc., and/or magnetoresistive layers 160, 260, 760, 1560, 1960, etc.

Similarly, second surface 2902 could comprise a magnetic layer at the first end of a magnetic device as described herein, comprise a magnetic layer at the second end of a magnetic device as described herein or to a layer that is not at the first or second end of the magnetic device.

Figure 40D:
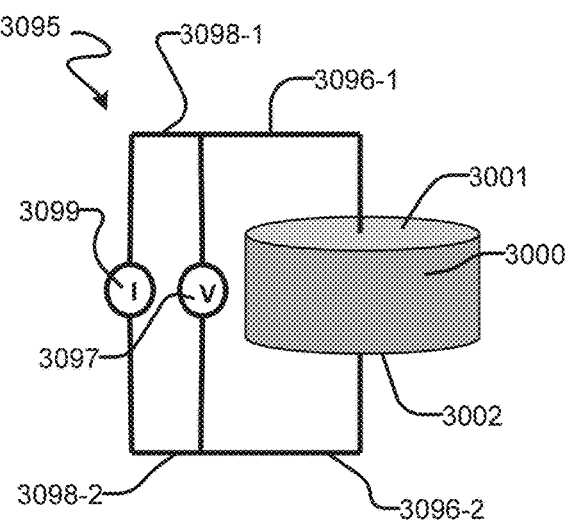

FIG. 40D depicts a circuit 3095 substantially similar to circuit 2995 except as described below. Circuit 3095 comprises first and second leads 3096-1, 3096-2 connected between first and second surfaces 3001, 3002 of magnetic device 3000 respectively and voltmeter (or suitable voltage measurement circuit) 3097 and third and fourth leads 3098-1, 3098-2 connected between first and second surfaces 3001, 3002 of magnetic device 3000 respectively and current source 3099. Circuit 3095 differs from circuit 2995 in that third and fourth leads 3098-1, 3098-2 are connected to surfaces 3001, 3002 via first and second leads 3096-1, 3096-2 instead of being connected directly to surfaces 3001, 3002.

Various types of current can be driven from current sources 2799, 2899, 2999, 3099 through magnetic devices 2700, 2800, 2900, 3000 or any other magnetic device described herein. For example, the current may comprise DC current, a wave function having, rectangular, triangular, sinusoidal and/or sawtooth like functions and/or the like. The current may be positive, negative, bipolar, or alternating. The current may be positively or negatively biased (by suitable DC bias) to a non-zero value. For example, the current may be biased to always remain positive, but to maintain a wave function shape having, for example, a rectangular, triangular, sinusoidal and/or sawtooth like function.

FIGS. 41A to 41G are schematic depictions of a magnetic device 3100 according to a particular embodiment. Magnetic device 3100 comprises interior magnetic layer 3170 having an interior magnetization direction 3172. An upper magnetic layer 3180 having an upper magnetization direction 3182 is spaced apart from interior magnetic layer 3170 by an upper magnetoresistive layer 3165 and a lower magnetic layer 3140 having a lower magnetization direction 3142 is spaced apart from interior magnetic layer 3170 by a lower magnetoresistive layer 3160. The terms upper and lower are used merely for convenience and should not be interpreted as limiting magnetic device 3100 to a particular orientation. Magnetic layers 3140, 3170, 3180 may be substantially similar to other magnetic layers described herein. Magnetoresistive layers 3160, 3165 may be substantially similar to other magnetoresistive layers described herein.

Lower magnetization direction 3142 of lower magnetic layer 3140 may be fixed in any suitable way that achieves a non-collinear angle between lower magnetization direction 3142 and interior magnetization direction 3172. Upper magnetization direction 3182 of upper magnetic layer 3180 may be fixed in any suitable way that achieves a non-collinear angle between upper magnetization direction 3182 and interior magnetization direction 3172. For example, lower magnetic layer 3140 and upper magnetic layer 3180 may each be non-collinearly coupled to additional magnetic layers. Such an embodiment is depicted in, for example, FIGS. 32B, 33B, 34B and 35B. For example, as compared to the FIG. 32B embodiment, upper magnetic layer 3180 may correspond to fourth magnetic layer 980, upper magnetoresistive layer 3165 may correspond to second magnetoresistive layer 965, interior magnetic layer 3170 may correspond to third magnetic layer 970, lower magnetoresistive layer 3160 may correspond to first magnetoresistive layer 960 and lower magnetic layer 3140 may correspond to second magnetoresistive layer 940. However, it should be understood that other suitable techniques could be employed to fix upper and lower magnetization directions 3142, 3182.

As current 3196 passes through magnetic device 3100 in the positive Z direction as depicted in FIG. 41A, torque of the polarized current that has passed through lower magnetic layer 3140 may constructively interfere with torque of the current that has reflected from upper magnetic layer 3180 to increase net the torque on interior magnetization direction 3172, thereby decreasing switching time (for a given applied switching current) and/or allowing switching of interior magnetization direction 3172 with relatively less applied current or applied field. Such constructive interference may be achieved if lower magnetization direction 3142 has an X direction and/or Y direction component that is opposite to an X direction and/or Y direction component of upper magnetization direction 3182. Conversely, if lower magnetization direction 3142 has no X direction and/or Y direction component that is opposite to an X direction and/or Y direction component of upper magnetization direction 3182, then the polarized current that has passed through lower magnetic layer 3140 may destructively interfere with current that has reflected from upper magnetic layer 3180, thereby increasing switching time (for a given applied switching current) and/or requiring relatively greater current or applied field to allow switching of interior magnetization direction 3172.

FIGS. 41B to 41G are provided to illustrate a simplified theory of how torque of the polarized current that has passed through lower magnetic layer 3140 may constructively interfere with torque of the current that has reflected from upper magnetic layer 3180 to increase the net torque on interior magnetization direction 3172. FIGS. 41B to 41G are meant to be illustrative rather than restrictive and the inventors do not wish to be bound by the simplified theory depicted and described in relation to magnetic device 3100. It should also be understood that this same constructive interference mechanism (or the opposite destructive interference mechanism) may be achieved in other magnetic devices described herein such as, for example, magnetic devices 900, 1100, 1300, 1500, 1700, 1900, etc.

Referring to FIG. 41B, as current 3196 passes through lower magnetic layer 3140, current 3196 is polarized in the direction of lower magnetization direction 3142 as polarized current 3144. Polarized current 3144 can be described as having an X direction component 3144A and Z direction component 3144B.

As shown in FIG. 41C, the Z direction component 3144B of polarized current 3144 passes through interior magnetic layer 3170 as polarized current 3174 (since interior magnetization direction 3142 is oriented in the Z direction) while the X direction component 3144A of polarized current applies a torque 3144A' on interior magnetization direction 3172. A reflected current 3176 is reflected in the opposite direction of travel of current 3196 (e.g. in the negative Z direction) from interior magnetic layer 3170 with a polarization direction opposite to interior magnetization direction 3172.

As shown in FIG. 41D, polarized current 3174 has a first component 3174A parallel to upper magnetization direction 3182 and a second component 3174B orthogonal to upper magnetization direction 3182. Reflected current 3176 has a first component 3176A parallel to lower magnetization direction 3142 and a second component 3176B orthogonal to lower magnetization direction 3142.

As shown in FIGS. 41E and 41F, second component 3174B of polarized current 3174 applies a torque 3174B' on upper magnetization direction 3182 and second component 3176B of reflected current 3176 applies a torque 3176B' on lower magnetization direction 3142.

As shown in FIG. 41F, polarized current 3174 also reflects from upper magnetic layer 3180 as reflected current 3184. Reflected current 3184 has an X direction component 3184A and Z direction component 3184B, as shown in FIG. 41G. The X direction component 3184A of reflected current 3184 applies a torque 3184A' on interior magnetization direction 3172. Due to the opposite X direction components of upper and lower magnetization directions 3142, 3182, torque 3144A' and torque 3184A' are oriented in the same direction (e.g. the negative X direction in the illustrated embodiment) such that they exhibit constructive interference and the net torque on interior magnetization direction 3172 is increased. If, on the other hand, upper and lower magnetization directions 3142, 3182 did not have opposite X direction components (and did not have an opposite Y direction components), torque 3144A' and torque 3184A' would be in opposite directions such that they would exhibit destructive interference and the net torque on interior magnetization direction 3172 would be decreased.

Although, upper and lower magnetization directions 3142, 3182 are depicted as having Z direction components in the same direction (e.g. positive Z direction), this is not mandatory to achieve constructive or destructive interference as desired. In some embodiments, upper and lower magnetization directions 3142, 3182 may have Z direction components in opposite directions while still achieving constructive or destructive interference as desired. In the case of destructive inteference, the resistance change across magnetic device 3100 between a first state of interior magnetization direction 3172 and a second state of interior magnetization direction 3172 may be decreased.

Although upper and lower magnetization directions 3142, 3182 and interior magnetization direction 3172 are all depicted as having Z direction components, this is not mandatory. Instead, each of upper and lower magnetization directions 3142, 3182 and interior magnetization direction 3172 could extend in XY planes. For example, upper magnetization direction 3182 could have positive X direction and positive Y direction components while lower magnetization 3142 direction has a positive X direction component and a negative Y direction component and interior magnetization direction 3172 has first and second stable states in the positive and negative Y directions. It should be understood that still other combinations of magnetization directions are possible to achieve constructive interference as desired.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are consistent with the broadest interpretation of the specification as a whole.

Unless the context clearly requires otherwise, throughout the description and any accompanying claims (where present), the words "comprise," "comprising," and the like are to be construed in an inclusive sense, that is, in the sense of "including, but not limited to." As used herein, the terms "connected," "coupled," or any variant thereof, means any connection or coupling, either direct or indirect, between two or more elements; the coupling or connection between the elements can be physical, logical, or a combination thereof. Additionally, the words "herein," "above," "below," and words of similar import, shall refer to this document as a whole and not to any particular portions. Where the context permits, words using the singular or plural number may also include the plural or singular number respectively. The word "or," in reference to a list of two or more items, covers all of the following interpretations of the word: any of the items in the list, all of the items in the list, and any combination of the items in the list.

As will be apparent to those skilled in the art in the light of the foregoing disclosure, many alterations and modifications are possible in the practice of this invention without departing from the spirit or scope thereof. For example:

Where magnetic layers (and/or magnetization directions) are discussed herein as being fixed other than by a coupling layer explicitly recited herein, it should be understood that any suitable apparatus or method may be employed to fix the magnetization direction and that devices according to various embodiments may incorporate such magnetization direction fixing apparatus or methods to provide the desired fixing. For example, the material of the magnetic layer may be chosen such that the magnetization direction is fixed. Alternatively, additional magnetic layers may be ferromagnetically coupled or coupled by a coupling layer (e.g. ferromagnetically, antiferromagnetically or non-collinearly coupled) to the magnetic layer to thereby fix the magnetization direction.

Where a magnetoresistive layer is discussed herein (e.g. magnetoresistive layer 160, 260, 460, 460 etc.) as being employed in a sensor (or where it is employed in a sensor), it should be understood that such magnetoresistive layer is not mandatory and could be removed entirely without rendering the magnetic device unsuitable for its purpose.

Although some of the drawings herein depict magnetization directions oriented at approximately 45° with respect to an X direction axis, a Y direction axis and/or a Z direction axis, it should be understood that other angles (not including 0, 90, 180, 360) are also suitable and that 45° is depicted for convenience.

Although at least some of the Figures are two-dimensional and do not show the Y direction dimension, it should be understood that the magnetic devices depicted do include a Y direction dimension and the magnetization directions depicted could, but do not necessarily, have Y direction components unless explicitly stated otherwise.

While some magnetization directions (or components thereof) are described or shown herein as being in a positive direction, it should be understood that (with corresponding changes to other magnetization directions in the structure or device as needed) such magnetization directions could be negative, and vice versa.

While magnetization directions are described herein as, for example, being oriented in the X direction or in the Z direction, it should be understood that there may be some variation between the exact orientation of the magnetization direction and the stated orientation without departing from the scope of the invention. For example, in some embodiments, the angles described herein may be within 2° of the stated orientation, 5° of the stated orientation, 10° of the stated orientation, 15° of the stated orientation, or even 20° of the stated orientation.

While in some embodiments, magnetization directions are discussed as being changed from a first state to a second state (or to cause a magnetization direction to rotate about an axis) by spin torque effects or applied current, it should be understood that an applied magnetic field or a combination of these may also be employed to change a magnetization direction from a first state to a second state (or to cause a magnetization direction to rotate about an axis).

While magnetic structures depicted herein may be depicted as having a constant XY-plane cross-sectional shape and size, this is not mandatory. Each layer of any of the magnetic structures described herein may have any XY-plane cross-sectional size or shape. Further, individual layers are not required to have a constant XY-plane cross-sectional size or shape along the Z direction. For example, for device 800, layers 820, 830, 840 may be 10, 20, 100 or more times larger in XY-plane area than layers 860, 870 which may be on a micrometer or nanometer scale.

While some embodiments depicted and/or discussed herein are discussed as being employed as a sensor and/or a memory device, it should be understood that such structures may be employed in other devices such as, for example, oscillators, energy harvesting devices and diodes.

While some embodiments depict structures or devices which include a free magnetic layer that has only one adjacent layer (such as magnetic layers 870, 1070, 1270, 1470, 1670, and 1870), an additional magnetoresistive layer may be interposed between an additional magnetic layer and the free magnetic layer (such as magnetic layers 870, 1070, 1270, 1470, 1670, and 1870) to further amplify torque and/or resistance effects of the device. The magnetization direction of the additional magnetic layer may extend in the XY plane or in the Z direction.

What is claimed:
1. A magnetic device comprising:
    a first magnetic layer having a first magnetization direction;
    a second magnetic layer having a second magnetization direction, the second magnetic layer spaced apart from the first magnetic layer in the Z direction;
    a first coupling layer interposed between the first and second magnetic layers, the first magnetic layer non-collinearly coupled to the second magnetic layer by the first coupling layer such that, in the absence of external magnetic field, the first magnetization direction is oriented at a first non-collinear angle relative to the second magnetization direction;
    a third magnetic layer having a third magnetization direction;
    a first magnetoresistive layer interposed between the third magnetic layer and the second magnetic layer; and
    wherein an X direction is orthogonal to the Z direction and a Y direction is orthogonal to the X direction and to the Z direction.

2. A magnetic device according to claim 1 comprising a circuit connected to one or more of the layers of the magnetic device by at least a pair of leads, the circuit configured to determine a change in resistance between the pair of leads, the change in resistance based at least in part on a change in an angular relationship between the third magnetization direction and the second magnetization direction caused by application of an external magnetic field in a region where at least a portion of the device is located or by a current passing through at least a portion of the device.

3. A magnetic device according to claim 1 wherein the first coupling layer comprises:
    at least one first non-magnetic element selected from the group consisting of: Ag, Cr, Ru, Mo, Ir, Rh, Cu, V, Nb, W, Ta, Ti, Re, Os, Au, Al and Si; and
    at least one first magnetic element selected from the group consisting of: Ni, Co, and Fe;
    wherein an atomic ratio of the at least one first non-magnetic element to the at least one first magnetic element is (100−x):x; and
    wherein x is an atomic concentration parameter which causes, or is selected to cause, the first magnetic layer to be non-collinearly coupled to the second magnetic layer.

4. A magnetic device according to claim 2 wherein the at least a pair of leads are connected across the first, second and third magnetic layers, the first coupling layer and the first magnetoresistive layer.

5. A magnetic structure according to claim 1 wherein the first non-collinear angle is between approximately 5° and 175° in absence of external magnetic field.

6. A magnetic structure according to claim 1 wherein the first non-collinear angle is a non-orthogonal, non-collinear angle between approximately 5° and 85° or 95° and 175° in absence of external magnetic field.

7. A magnetic device according to claim 1 wherein the first magnetization direction is fixed, the second magnetization direction is free and the third magnetization direction is fixed.

8. A magnetic device according to claim 1 wherein the first magnetization direction is fixed, the second magnetization direction is fixed and the third magnetization direction is free.

9. A magnetic device according to claim 1 wherein the first magnetization direction is free, the second magnetization direction is free and the third magnetization direction is fixed.

10. A magnetic device according to claim 1 comprising a second coupling layer interposed between the first magnetic layer and a fourth magnetic layer, the fourth magnetic layer having a fourth magnetization direction.

11. A magnetic device according to claim 10 wherein the first magnetic layer is non-collinearly coupled to the fourth magnetic layer such that, in the absence of external magnetic field, the first magnetization direction is oriented at a second non-collinear angle relative to the fourth magnetization direction.

12. A magnetic device according to claim 10 wherein the fourth magnetization direction is fixed.

13. A magnetic device according to claim 1 comprising a second magnetoresistive layer interposed between the first magnetic layer and a fourth magnetic layer, the fourth magnetic layer having a fourth magnetization direction.

14. A magnetic device according to claim 13 wherein the fourth magnetization direction is fixed.

15. A magnetic device according to claim 1 comprising:
a second magnetoresistive layer interposed between a fourth magnetic layer and the third magnetic layer, the fourth magnetic layer having a fourth magnetization direction; and
a second coupling layer interposed between the fourth magnetic layer and a fifth magnetic layer, the fifth magnetic layer having a fifth magnetization direction;
wherein the fourth and fifth magnetization directions are fixed to one another and wherein the fifth magnetic layer is non-collinearly coupled to the fourth magnetic layer such that, in the absence of external magnetic field, the fifth magnetization direction is oriented at a second non-collinear angle relative to the fourth magnetization direction.

16. A magnetic device according to claim 15 wherein the second and fourth magnetization directions each have non-zero Z direction components or non-zero Y direction components.

17. A magnetic device according to claim 16 wherein the second magnetization direction has an X direction component oriented in the opposite direction of an X direction component of the fourth magnetization direction.

18. A magnetic device according to claim 16 wherein the second magnetization direction has a Z direction component oriented in the opposite direction of a Z direction component of the fourth magnetization direction.

19. A magnetic device according to claim 16 wherein the third magnetization direction is parallel to the Z direction.

20. A magnetic device according to claim 16 wherein the third magnetization direction extends in a plane defined by the X and Y directions.

21. A magnetic device according to claim 1 wherein at least a portion of the magnetic device has an X direction dimension that is greater than a Y direction dimension of the at least a portion of the magnetic device.

22. A magnetic device according to claim 1 wherein at least a portion of the magnetic device has an X direction dimension that is substantially equal to a Y direction dimension of the at least a portion of the magnetic device.

23. An oscillator device comprising:
a magnetic device according to claim 1;
wherein a driver circuit is connected to one or more of the layers of the magnetic device to apply driver current to the magnetic device.

24. An oscillator according to claim 23 wherein the driver circuit is connected to one or more of the layers of the magnetic device to apply driver current to the magnetic device current to create, in the circuit, a signal based at least in part on the angular relationship between the third magnetization direction and the second magnetization direction.

25. An oscillator according to claim 23 wherein the driver circuit is connected to one or more of the layers of the magnetic device to apply driver current to the magnetic device current to create a microwave signal based at least in part on a change of the second magnetization direction.

* * * * *